US006530057B1

(12) United States Patent
Kimmitt

(10) Patent No.: US 6,530,057 B1
(45) Date of Patent: Mar. 4, 2003

(54) HIGH SPEED GENERATION AND CHECKING OF CYCLIC REDUNDANCY CHECK VALUES

(75) Inventor: Myles Kimmitt, Shrewsbury, MA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/321,185

(22) Filed: May 27, 1999

(51) Int. Cl.[7] .............................................. H03M 13/00

(52) U.S. Cl. ....................... 714/758; 708/492; 714/807; 714/757

(58) Field of Search ................................ 714/752, 757, 714/758, 755, 781, 784, 785, 776, 775, 48, 774, 751, 807, 822; 708/492, 525, 300; 711/112, 114; 370/466, 474, 514, 528, 242; 375/368; 455/406; 340/5.4; 379/91.01; 712/42, 32, 36, 234

(56) References Cited

U.S. PATENT DOCUMENTS

| | | | | |
|---|---|---|---|---|
| 4,718,065 A | * | 1/1988 | Boyle et al. | 714/725 |
| 5,218,680 A | * | 6/1993 | Farrell et al. | 709/215 |
| 5,608,662 A | * | 3/1997 | Large et al. | 708/300 |
| 5,619,516 A | * | 4/1997 | Li et al. | 714/757 |
| 6,101,520 A | * | 8/2000 | Lan et al. | 708/492 |
| 6,253,346 B1 | * | 6/2001 | Kim et al. | 375/225 |

OTHER PUBLICATIONS

Protopapas (Microcomputer Hardware Design; pp. 220–235, 484–491; 1988).*

Sobski et al. (Partitioned and parallel cyclic redundancy checking; IEEE; pp. 538–541 vol. 1; Aug. 16–18, 1993).*

Philip et al. (A high–speed parallel DSP architecture dedicated to digital modem applications; IEEE; pp. 477–480 vol. 1; Sep. 7–10, 1998).*

Davis et al. (Findling cyclic redundancy check polynomials for multilevel systems; IEEE; pp. 1250–1253; Oct. 1998).*

IBM Tech. Disclosure Bulletin, 85122905, Dec. 1985.*

IBM Tech. Disclosure, 8106166, Jun. 1981.*

Tae–Hee Lee et al. (A unique section overhead processor for STM–64; IEEE; pp. 155–159; Sep. 7–10, 1997).*

Sait et al. (VLSI layout generation of a programmable CRC chip; IEEE; pp. 911–916; Nov. 7, 1993).*

Kien Du Phung et al. (Study of a SONET STS–3c based ATM user network interface; IEEE; pp. 366–369; Sep. 27–Oct. 1, 1993).*

* cited by examiner

*Primary Examiner*—Albert Decady
*Assistant Examiner*—Guy Lamarre
(74) *Attorney, Agent, or Firm*—Weingarten, Schurgin, Gagnebin & Lebovici LLP

(57) ABSTRACT

A parallel, recursive system for generating and checking a CRC value is disclosed, in which the feedback and forward terms are separated, and the forward terms are reduced. Forward logic, which implements the forward terms, is responsive to a number of bits received from the unit of data, and performs logic operations reflecting the reduced forward logic terms on bits received from the unit of data, to produce a first output. In some cases the forward logic is a direct connection to a number of exclusive-OR logic gates. Feedback logic, responsive to an output of a remainder register, operates to perform feedback logic operations reflecting the feedback terms, on an output of the remainder register to produce a second output. The second output is also coupled to the exclusive-OR logic gates. The exclusive-OR logic gates perform a bit-wise exclusive-OR logic operation on the first output and the second output to produce an input of the remainder register. At the end of processing of the unit of data, the remainder register stores the CRC value, or the inverse of the CRC value.

48 Claims, 97 Drawing Sheets

Fig. 12a

```
crc8_0=    r2 + r8;
crc8_1=    r0 + r3 + r9;
crc8_2=    r0 + r1 + r4 + r10;
crc8_3=    r1 + r2 + r5 + r11;
crc8_4=    r0 + r2 + r3 + r6 + r12;
crc8_5=    r1 + r3 + r4 + r7 + r13;
crc8_6=    r4 + r5 + r14;
crc8_7=    r0 + r5 + r6 + r15;
crc8_8=    r1 + r6 + r7 + r16;
crc8_9=    r7 + r17;
crc8_10=   r2 + r18;
crc8_11=   r3 + r19;
crc8_12=   r0 + r4 + r20;
crc8_13=   r0 + r1 + r5 + r21;
crc8_14=   r1 + r2 + r6 + r22;
crc8_15=   r2 + r3 + r7 + r23;
crc8_16=   r0 + r2 + r3 + r4 + r24;
crc8_17=   r0 + r1 + r3 + r4 + r5 + r25;
crc8_18=   r0 + r1 + r2 + r4 + r5 + r6 + r26;
crc8_19=   r1 + r2 + r3 + r5 + r6 + r7 + r27;
```

Fig. 12b crc8_20= r3 + r4 + r6 + r7 + r28;

crc8_21= r2 + r4 + r5 + r7 + r29;

crc8_22= r2 + r3 + r5 + r6 + r30;

crc8_23= r3 + r4 + r6 + r7 + r31;

crc8_24= b0 + r0 + r2 + r4 + r5 + r7;

crc8_25= b1 + r0 + r1 + r2 + r3 + r5 + r6;

crc8_26= b2 + r0 + r1 + r2 + r3 + r4 + r6 + r7;

crc8_27= b3 + r1 + r3 + r4 + r5 + r7;

crc8_28= b4 + r0 + r4 + r5 + r6;

crc8_29= b5 + r0 + r1 + r5 + r6 + r7;

crc8_30= b6 + r0 + r1 + r6 + r7;

crc8_31= b7 + r1 + r7;

Fig. 13a

```
crc16_0=    r0 + r4 + r6 + r7 + r10 + r16;
crc16_1=    r1 + r5 + r7 + r8 + r11 + r17;
crc16_2=    r2 + r6 + r8 + r9 + r12 + r18;
crc16_3=    r3 + r7 + r9 + r10 + r13 + r19;
crc16_4=    r4 + r8 + r10 + r11 + r14 + r20;
crc16_5=    r5 + r9 + r11 + r12 + r15 + r21;
crc16_6=    r0 + r4 + r7 + r12 + r13 + r22;
crc16_7=    r1 + r5 + r8 + r13 + r14 + r23;
crc16_8=    r0 + r2 + r6 + r9 + r14 + r15 + r24;
crc16_9=    r1 + r3 + r4 + r6 + r15 + r25;
crc16_10=   r2 + r5 + r6 + r10 + r26;
crc16_11=   r3 + r6 + r7 + r11 + r27;
crc16_12=   r0 + r4 + r7 + r8 + r12 + r28;
crc16_13=   r0 + r1 + r5 + r8 + r9 + r13 + r29;
crc16_14=   r1 + r2 + r6 + r9 + r10 + r14 + r30;
crc16_15=   r2 + r3 + r7 + r10 + r11 + r15 + r31;
crc16_16=   b0 + r0 + r3 + r6 + r7 + r8 + r10 + r11 + r12;
crc16_17=   b1 + r0 + r1 + r4 + r7 + r8 + r9 + r11 + r12 + r13;
crc16_18=   b2 + r1 + r2 + r5 + r8 + r9 + r10 + r12 + r13 + r14;
crc16_19=   b3 + r0 + r2 + r3 + r6 + r9 + r10 + r11 + r13 + r14 + r15;
crc16_20=   b4 + r0 + r1 + r3 + r6 + r11 + r12 + r14 + r15;
```

Fig. 13b crc16_21= b5 + r1 + r2 + r6 + r10 + r12 + r13 + r15;

crc16_22= b6 + r2 + r3 + r4 + r6 + r10 + r11 + r13 + r14;

crc16_23= b7 + r3 + r4 + r5 + r7 + r11 + r12 + r14 + r15;

crc16_24= b8 + r0 + r5 + r7 + r8 + r10 + r12 + r13 + r15;

crc16_25= b9 + r1 + r4 + r7 + r8 + r9 + r10 + r11 + r13 + r14;

crc16_26= b10 + r2 + r5 + r8 + r9 + r10 + r11 + r12 + r14 + r15;

crc16_27= b11 + r0 + r3 + r4 + r7 + r9 + r11 + r12 + r13 + r15;

crc16_28= b12 + r0 + r1 + r5 + r6 + r7 + r8 + r12 + r13 + r14;

crc16_29= b13 + r1 + r2 + r6 + r7 + r8 + r9 + r13 + r14 + r15;

crc16_30= b14 + r2 + r3 + r4 + r6 + r8 + r9 + r14 + r15;

crc16_31= b15 + r3 + r5 + r6 + r9 + r15;

Fig. 14a crc24_0= r0 + r8 + r12 + r14 + r15 + r18 + r24;

crc24_1= r0 + r1 + r9 + r13 + r15 + r16 + r19 + r25;

crc24_2= r0 + r1 + r2 + r10 + r14 + r16 + r17 + r20 + r26;

crc24_3= r1 + r2 + r3 + r11 + r15 + r17 + r18 + r21 + r27;

crc24_4= r0 + r2 + r3 + r4 + r12 + r16 + r18 + r19 + r22 + r28;

crc24_5= r0 + r1 + r3 + r4 + r5 + r13 + r17 + r19 + r20 + r23 + r29;

crc24_6= r1 + r2 + r4 + r5 + r6 + r8 + r12 + r15 + r20 + r21 + r30;

crc24_7= r2 + r3 + r5 + r6 + r7 + r9 + r13 + r16 + r21 + r22 + r31;

crc24_8= b0 + r3 + r4 + r6 + r7 + r8 + r10 + r14 + r17 + r22 + r23;

crc24_9= b1 + r0 + r4 + r5 + r7 + r9 + r11 + r12 + r14 + r23;

crc24_10= b2 + r1 + r5 + r6 + r10 + r13 + r14 + r18;

crc24_11= b3 + r0 + r2 + r6 + r7 + r11 + r14 + r15 + r19;

crc24_12= b4 + r1 + r3 + r7 + r8 + r12 + r15 + r16 + r20;

crc24_13= b5 + r0 + r2 + r4 + r8 + r9 + r13 + r16 + r17 + r21;

crc24_14= b6 + r0 + r1 + r3 + r5 + r9 + r10 + r14 + r17 + r18 + r22;

crc24_15= b7 + r1 + r2 + r4 + r6 + r10 + r11 + r15 + r18 + r19 + r23;

crc24_16= b8 + r2 + r3 + r5 + r7 + r8 + r11 + r14 + r15 + r16 + r18 + r19 + r20;

crc24_17= b9 + r0 + r3 + r4 + r6 + r8 + r9 + r12 + r15 + r16 + r17 + r19 + r20 + r21;

Fig. 14b crc24_18= b10 + r1 + r4 + r5 + r7 + r9 + r10 + r13 + r16 + r17 + r18 + r20 + r21 + r22;

crc24_19= b11 + r2 + r5 + r6 + r8 + r10 + r11 + r14 + r17 + r18 + r19 + r21 + r22 + r23;

crc24_20= b12 + r3 + r6 + r7 + r8 + r9 + r11 + r14 + r19 + r20 + r22 + r23;

crc24_21= b13 + r4 + r7 + r9 + r10 + r14 + r18 + r20 + r21 + r23;

crc24_22= b14 + r0 + r5 + r10 + r11 + r12 + r14 + r18 + r19 + r21 + r22;

crc24_23= b15 + r0 + r1 + r6 + r11 + r12 + r13 + r15 + r19 + r20 + r22 + r23;

crc24_24= b16 + r0 + r1 + r2 + r7 + r8 + r13 + r15 + r16 + r18 + r20 + r21 + r23;

crc24_25= b17 + r1 + r2 + r3 + r9 + r12 + r15 + r16 + r17 + r18 + r19 + r21 + r22;

crc24_26= b18 + r2 + r3 + r4 + r10 + r13 + r16 + r17 + r18 + r19 + r20 + r22 + r23;

crc24_27= b19 + r3 + r4 + r5 + r8 + r11 + r12 + r15 + r17 + r19 + r20 + r21 + r23;

crc24_28= b20 + r4 + r5 + r6 + r8 + r9 + r13 + r14 + r15 + r16 + r20 + r21 + r22;

crc24_29= b21 + r5 + r6 + r7 + r9 + r10 + r14 + r15 + r16 + r17 + r21 + r22 + r23;

crc24_30= b22 + r6 + r7 + r10 + r11 + r12 + r14 + r16 + r17 + r22 + r23;

crc24_31= b23 + r7 + r11 + r13 + r14 + r17 + r23;

Fig. 15a crc32_0= b0 + r0 + r1 + r2 + r3 + r4 + r6 + r7 + r8 + r16 + r20 + r22 + r23 + r26;

crc32_1= b1 + r1 + r2 + r3 + r4 + r5 + r7 + r8 + r9 + r17 + r21 + r23 + r24 + r27;

crc32_2= b2 + r0 + r2 + r3 + r4 + r5 + r6 + r8 + r9 + r10 + r18 + r22 + r24 + r25 + r28;

crc32_3= b3 + r1 + r3 + r4 + r5 + r6 + r7 + r9 + r10 + r11 + r19 + r23 + r25 + r26 + r29;

crc32_4= b4 + r2 + r4 + r5 + r6 + r7 + r8 + r10 + r11 + r12 + r20 + r24 + r26 + r27 + r30;

crc32_5= b5 + r0 + r3 + r5 + r6 + r7 + r8 + r9 + r11 + r12 + r13 + r21 + r25 + r27 + r28 + r31;

crc32_6= b6 + r0 + r2 + r3 + r9 + r10 + r12 + r13 + r14 + r16 + r20 + r23 + r28 + r29;

crc32_7= b7 + r1 + r3 + r4 + r10 + r11 + r13 + r14 + r15 + r17 + r21 + r24 + r29 + r30;

crc32_8= b8 + r0 + r2 + r4 + r5 + r11 + r12 + r14 + r15 + r16 + r18 + r22 + r25 + r30 + r31;

crc32_9= b9 + r0 + r2 + r4 + r5 + r7 + r8 + r12 + r13 + r15 + r17 + r19 + r20 + r22 + r31;

crc32_10= b10 + r0 + r2 + r4 + r5 + r7 + r9 + r13 + r14 + r18 + r21 + r22 + r26;

crc32_11= b11 + r1 + r3 + r5 + r6 + r8 + r10 + r14 + r15 + r19 + r22 + r23 + r27;

crc32_12= b12 + r2 + r4 + r6 + r7 + r9 + r11 + r15 + r16 + r20 + r23 + r24 + r28;

Fig. 15b crc32_13= b13 + r0 + r3 + r5 + r7 + r8 + r10 + r12 + r16 + r17 + r21 + r24 + r25 + r29;

crc32_14= b14 + r0 + r1 + r4 + r6 + r8 + r9 + r11 + r13 + r17 + r18 + r22 + r25 + r26 + r30;

crc32_15= b15 + r1 + r2 + r5 + r7 + r9 + r10 + r12 + r14 + r18 + r19 + r23 + r26 + r27 + r31;

crc32_16= b16 + r1 + r4 + r7 + r10 + r11 + r13 + r15 + r16 + r19 + r22 + r23 + r24 + r26 + r27 + r28;

crc32_17= b17 + r2 + r5 + r8 + r11 + r12 + r14 + r16 + r17 + r20 + r23 + r24 + r25 + r27 + r28 + r29;

crc32_18= b18 + r0 + r3 + r6 + r9 + r12 + r13 + r15 + r17 + r18 + r21 + r24 + r25 + r26 + r28 + r29 + r30;

crc32_19= b19 + r0 + r1 + r4 + r7 + r10 + r13 + r14 + r16 + r18 + r19 + r22 + r25 + r26 + r27 + r29 + r30 + r31;

crc32_20= b20 + r0 + r3 + r4 + r5 + r6 + r7 + r11 + r14 + r15 + r16 + r17 + r19 + r22 + r27 + r28 + r30 + r31;

crc32_21= b21 + r0 + r2 + r3 + r5 + r12 + r15 + r17 + r18 + r22 + r26 + r28 + r29 + r31;

crc32_22= b22 + r2 + r7 + r8 + r13 + r18 + r19 + r20 + r22 + r26 + r27 + r29 + r30;

crc32_23= b23 + r0 + r3 + r8 + r9 + r14 + r19 + r20 + r21 + r23 + r27 + r28 + r30 + r31;

crc32_24= b24 + r2 + r3 + r6 + r7 + r8 + r9 + r10 + r15 + r16 + r21 + r23 + r24 + r26 + r28 + r29 + r31;

crc32_25= b25 + r1 + r2 + r6 + r9 + r10 + r11 + r17 + r20 + r23 + r24 + r25 + r26 + r27 + r29 + r30;

Fig. 15c crc32_26= b26 + r2 + r3 + r7 + r10 + r11 + r12 + r18 + r21 + r24 + r25 + r26 + r27 + r28 + r30 + r31;

crc32_27= b27 + r0 + r1 + r2 + r6 + r7 + r11 + r12 + r13 + r16 + r19 + r20 + r23 + r25 + r27 + r28 + r29 + r31;

crc32_28= b28 + r0 + r4 + r6 + r12 + r13 + r14 + r16 + r17 + r21 + r22 + r23 + r24 + r28 + r29 + r30;

crc32_29= b29 + r0 + r1 + r5 + r7 + r13 + r14 + r15 + r17 + r18 + r22 + r23 + r24 + r25 + r29 + r30 + r31;

crc32_30= b30 + r3 + r4 + r7 + r14 + r15 + r18 + r19 + r20 + r22 + r24 + r25 + r30 + r31;

crc32_31= b31 + r0 + r1 + r2 + r3 + r5 + r6 + r7 + r15 + r19 + r21 + r22 + r25 + r31;

Fig. 16a crc40_0= b2 + b8 + r3 + r6 + r8 + r9 + r10 + r11 + r12 + r14 + r15 + r16 + r24 + r28 + r30 + r31;

crc40_1= b0 + b3 + b9 + r4 + r7 + r9 + r10 + r11 + r12 + r13 + r15 + r16 + r17 + r25 + r29 + r31;

crc40_2= b0 + b1 + b4 + b10 + r5 + r8 + r10 + r11 + r12 + r13 + r14 + r16 + r17 + r18 + r26 + r30;

crc40_3= b1 + b2 + b5 + b11 + r6 + r9 + r11 + r12 + r13 + r14 + r15 + r17 + r18 + r19 + r27 + r31;

crc40_4= b0 + b2 + b3 + b6 + b12 + r0 + r7 + r10 + r12 + r13 + r14 + r15 + r16 + r18 + r19 + r20 + r28;

crc40_5= b1 + b3 + b4 + b7 + b13 + r0 + r1 + r8 + r11 + r13 + r14 + r15 + r16 + r17 + r19 + r20 + r21 + r29;

crc40_6= b4 + b5 + b14 + r1 + r2 + r3 + r6 + r8 + r10 + r11 + r17 + r18 + r20 + r21 + r22 + r24 + r28 + r31;

crc40_7= b0 + b5 + b6 + b15 + r0 + r2 + r3 + r4 + r7 + r9 + r11 + r12 + r18 + r19 + r21 + r22 + r23 + r25 + r29;

crc40_8= b1 + b6 + b7 + b16 + r0 + r1 + r3 + r4 + r5 + r8 + r10 + r12 + r13 + r19 + r20 + r22 + r23 + r24 + r26 + r30;

crc40_9= b7 + b17 + r1 + r2 + r3 + r4 + r5 + r8 + r10 + r12 + r13 + r15 + r16 + r20 + r21 + r23 + r25 + r27 + r28 + r30;

crc40_10= b2 + b18 + r2 + r4 + r5 + r8 + r10 + r12 + r13 + r15 + r17 + r21 + r22 + r26 + r29 + r30;

crc40_11= b3 + b19 + r0 + r3 + r5 + r6 + r9 + r11 + r13 + r14 + r16 + r18 + r22 + r23 + r27 + r30 + r31;

crc40_12= b0 + b4 + b20 + r1 + r4 + r6 + r7 + r10 + r12 + r14 + r15 + r17 + r19 + r23 + r24 + r28 + r31;

Fig. 16b crc40_13= b0 + b1 + b5 + b21 + r0 + r2 + r5 + r7 + r8 + r11 + r13 + r15 + r16 + r18 + r20 + r24 + r25 + r29;

crc40_14= b1 + b2 + b6 + b22 + r1 + r3 + r6 + r8 + r9 + r12 + r14 + r16 + r17 + r19 + r21 + r25 + r26 + r30;

crc40_15= b2 + b3 + b7 + b23 + r2 + r4 + r7 + r9 + r10 + r13 + r15 + r17 + r18 + r20 + r22 + r26 + r27 + r31;

crc40_16= b0 + b2 + b3 + b4 + b24 + r5 + r6 + r9 + r12 + r15 + r18 + r19 + r21 + r23 + r24 + r27 + r30 + r31;

crc40_17= b0 + b1 + b3 + b4 + b5 + b25 + r6 + r7 + r10 + r13 + r16 + r19 + r20 + r22 + r24 + r25 + r28 + r31;

crc40_18= b0 + b1 + b2 + b4 + b5 + b6 + b26 + r7 + r8 + r11 + r14 + r17 + r20 + r21 + r23 + r25 + r26 + r29;

crc40_19= b1 + b2 + b3 + b5 + b6 + b7 + b27 + r8 + r9 + r12 + r15 + r18 + r21 + r22 + r24 + r26 + r27 + r30;

crc40_20= b3 + b4 + b6 + b7 + b28 + r3 + r6 + r8 + r11 + r12 + r13 + r14 + r15 + r19 + r22 + r23 + r24 + r25 + r27 + r30;

crc40_21= b2 + b4 + b5 + b7 + b29 + r0 + r3 + r4 + r6 + r7 + r8 + r10 + r11 + r13 + r20 + r23 + r25 + r26 + r30;

crc40_22= b2 + b3 + b5 + b6 + b30 + r0 + r1 + r3 + r4 + r5 + r6 + r7 + r10 + r15 + r16 + r21 + r26 + r27 + r28 + r30;

crc40_23= b3 + b4 + b6 + b7 + b31 + r1 + r2 + r4 + r5 + r6 + r7 + r8 + r11 + r16 + r17 + r22 + r27 + r28 + r29 + r31;

crc40_24= b0 + b2 + b4 + b5 + b7 + b32 + r0 + r2 + r5 + r7 + r10 + r11 + r14 + r15 + r16 + r17 + r18 + r23 + r24 + r29 + r31;

crc40_25= b0 + b1 + b2 + b3 + b5 + b6 + b33 + r1 + r9 + r10 + r14 + r17 + r18 + r19 + r25 + r28 + r31;

Fig. 16c crc40_26= b0 + b1 + b2 + b3 + b4 + b6 + b7 + b34 + r0 + r2 + r10 + r11 + r15 + r18 + r19 + r20 + r26 + r29;

crc40_27= b1 + b3 + b4 + b5 + b7 + b35 + r0 + r1 + r6 + r8 + r9 + r10 + r14 + r15 + r19 + r20 + r21 + r24 + r27 + r28 + r31;

crc40_28= b0 + b4 + b5 + b6 + b36 + r0 + r1 + r2 + r3 + r6 + r7 + r8 + r12 + r14 + r20 + r21 + r22 + r24 + r25 + r29 + r30 + r31;

crc40_29= b0 + b1 + b5 + b6 + b7 + b37 + r0 + r1 + r2 + r3 + r4 + r7 + r8 + r9 + r13 + r15 + r21 + r22 + r23 + r25 + r26 + r30 + r31;

crc40_30= b0 + b1 + b6 + b7 + b38 + r1 + r2 + r4 + r5 + r6 + r11 + r12 + r15 + r22 + r23 + r26 + r27 + r28 + r30;

crc40_31= b1 + b7 + b39 + r2 + r5 + r7 + r8 + r9 + r10 + r11 + r13 + r14 + r15 + r23 + r27 + r29 + r30;

Fig. 17a crc48_0= b0 + b4 + b6 + b7 + b10 + b16 + r0 + r1 + r3 + r4 + r11 + r14 + r16 + r17 + r18 + r19 + r20 + r22 + r23 + r24;

crc48_1= b1 + b5 + b7 + b8 + b11 + b17 + r1 + r2 + r4 + r5 + r12 + r15 + r17 + r18 + r19 + r20 + r21 + r23 + r24 + r25;

crc48_2= b2 + b6 + b8 + b9 + b12 + b18 + r0 + r2 + r3 + r5 + r6 + r13 + r16 + r18 + r19 + r20 + r21 + r22 + r24 + r25 + r26;

crc48_3= b3 + b7 + b9 + b10 + b13 + b19 + r1 + r3 + r4 + r6 + r7 + r14 + r17 + r19 + r20 + r21 + r22 + r23 + r25 + r26 + r27;

crc48_4= b4 + b8 + b10 + b11 + b14 + b20 + r2 + r4 + r5 + r7 + r8 + r15 + r18 + r20 + r21 + r22 + r23 + r24 + r26 + r27 + r28;

crc48_5= b5 + b9 + b11 + b12 + b15 + b21 + r0 + r3 + r5 + r6 + r8 + r9 + r16 + r19 + r21 + r22 + r23 + r24 + r25 + r27 + r28 + r29;

crc48_6= b0 + b4 + b7 + b12 + b13 + b22 + r3 + r6 + r7 + r9 + r10 + r11 + r14 + r16 + r18 + r19 + r25 + r26 + r28 + r29 + r30;

crc48_7= b1 + b5 + b8 + b13 + b14 + b23 + r0 + r4 + r7 + r8 + r10 + r11 + r12 + r15 + r17 + r19 + r20 + r26 + r27 + r29 + r30 + r31;

crc48_8= b0 + b2 + b6 + b9 + b14 + b15 + b24 + r0 + r1 + r5 + r8 + r9 + r11 + r12 + r13 + r16 + r18 + r20 + r21 + r27 + r28 + r30 + r31;

crc48_9= b1 + b3 + b4 + b6 + b15 + b25 + r0 + r2 + r3 + r4 + r6 + r9 + r10 + r11 + r12 + r13 + r16 + r18 + r20 + r21 + r23 + r24 + r28 + r29 + r31;

crc48_10= b2 + b5 + b6 + b10 + b26 + r5 + r7 + r10 + r12 + r13 + r16 + r18 + r20 + r21 + r23 + r25 + r29 + r30;

crc48_11= b3 + b6 + b7 + b11 + b27 + r6 + r8 + r11 + r13 + r14 + r17 + r19 + r21 + r22 + r24 + r26 + r30 + r31;

crc48_12= b0 + b4 + b7 + b8 + b12 + b28 + r0 + r7 + r9 + r12 + r14 + r15 + r18 + r20 + r22 + r23 + r25 + r27 + r31;

Fig. 17b crc48_13= b0 + b1 + b5 + b8 + b9 + b13 + b29 + r1 + r8 + r10 + r13 + r15 + r16 + r19 + r21 + r23 + r24 + r26 + r28;

crc48_14= b1 + b2 + b6 + b9 + b10 + b14 + b30 + r0 + r2 + r9 + r11 + r14 + r16 + r17 + r20 + r22 + r24 + r25 + r27 + r29;

crc48_15= b2 + b3 + b7 + b10 + b11 + b15 + b31 + r0 + r1 + r3 + r10 + r12 + r15 + r17 + r18 + r21 + r23 + r25 + r26 + r28 + r30;

crc48_16= b0 + b3 + b6 + b7 + b8 + b10 + b11 + b12 + b32 + r2 + r3 + r13 + r14 + r17 + r20 + r23 + r26 + r27 + r29 + r31;

crc48_17= b0 + b1 + b4 + b7 + b8 + b9 + b11 + b12 + b13 + b33 + r3 + r4 + r14 + r15 + r18 + r21 + r24 + r27 + r28 + r30;

crc48_18= b1 + b2 + b5 + b8 + b9 + b10 + b12 + b13 + b14 + b34 + r0 + r4 + r5 + r15 + r16 + r19 + r22 + r25 + r28 + r29 + r31;

crc48_19= b0 + b2 + b3 + b6 + b9 + b10 + b11 + b13 + b14 + b15 + b35 + r0 + r1 + r5 + r6 + r16 + r17 + r20 + r23 + r26 + r29 + r30;

crc48_20= b0 + b1 + b3 + b6 + b11 + b12 + b14 + b15 + b36 + r0 + r2 + r3 + r4 + r6 + r7 + r11 + r14 + r16 + r19 + r20 + r21 + r22 + r23 + r27 + r30 + r31;

crc48_21= b1 + b2 + b6 + b10 + b12 + b13 + b15 + b37 + r5 + r7 + r8 + r11 + r12 + r14 + r15 + r16 + r18 + r19 + r21 + r28 + r31;

crc48_22= b2 + b3 + b4 + b6 + b10 + b11 + b13 + b14 + b38 + r0 + r1 + r3 + r4 + r6 + r8 + r9 + r11 + r12 + r13 + r14 + r15 + r18 + r23 + r24 + r29;

crc48_23= b3 + b4 + b5 + b7 + b11 + b12 + b14 + b15 + b39 + r1 + r2 + r4 + r5 + r7 + r9 + r10 + r12 + r13 + r14 + r15 + r16 + r19 + r24 + r25 + r30;

crc48_24= b0 + b5 + b7 + b8 + b10 + b12 + b13 + b15 + b40 + r0 + r1 + r2 + r4 + r5 + r6 + r8 + r10 + r13 + r15 + r18 + r19 + r22 + r23 + r24 + r25 + r26 + r31;

Fig. 17c crc48_25= b1 + b4 + b7 + b8 + b9 + b10 + b11 + b13 + b14 + b41 + r0 + r2 + r4 + r5 + r6 + r7 + r9 + r17 + r18 + r22 + r25 + r26 + r27;

crc48_26= b2 + b5 + b8 + b9 + b10 + b11 + b12 + b14 + b15 + b42 + r1 + r3 + r5 + r6 + r7 + r8 + r10 + r18 + r19 + r23 + r26 + r27 + r28;

crc48_27= b0 + b3 + b4 + b7 + b9 + b11 + b12 + b13 + b15 + b43 + r0 + r1 + r2 + r3 + r6 + r7 + r8 + r9 + r14 + r16 + r17 + r18 + r22 + r23 + r27 + r28 + r29;

crc48_28= b0 + b1 + b5 + b6 + b7 + b8 + b12 + b13 + b14 + b44 + r2 + r7 + r8 + r9 + r10 + r11 + r14 + r15 + r16 + r20 + r22 + r28 + r29 + r30;

crc48_29= b1 + b2 + b6 + b7 + b8 + b9 + b13 + b14 + b15 + b45 + r3 + r8 + r9 + r10 + r11 + r12 + r15 + r16 + r17 + r21 + r23 + r29 + r30 + r31;

crc48_30= b2 + b3 + b4 + b6 + b8 + b9 + b14 + b15 + b46 + r0 + r1 + r3 + r9 + r10 + r12 + r13 + r14 + r19 + r20 + r23 + r30 + r31;

crc48_31= b3 + b5 + b6 + b9 + b15 + b47 + r0 + r2 + r3 + r10 + r13 + r15 + r16 + r17 + r18 + r19 + r21 + r22 + r23 + r31;

Fig. 18a crc56_0= b0 + b8 + b12 + b14 + b15 + b18 + b24 + r1 + r2 + r3 + r6 + r8 + r9 + r11 + r12 + r19 + r22 + r24 + r25 + r26 + r27 + r28 + r30 + r31;

crc56_1= b0 + b1 + b9 + b13 + b15 + b16 + b19 + b25 + r2 + r3 + r4 + r7 + r9 + r10 + r12 + r13 + r20 + r23 + r25 + r26 + r27 + r28 + r29 + r31;

crc56_2= b0 + b1 + b2 + b10 + b14 + b16 + b17 + b20 + b26 + r0 + r3 + r4 + r5 + r8 + r10 + r11 + r13 + r14 + r21 + r24 + r26 + r27 + r28 + r29 + r30;

crc56_3= b1 + b2 + b3 + b11 + b15 + b17 + b18 + b21 + b27 + r1 + r4 + r5 + r6 + r9 + r11 + r12 + r14 + r15 + r22 + r25 + r27 + r28 + r29 + r30 + r31;

crc56_4= b0 + b2 + b3 + b4 + b12 + b16 + b18 + b19 + b22 + b28 + r0 + r2 + r5 + r6 + r7 + r10 + r12 + r13 + r15 + r16 + r23 + r26 + r28 + r29 + r30 + r31;

crc56_5= b0 + b1 + b3 + b4 + b5 + b13 + b17 + b19 + b20 + b23 + b29 + r0 + r1 + r3 + r6 + r7 + r8 + r11 + r13 + r14 + r16 + r17 + r24 + r27 + r29 + r30 + r31;

crc56_6= b1 + b2 + b4 + b5 + b6 + b8 + b12 + b15 + b20 + b21 + b30 + r3 + r4 + r6 + r7 + r11 + r14 + r15 + r17 + r18 + r19 + r22 + r24 + r26 + r27;

crc56_7= b2 + b3 + b5 + b6 + b7 + b9 + b13 + b16 + b21 + b22 + b31 + r0 + r4 + r5 + r7 + r8 + r12 + r15 + r16 + r18 + r19 + r20 + r23 + r25 + r27 + r28;

crc56_8= b3 + b4 + b6 + b7 + b8 + b10 + b14 + b17 + b22 + b23 + b32 + r0 + r1 + r5 + r6 + r8 + r9 + r13 + r16 + r17 + r19 + r20 + r21 + r24 + r26 + r28 + r29;

crc56_9= b0 + b4 + b5 + b7 + b9 + b11 + b12 + b14 + b23 + b33 + r0 + r3 + r7 + r8 + r10 + r11 + r12 + r14 + r17 + r18 + r19 + r20 + r21 + r24 + r26 + r28 + r29 + r31;

Fig. 18b crc56_10= b1 + b5 + b6 + b10 + b13 + b14 + b18 + b34 + r2 + r3 + r4 + r6 + r13 + r15 + r18 + r20 + r21 + r24 + r26 + r28 + r29 + r31;

crc56_11= b0 + b2 + b6 + b7 + b11 + b14 + b15 + b19 + b35 + r0 + r3 + r4 + r5 + r7 + r14 + r16 + r19 + r21 + r22 + r25 + r27 + r29 + r30;

crc56_12= b1 + b3 + b7 + b8 + b12 + b15 + b16 + b20 + b36 + r1 + r4 + r5 + r6 + r8 + r15 + r17 + r20 + r22 + r23 + r26 + r28 + r30 + r31;

crc56_13= b0 + b2 + b4 + b8 + b9 + b13 + b16 + b17 + b21 + b37 + r2 + r5 + r6 + r7 + r9 + r16 + r18 + r21 + r23 + r24 + r27 + r29 + r31;

crc56_14= b0 + b1 + b3 + b5 + b9 + b10 + b14 + b17 + b18 + b22 + b38 + r3 + r6 + r7 + r8 + r10 + r17 + r19 + r22 + r24 + r25 + r28 + r30;

crc56_15= b1 + b2 + b4 + b6 + b10 + b11 + b15 + b18 + b19 + b23 + b39 + r4 + r7 + r8 + r9 + r11 + r18 + r20 + r23 + r25 + r26 + r29 + r31;

crc56_16= b2 + b3 + b5 + b7 + b8 + b11 + b14 + b15 + b16 + b18 + b19 + b20 + b40 + r0 + r1 + r2 + r3 + r5 + r6 + r10 + r11 + r21 + r22 + r25 + r28 + r31;

crc56_17= b0 + b3 + b4 + b6 + b8 + b9 + b12 + b15 + b16 + b17 + b19 + b20 + b21 + b41 + r0 + r1 + r2 + r3 + r4 + r6 + r7 + r11 + r12 + r22 + r23 + r26 + r29;

crc56_18= b1 + b4 + b5 + b7 + b9 + b10 + b13 + b16 + b17 + b18 + b20 + b21 + b22 + b42 + r0 + r1 + r2 + r3 + r4 + r5 + r7 + r8 + r12 + r13 + r23 + r24 + r27 + r30;

crc56_19= b2 + b5 + b6 + b8 + b10 + b11 + b14 + b17 + b18 + b19 + b21 + b22 + b23 + b43 + r1 + r2 + r3 + r4 + r5 + r6 + r8 + r9 + r13 + r14 + r24 + r25 + r28 + r31;

crc56_20= b3 + b6 + b7 + b8 + b9 + b11 + b14 + b19 + b20 + b22 + b23 + b44 + r0 + r1 + r4 + r5 + r7 + r8 + r10 + r11 + r12 + r14 + r15 + r19 + r22 + r24 + r27 + r28 + r29 + r30 + r31;

Fig. 18c crc56_21= b4 + b7 + b9 + b10 + b14 + b18 + b20 + b21 + b23 + b45 + r0 + r3 + r5 + r13 + r15 + r16 + r19 + r20 + r22 + r23 + r24 + r26 + r27 + r29;

crc56_22= b0 + b5 + b10 + b11 + b12 + b14 + b18 + b19 + b21 + b22 + b46 + r0 + r2 + r3 + r4 + r8 + r9 + r11 + r12 + r14 + r16 + r17 + r19 + r20 + r21 + r22 + r23 + r26 + r31;

crc56_23= b0 + b1 + b6 + b11 + b12 + b13 + b15 + b19 + b20 + b22 + b23 + b47 + r1 + r3 + r4 + r5 + r9 + r10 + r12 + r13 + r15 + r17 + r18 + r20 + r21 + r22 + r23 + r24 + r27;

crc56_24= b0 + b1 + b2 + b7 + b8 + b13 + b15 + b16 + b18 + b20 + b21 + b23 + b48 + r1 + r3 + r4 + r5 + r8 + r9 + r10 + r12 + r13 + r14 + r16 + r18 + r21 + r23 + r26 + r27 + r30 + r31;

crc56_25= b1 + b2 + b3 + b9 + b12 + b15 + b16 + b17 + b18 + b19 + b21 + b22 + b49 + r0 + r1 + r3 + r4 + r5 + r8 + r10 + r12 + r13 + r14 + r15 + r17 + r25 + r26 + r30;

crc56_26= b2 + b3 + b4 + b10 + b13 + b16 + b17 + b18 + b19 + b20 + b22 + b23 + b50 + r0 + r1 + r2 + r4 + r5 + r6 + r9 + r11 + r13 + r14 + r15 + r16 + r18 + r26 + r27 + r31;

crc56_27= b3 + b4 + b5 + b8 + b11 + b12 + b15 + b17 + b19 + b20 + b21 + b23 + b51 + r5 + r7 + r8 + r9 + r10 + r11 + r14 + r15 + r16 + r17 + r22 + r24 + r25 + r26 + r30 + r31;

crc56_28= b4 + b5 + b6 + b8 + b9 + b13 + b14 + b15 + b16 + b20 + b21 + b22 + b52 + r1 + r2 + r3 + r10 + r15 + r16 + r17 + r18 + r19 + r22 + r23 + r24 + r28 + r30;

crc56_29= b5 + b6 + b7 + b9 + b10 + b14 + b15 + b16 + b17 + b21 + b22 + b23 + b53 + r0 + r2 + r3 + r4 + r11 + r16 + r17 + r18 + r19 + r20 + r23 + r24 + r25 + r29 + r31;

crc56_30= b6 + b7 + b10 + b11 + b12 + b14 + b16 + b17 + b22 + b23 + b54 + r2 + r4 + r5 + r6 + r8 + r9 + r11 + r17 + r18 + r20 + r21 + r22 + r27 + r28 + r31;

Fig. 18d crc56_31= b7 + b11 + b13 + b14 + b17 + b23 + b55 + r0 + r1 + r2 + r5 + r7 + r8 + r10 + r11 + r18 + r21 + r23 + r24 + r25 + r26 + r27 + r29 + r30 + r31;

Fig. 19a crc64_0= b0 + b1 + b2 + b3 + b4 + b6 + b7 + b8 + b16 + b20 + b22 + b23 + b26 + b32 + r1 + r3 + r4 + r6 + r9 + r10 + r11 + r14 + r16 + r17 + r19 + r20 + r27 + r30;

crc64_1= b1 + b2 + b3 + b4 + b5 + b7 + b8 + b9 + b17 + b21 + b23 + b24 + b27 + b33 + r0 + r2 + r4 + r5 + r7 + r10 + r11 + r12 + r15 + r17 + r18 + r20 + r21 + r28 + r31;

crc64_2= b0 + b2 + b3 + b4 + b5 + b6 + b8 + b9 + b10 + b18 + b22 + b24 + b25 + b28 + b34 + r0 + r1 + r3 + r5 + r6 + r8 + r11 + r12 + r13 + r16 + r18 + r19 + r21 + r22 + r29;

crc64_3= b1 + b3 + b4 + b5 + b6 + b7 + b9 + b10 + b11 + b19 + b23 + b25 + b26 + b29 + b35 + r0 + r1 + r2 + r4 + r6 + r7 + r9 + r12 + r13 + r14 + r17 + r19 + r20 + r22 + r23 + r30;

crc64_4= b2 + b4 + b5 + b6 + b7 + b8 + b10 + b11 + b12 + b20 + b24 + b26 + b27 + b30 + b36 + r0 + r1 + r2 + r3 + r5 + r7 + r8 + r10 + r13 + r14 + r15 + r18 + r20 + r21 + r23 + r24 + r31;

crc64_5= b0 + b3 + b5 + b6 + b7 + b8 + b9 + b11 + b12 + b13 + b21 + b25 + b27 + b28 + b31 + b37 + r1 + r2 + r3 + r4 + r6 + r8 + r9 + r11 + r14 + r15 + r16 + r19 + r21 + r22 + r24 + r25;

crc64_6= b0 + b2 + b3 + b9 + b10 + b12 + b13 + b14 + b16 + b20 + b23 + b28 + b29 + b38 + r1 + r2 + r5 + r6 + r7 + r11 + r12 + r14 + r15 + r19 + r22 + r23 + r25 + r26 + r27 + r30;

crc64_7= b1 + b3 + b4 + b10 + b11 + b13 + b14 + b15 + b17 + b21 + b24 + b29 + b30 + b39 + r0 + r2 + r3 + r6 + r7 + r8 + r12 + r13 + r15 + r16 + r20 + r23 + r24 + r26 + r27 + r28 + r31;

crc64_8= b0 + b2 + b4 + b5 + b11 + b12 + b14 + b15 + b16 + b18 + b22 + b25 + b30 + b31 + b40 + r1 + r3 + r4 + r7 + r8 + r9 + r13 + r14 + r16 + r17 + r21 + r24 + r25 + r27 + r28 + r29;

crc64_9= b0 + b2 + b4 + b5 + b7 + b8 + b12 + b13 + b15 + b17 + b19 + b20 + b22 + b31 + b41 + r1 + r2 + r3 + r5 + r6 + r8 + r11 + r15 + r16 + r18 + r19 + r20 + r22 + r25 + r26 + r27 + r28 + r29;

Fig. 19b crc64_10= b0 + b2 + b4 + b5 + b7 + b9 + b13 + b14 + b18 + b21 + b22 + b26 + b42 + r1 + r2 + r7 + r10 + r11 + r12 + r14 + r21 + r23 + r26 + r28 + r29;

crc64_11= b1 + b3 + b5 + b6 + b8 + b10 + b14 + b15 + b19 + b22 + b23 + b27 + b43 + r2 + r3 + r8 + r11 + r12 + r13 + r15 + r22 + r24 + r27 + r29 + r30;

crc64_12= b2 + b4 + b6 + b7 + b9 + b11 + b15 + b16 + b20 + b23 + b24 + b28 + b44 + r3 + r4 + r9 + r12 + r13 + r14 + r16 + r23 + r25 + r28 + r30 + r31;

crc64_13= b0 + b3 + b5 + b7 + b8 + b10 + b12 + b16 + b17 + b21 + b24 + b25 + b29 + b45 + r4 + r5 + r10 + r13 + r14 + r15 + r17 + r24 + r26 + r29 + r31;

crc64_14= b0 + b1 + b4 + b6 + b8 + b9 + b11 + b13 + b17 + b18 + b22 + b25 + b26 + b30 + b46 + r5 + r6 + r11 + r14 + r15 + r16 + r18 + r25 + r27 + r30;

crc64_15= b1 + b2 + b5 + b7 + b9 + b10 + b12 + b14 + b18 + b19 + b23 + b26 + b27 + b31 + b47 + r6 + r7 + r12 + r15 + r16 + r17 + r19 + r26 + r28 + r31;

crc64_16= b1 + b4 + b7 + b10 + b11 + b13 + b15 + b16 + b19 + b22 + b23 + b24 + b26 + b27 + b28 + b48 + r1 + r3 + r4 + r6 + r7 + r8 + r9 + r10 + r11 + r13 + r14 + r18 + r19 + r29 + r30;

crc64_17= b2 + b5 + b8 + b11 + b12 + b14 + b16 + b17 + b20 + b23 + b24 + b25 + b27 + b28 + b29 + b49 + r0 + r2 + r4 + r5 + r7 + r8 + r9 + r10 + r11 + r12 + r14 + r15 + r19 + r20 + r30 + r31;

crc64_18= b0 + b3 + b6 + b9 + b12 + b13 + b15 + b17 + b18 + b21 + b24 + b25 + b26 + b28 + b29 + b30 + b50 + r1 + r3 + r5 + r6 + r8 + r9 + r10 + r11 + r12 + r13 + r15 + r16 + r20 + r21 + r31;

crc64_19= b0 + b1 + b4 + b7 + b10 + b13 + b14 + b16 + b18 + b19 + b22 + b25 + b26 + b27 + b29 + b30 + b31 + b51 + r0 + r2 + r4 + r6 + r7 + r9 + r10 + r11 + r12 + r13 + r14 + r16 + r17 + r21 + r22;

Fig. 19c crc64_20= b0 + b3 + b4 + b5 + b6 + b7 + b11 + b14 + b15 + b16 + b17 + b19 + b22 + b27 + b28 + b30 + b31 + b52 + r4 + r5 + r6 + r7 + r8 + r9 + r12 + r13 + r15 + r16 + r18 + r19 + r20 + r22 + r23 + r27 + r30;

crc64_21= b0 + b2 + b3 + b5 + b12 + b15 + b17 + b18 + b22 + b26 + b28 + b29 + b31 + b53 + r0 + r1 + r3 + r4 + r5 + r7 + r8 + r11 + r13 + r21 + r23 + r24 + r27 + r28 + r30 + r31;

crc64_22= b2 + b7 + b8 + b13 + b18 + b19 + b20 + b22 + b26 + b27 + b29 + b30 + b54 + r2 + r3 + r5 + r8 + r10 + r11 + r12 + r16 + r17 + r19 + r20 + r22 + r24 + r25 + r27 + r28 + r29 + r30 + r31;

crc64_23= b0 + b3 + b8 + b9 + b14 + b19 + b20 + b21 + b23 + b27 + b28 + b30 + b31 + b55 + r0 + r3 + r4 + r6 + r9 + r11 + r12 + r13 + r17 + r18 + r20 + r21 + r23 + r25 + r26 + r28 + r29 + r30 + r31;

crc64_24= b2 + b3 + b6 + b7 + b8 + b9 + b10 + b15 + b16 + b21 + b23 + b24 + b26 + b28 + b29 + b31 + b56 + r3 + r5 + r6 + r7 + r9 + r11 + r12 + r13 + r16 + r17 + r18 + r20 + r21 + r22 + r24 + r26 + r29 + r31;

crc64_25= b1 + b2 + b6 + b9 + b10 + b11 + b17 + b20 + b23 + b24 + b25 + b26 + b27 + b29 + b30 + b57 + r1 + r3 + r7 + r8 + r9 + r11 + r12 + r13 + r16 + r18 + r20 + r21 + r22 + r23 + r25;

crc64_26= b2 + b3 + b7 + b10 + b11 + b12 + b18 + b21 + b24 + b25 + b26 + b27 + b28 + b30 + b31 + b58 + r0 + r2 + r4 + r8 + r9 + r10 + r12 + r13 + r14 + r17 + r19 + r21 + r22 + r23 + r24 + r26;

crc64_27= b0 + b1 + b2 + b6 + b7 + b11 + b12 + b13 + b16 + b19 + b20 + b23 + b25 + b27 + b28 + b29 + b31 + b59 + r0 + r4 + r5 + r6 + r13 + r15 + r16 + r17 + r18 + r19 + r22 + r23 + r24 + r25 + r30;

crc64_28= b0 + b4 + b6 + b12 + b13 + b14 + b16 + b17 + b21 + b22 + b23 + b24 + b28 + b29 + b30 + b60 + r3 + r4 + r5 + r7 + r9 + r10 + r11 + r18 + r23 + r24 + r25 + r26 + r27 + r30 + r31;

Fig. 19d crc64_29= b0 + b1 + b5 + b7 + b13 + b14 + b15 + b17 + b18 + b22 + b23 + b24 + b25 + b29 + b30 + b31 + b61 + r4 + r5 + r6 + r8 + r10 + r11 + r12 + r19 + r24 + r25 + r26 + r27 + r28 + r31;

crc64_30= b3 + b4 + b7 + b14 + b15 + b18 + b19 + b20 + b22 + b24 + b25 + b30 + b31 + b62 + r0 + r1 + r3 + r4 + r5 + r7 + r10 + r12 + r13 + r14 + r16 + r17 + r19 + r25 + r26 + r28 + r29 + r30;

crc64_31= b0 + b1 + b2 + b3 + b5 + b6 + b7 + b15 + b19 + b21 + b22 + b25 + b31 + b63 + r0 + r2 + r3 + r5 + r8 + r9 + r10 + r13 + r15 + r16 + r18 + r19 + r26 + r29 + r31;

Fig. 20a crc72_0= b3 + b6 + b8 + b9 + b10 + b11 + b12 + b14 + b15 + b16 + b24 + b28 + b30 + b31 + b34 + b40 + r0 + r4 + r5 + r6 + r7 + r9 + r11 + r12 + r14 + r17 + r18 + r19 + r22 + r24 + r25 + r27 + r28;

crc72_1= b4 + b7 + b9 + b10 + b11 + b12 + b13 + b15 + b16 + b17 + b25 + b29 + b31 + b32 + b35 + b41 + r0 + r1 + r5 + r6 + r7 + r8 + r10 + r12 + r13 + r15 + r18 + r19 + r20 + r23 + r25 + r26 + r28 + r29;

crc72_2= b5 + b8 + b10 + b11 + b12 + b13 + b14 + b16 + b17 + b18 + b26 + b30 + b32 + b33 + b36 + b42 + r1 + r2 + r6 + r7 + r8 + r9 + r11 + r13 + r14 + r16 + r19 + r20 + r21 + r24 + r26 + r27 + r29 + r30;

crc72_3= b6 + b9 + b11 + b12 + b13 + b14 + b15 + b17 + b18 + b19 + b27 + b31 + b33 + b34 + b37 + b43 + r2 + r3 + r7 + r8 + r9 + r10 + r12 + r14 + r15 + r17 + r20 + r21 + r22 + r25 + r27 + r28 + r30 + r31;

crc72_4= b0 + b7 + b10 + b12 + b13 + b14 + b15 + b16 + b18 + b19 + b20 + b28 + b32 + b34 + b35 + b38 + b44 + r3 + r4 + r8 + r9 + r10 + r11 + r13 + r15 + r16 + r18 + r21 + r22 + r23 + r26 + r28 + r29 + r31;

crc72_5= b0 + b1 + b8 + b11 + b13 + b14 + b15 + b16 + b17 + b19 + b20 + b21 + b29 + b33 + b35 + b36 + b39 + b45 + r4 + r5 + r9 + r10 + r11 + r12 + r14 + r16 + r17 + r19 + r22 + r23 + r24 + r27 + r29 + r30;

crc72_6= b1 + b2 + b3 + b6 + b8 + b10 + b11 + b17 + b18 + b20 + b21 + b22 + b24 + b28 + b31 + b36 + b37 + b46 + r0 + r4 + r7 + r9 + r10 + r13 + r14 + r15 + r19 + r20 + r22 + r23 + r27 + r30 + r31;

crc72_7= b0 + b2 + b3 + b4 + b7 + b9 + b11 + b12 + b18 + b19 + b21 + b22 + b23 + b25 + b29 + b32 + b37 + b38 + b47 + r1 + r5 + r8 + r10 + r11 + r14 + r15 + r16 + r20 + r21 + r23 + r24 + r28 + r31;

crc72_8= b0 + b1 + b3 + b4 + b5 + b8 + b10 + b12 + b13 + b19 + b20 + b22 + b23 + b24 + b26 + b30 + b33 + b38 + b39 + b48 + r2 + r6 + r9 + r11 + r12 + r15 + r16 + r17 + r21 + r22 + r24 + r25 + r29;

Fig. 20b crc72_9= b1 + b2 + b3 + b4 + b5 + b8 + b10 + b12 + b13 + b15 + b16 + b20 + b21 + b23 + b25 + b27 + b28 + b30 + b39 + b49 + r3 + r4 + r5 + r6 + r9 + r10 + r11 + r13 + r14 + r16 + r19 + r23 + r24 + r26 + r27 + r28 + r30;

crc72_10= b2 + b4 + b5 + b8 + b10 + b12 + b13 + b15 + b17 + b21 + b22 + b26 + b29 + b30 + b34 + b50 + r0 + r9 + r10 + r15 + r18 + r19 + r20 + r22 + r29 + r31;

crc72_11= b0 + b3 + b5 + b6 + b9 + b11 + b13 + b14 + b16 + b18 + b22 + b23 + b27 + b30 + b31 + b35 + b51 + r1 + r10 + r11 + r16 + r19 + r20 + r21 + r23 + r30;

crc72_12= b1 + b4 + b6 + b7 + b10 + b12 + b14 + b15 + b17 + b19 + b23 + b24 + b28 + b31 + b32 + b36 + b52 + r0 + r2 + r11 + r12 + r17 + r20 + r21 + r22 + r24 + r31;

crc72_13= b0 + b2 + b5 + b7 + b8 + b11 + b13 + b15 + b16 + b18 + b20 + b24 + b25 + b29 + b32 + b33 + b37 + b53 + r1 + r3 + r12 + r13 + r18 + r21 + r22 + r23 + r25;

crc72_14= b1 + b3 + b6 + b8 + b9 + b12 + b14 + b16 + b17 + b19 + b21 + b25 + b26 + b30 + b33 + b34 + b38 + b54 + r2 + r4 + r13 + r14 + r19 + r22 + r23 + r24 + r26;

crc72_15= b2 + b4 + b7 + b9 + b10 + b13 + b15 + b17 + b18 + b20 + b22 + b26 + b27 + b31 + b34 + b35 + b39 + b55 + r3 + r5 + r14 + r15 + r20 + r23 + r24 + r25 + r27;

crc72_16= b5 + b6 + b9 + b12 + b15 + b18 + b19 + b21 + b23 + b24 + b27 + b30 + b31 + b32 + b34 + b35 + b36 + b56 + r0 + r5 + r7 + r9 + r11 + r12 + r14 + r15 + r16 + r17 + r18 + r19 + r21 + r22 + r26 + r27;

crc72_17= b6 + b7 + b10 + b13 + b16 + b19 + b20 + b22 + b24 + b25 + b28 + b31 + b32 + b33 + b35 + b36 + b37 + b57 + r0 + r1 + r6 + r8 + r10 + r12 + r13 + r15 + r16 + r17 + r18 + r19 + r20 + r22 + r23 + r27 + r28;

Fig. 20c crc72_18= b7 + b8 + b11 + b14 + b17 + b20 + b21 + b23 + b25 + b26 + b29 + b32 + b33 + b34 + b36 + b37 + b38 + b58 + r1 + r2 + r7 + r9 + r11 + r13 + r14 + r16 + r17 + r18 + r19 + r20 + r21 + r23 + r24 + r28 + r29;

crc72_19= b8 + b9 + b12 + b15 + b18 + b21 + b22 + b24 + b26 + b27 + b30 + b33 + b34 + b35 + b37 + b38 + b39 + b59 + r0 + r2 + r3 + r8 + r10 + r12 + r14 + r15 + r17 + r18 + r19 + r20 + r21 + r22 + r24 + r25 + r29 + r30;

crc72_20= b3 + b6 + b8 + b11 + b12 + b13 + b14 + b15 + b19 + b22 + b23 + b24 + b25 + b27 + b30 + b35 + b36 + b38 + b39 + b60 + r0 + r1 + r3 + r5 + r6 + r7 + r12 + r13 + r14 + r15 + r16 + r17 + r20 + r21 + r23 + r24 + r26 + r27 + r28 + r30 + r31;

crc72_21= b0 + b3 + b4 + b6 + b7 + b8 + b10 + b11 + b13 + b20 + b23 + b25 + b26 + b30 + b34 + b36 + b37 + b39 + b61 + r0 + r1 + r2 + r5 + r8 + r9 + r11 + r12 + r13 + r15 + r16 + r19 + r21 + r29 + r31;

crc72_22= b0 + b1 + b3 + b4 + b5 + b6 + b7 + b10 + b15 + b16 + b21 + b26 + b27 + b28 + b30 + b34 + b35 + b37 + b38 + b62 + r0 + r1 + r2 + r3 + r4 + r5 + r7 + r10 + r11 + r13 + r16 + r18 + r19 + r20 + r24 + r25 + r27 + r28 + r30;

crc72_23= b1 + b2 + b4 + b5 + b6 + b7 + b8 + b11 + b16 + b17 + b22 + b27 + b28 + b29 + b31 + b35 + b36 + b38 + b39 + b63 + r1 + r2 + r3 + r4 + r5 + r6 + r8 + r11 + r12 + r14 + r17 + r19 + r20 + r21 + r25 + r26 + r28 + r29 + r31;

crc72_24= b0 + b2 + b5 + b7 + b10 + b11 + b14 + b15 + b16 + b17 + b18 + b23 + b24 + b29 + b31 + b32 + b34 + b36 + b37 + b39 + b64 + r0 + r2 + r3 + r11 + r13 + r14 + r15 + r17 + r19 + r20 + r21 + r24 + r25 + r26 + r28 + r29 + r30;

crc72_25= b1 + b9 + b10 + b14 + b17 + b18 + b19 + b25 + b28 + b31 + b32 + b33 + b34 + b35 + b37 + b38 + b65 + r0 + r1 + r3 + r5 + r6 + r7 + r9 + r11 + r15 + r16 + r17 + r19 + r20 + r21 + r24 + r26 + r28 + r29 + r30 + r31;

Fig. 20d crc72_26= b0 + b2 + b10 + b11 + b15 + b18 + b19 + b20 + b26 + b29 + b32 + b33 + b34 + b35 + b36 + b38 + b39 + b66 + r0 + r1 + r2 + r4 + r6 + r7 + r8 + r10 + r12 + r16 + r17 + r18 + r20 + r21 + r22 + r25 + r27 + r29 + r30 + r31;

crc72_27= b0 + b1 + b6 + b8 + b9 + b10 + b14 + b15 + b19 + b20 + b21 + b24 + b27 + b28 + b31 + b33 + b35 + b36 + b37 + b39 + b67 + r1 + r2 + r3 + r4 + r6 + r8 + r12 + r13 + r14 + r21 + r23 + r24 + r25 + r26 + r27 + r30 + r31;

crc72_28= b0 + b1 + b2 + b3 + b6 + b7 + b8 + b12 + b14 + b20 + b21 + b22 + b24 + b25 + b29 + b30 + b31 + b32 + b36 + b37 + b38 + b68 + r0 + r2 + r3 + r6 + r11 + r12 + r13 + r15 + r17 + r18 + r19 + r26 + r31;

crc72_29= b0 + b1 + b2 + b3 + b4 + b7 + b8 + b9 + b13 + b15 + b21 + b22 + b23 + b25 + b26 + b30 + b31 + b32 + b33 + b37 + b38 + b39 + b69 + r1 + r3 + r4 + r7 + r12 + r13 + r14 + r16 + r18 + r19 + r20 + r27;

crc72_30= b1 + b2 + b4 + b5 + b6 + b11 + b12 + b15 + b22 + b23 + b26 + b27 + b28 + b30 + b32 + b33 + b38 + b39 + b70 + r2 + r6 + r7 + r8 + r9 + r11 + r12 + r13 + r15 + r18 + r20 + r21 + r22 + r24 + r25 + r27;

crc72_31= b2 + b5 + b7 + b8 + b9 + b10 + b11 + b13 + b14 + b15 + b23 + b27 + b29 + b30 + b33 + b39 + b71 + r3 + r4 + r5 + r6 + r8 + r10 + r11 + r13 + r16 + r17 + r18 + r21 + r23 + r24 + r26 + r27;

Fig. 21a crc80_0= b0 + b1 + b3 + b4 + b11 + b14 + b16 + b17 + b18 + b19 + b20 + b22 + b23 + b24 + b32 + b36 + b38 + b39 + b42 + b48 + r1 + r7 + r8 + r12 + r13 + r14 + r15 + r17 + r19 + r20 + r22 + r25 + r26 + r27 + r30;

crc80_1= b1 + b2 + b4 + b5 + b12 + b15 + b17 + b18 + b19 + b20 + b21 + b23 + b24 + b25 + b33 + b37 + b39 + b40 + b43 + b49 + r0 + r2 + r8 + r9 + r13 + r14 + r15 + r16 + r18 + r20 + r21 + r23 + r26 + r27 + r28 + r31;

crc80_2= b0 + b2 + b3 + b5 + b6 + b13 + b16 + b18 + b19 + b20 + b21 + b22 + b24 + b25 + b26 + b34 + b38 + b40 + b41 + b44 + b50 + r0 + r1 + r3 + r9 + r10 + r14 + r15 + r16 + r17 + r19 + r21 + r22 + r24 + r27 + r28 + r29;

crc80_3= b1 + b3 + b4 + b6 + b7 + b14 + b17 + b19 + b20 + b21 + b22 + b23 + b25 + b26 + b27 + b35 + b39 + b41 + b42 + b45 + b51 + r0 + r1 + r2 + r4 + r10 + r11 + r15 + r16 + r17 + r18 + r20 + r22 + r23 + r25 + r28 + r29 + r30;

crc80_4= b2 + b4 + b5 + b7 + b8 + b15 + b18 + b20 + b21 + b22 + b23 + b24 + b26 + b27 + b28 + b36 + b40 + b42 + b43 + b46 + b52 + r0 + r1 + r2 + r3 + r5 + r11 + r12 + r16 + r17 + r18 + r19 + r21 + r23 + r24 + r26 + r29 + r30 + r31;

crc80_5= b0 + b3 + b5 + b6 + b8 + b9 + b16 + b19 + b21 + b22 + b23 + b24 + b25 + b27 + b28 + b29 + b37 + b41 + b43 + b44 + b47 + b53 + r0 + r1 + r2 + r3 + r4 + r6 + r12 + r13 + r17 + r18 + r19 + r20 + r22 + r24 + r25 + r27 + r30 + r31;

crc80_6= b3 + b6 + b7 + b9 + b10 + b11 + b14 + b16 + b18 + b19 + b25 + b26 + b28 + b29 + b30 + b32 + b36 + b39 + b44 + b45 + b54 + r2 + r3 + r4 + r5 + r8 + r12 + r15 + r17 + r18 + r21 + r22 + r23 + r27 + r28 + r30 + r31;

Fig. 21b crc80_7= b0 + b4 + b7 + b8 + b10 + b11 + b12 + b15 + b17 + b19 + b20 + b26 + b27 + b29 + b30 + b31 + b33 + b37 + b40 + b45 + b46 + b55 + r3 + r4 + r5 + r6 + r9 + r13 + r16 + r18 + r19 + r22 + r23 + r24 + r28 + r29 + r31;

crc80_8= b0 + b1 + b5 + b8 + b9 + b11 + b12 + b13 + b16 + b18 + b20 + b21 + b27 + b28 + b30 + b31 + b32 + b34 + b38 + b41 + b46 + b47 + b56 + r0 + r4 + r5 + r6 + r7 + r10 + r14 + r17 + r19 + r20 + r23 + r24 + r25 + r29 + r30;

crc80_9= b0 + b2 + b3 + b4 + b6 + b9 + b10 + b11 + b12 + b13 + b16 + b18 + b20 + b21 + b23 + b24 + b28 + b29 + b31 + b33 + b35 + b36 + b38 + b47 + b57 + r0 + r5 + r6 + r11 + r12 + r13 + r14 + r17 + r18 + r19 + r21 + r22 + r24 + r27 + r31;

crc80_10= b5 + b7 + b10 + b12 + b13 + b16 + b18 + b20 + b21 + b23 + b25 + b29 + b30 + b34 + b37 + b38 + b42 + b58 + r6 + r8 + r17 + r18 + r23 + r26 + r27 + r28 + r30;

crc80_11= b6 + b8 + b11 + b13 + b14 + b17 + b19 + b21 + b22 + b24 + b26 + b30 + b31 + b35 + b38 + b39 + b43 + b59 + r0 + r7 + r9 + r18 + r19 + r24 + r27 + r28 + r29 + r31;

crc80_12= b0 + b7 + b9 + b12 + b14 + b15 + b18 + b20 + b22 + b23 + b25 + b27 + b31 + b32 + b36 + b39 + b40 + b44 + b60 + r1 + r8 + r10 + r19 + r20 + r25 + r28 + r29 + r30;

crc80_13= b1 + b8 + b10 + b13 + b15 + b16 + b19 + b21 + b23 + b24 + b26 + b28 + b32 + b33 + b37 + b40 + b41 + b45 + b61 + r0 + r2 + r9 + r11 + r20 + r21 + r26 + r29 + r30 + r31;

crc80_14= b0 + b2 + b9 + b11 + b14 + b16 + b17 + b20 + b22 + b24 + b25 + b27 + b29 + b33 + b34 + b38 + b41 + b42 + b46 + b62 + r0 + r1 + r3 + r10 + r12 + r21 + r22 + r27 + r30 + r31;

crc80_15= b0 + b1 + b3 + b10 + b12 + b15 + b17 + b18 + b21 + b23 + b25 + b26 + b28 + b30 + b34 + b35 + b39 + b42 + b43 + b47 + b63 + r1 + r2 + r4 + r11 + r13 + r22 + r23 + r28 + r31;

Fig. 21c crc80_16= b2 + b3 + b13 + b14 + b17 + b20 + b23 + b26 + b27 + b29 + b31 + b32 + b35 + b38 + b39 + b40 + b42 + b43 + b44 + b64 + r1 + r2 + r3 + r5 + r7 + r8 + r13 + r15 + r17 + r19 + r20 + r22 + r23 + r24 + r25 + r26 + r27 + r29 + r30;

crc80_17= b3 + b4 + b14 + b15 + b18 + b21 + b24 + b27 + b28 + b30 + b32 + b33 + b36 + b39 + b40 + b41 + b43 + b44 + b45 + b65 + r0 + r2 + r3 + r4 + r6 + r8 + r9 + r14 + r16 + r18 + r20 + r21 + r23 + r24 + r25 + r26 + r27 + r28 + r30 + r31;

crc80_18= b0 + b4 + b5 + b15 + b16 + b19 + b22 + b25 + b28 + b29 + b31 + b33 + b34 + b37 + b40 + b41 + b42 + b44 + b45 + b46 + b66 + r1 + r3 + r4 + r5 + r7 + r9 + r10 + r15 + r17 + r19 + r21 + r22 + r24 + r25 + r26 + r27 + r28 + r29 + r31;

crc80_19= b0 + b1 + b5 + b6 + b16 + b17 + b20 + b23 + b26 + b29 + b30 + b32 + b34 + b35 + b38 + b41 + b42 + b43 + b45 + b46 + b47 + b67 + r2 + r4 + r5 + r6 + r8 + r10 + r11 + r16 + r18 + r20 + r22 + r23 + r25 + r26 + r27 + r28 + r29 + r30;

crc80_20= b0 + b2 + b3 + b4 + b6 + b7 + b11 + b14 + b16 + b19 + b20 + b21 + b22 + b23 + b27 + b30 + b31 + b32 + b33 + b35 + b38 + b43 + b44 + b46 + b47 + b68 + r1 + r3 + r5 + r6 + r8 + r9 + r11 + r13 + r14 + r15 + r20 + r21 + r22 + r23 + r24 + r25 + r28 + r29 + r31;

crc80_21= b5 + b7 + b8 + b11 + b12 + b14 + b15 + b16 + b18 + b19 + b21 + b28 + b31 + b33 + b34 + b38 + b42 + b44 + b45 + b47 + b69 + r1 + r2 + r4 + r6 + r8 + r9 + r10 + r13 + r16 + r17 + r19 + r20 + r21 + r23 + r24 + r27 + r29;

crc80_22= b0 + b1 + b3 + b4 + b6 + b8 + b9 + b11 + b12 + b13 + b14 + b15 + b18 + b23 + b24 + b29 + b34 + b35 + b36 + b38 + b42 + b43 + b45 + b46 + b70 + r0 + r1 + r2 + r3 + r5 + r8 + r9 + r10 + r11 + r12 + r13 + r15 + r18 + r19 + r21 + r24 + r26 + r27 + r28;

crc80_23= b1 + b2 + b4 + b5 + b7 + b9 + b10 + b12 + b13 + b14 + b15 + b16 + b19 + b24 + b25 + b30 + b35 + b36 + b37 + b39 + b43 + b44 + b46 + b47 + b71 + r0 + r1 + r2 + r3 + r4 + r6 + r9 + r10 + r11 + r12 + r13 + r14 + r16 + r19 + r20 + r22 + r25 + r27 + r28 + r29;

Fig. 21d crc80_24= b0 + b1 + b2 + b4 + b5 + b6 + b8 + b10 + b13 + b15 + b18 + b19 + b22 + b23 + b24 + b25 + b26 + b31 + b32 + b37 + b39 + b40 + b42 + b44 + b45 + b47 + b72 + r0 + r2 + r3 + r4 + r5 + r8 + r10 + r11 + r19 + r21 + r22 + r23 + r25 + r27 + r28 + r29;

crc80_25= b0 + b2 + b4 + b5 + b6 + b7 + b9 + b17 + b18 + b22 + b25 + b26 + b27 + b33 + b36 + b39 + b40 + b41 + b42 + b43 + b45 + b46 + b73 + r0 + r3 + r4 + r5 + r6 + r7 + r8 + r9 + r11 + r13 + r14 + r15 + r17 + r19 + r23 + r24 + r25 + r27 + r28 + r29;

crc80_26= b1 + b3 + b5 + b6 + b7 + b8 + b10 + b18 + b19 + b23 + b26 + b27 + b28 + b34 + b37 + b40 + b41 + b42 + b43 + b44 + b46 + b47 + b74 + r0 + r1 + r4 + r5 + r6 + r7 + r8 + r9 + r10 + r12 + r14 + r15 + r16 + r18 + r20 + r24 + r25 + r26 + r28 + r29 + r30;

crc80_27= b0 + b1 + b2 + b3 + b6 + b7 + b8 + b9 + b14 + b16 + b17 + b18 + b22 + b23 + b27 + b28 + b29 + b32 + b35 + b36 + b39 + b41 + b43 + b44 + b45 + b47 + b75 + r0 + r2 + r5 + r6 + r9 + r10 + r11 + r12 + r14 + r16 + r20 + r21 + r22 + r29 + r31;

crc80_28= b2 + b7 + b8 + b9 + b10 + b11 + b14 + b15 + b16 + b20 + b22 + b28 + b29 + b30 + b32 + b33 + b37 + b38 + b39 + b40 + b44 + b45 + b46 + b76 + r3 + r6 + r8 + r10 + r11 + r14 + r19 + r20 + r21 + r23 + r25 + r26 + r27;

crc80_29= b3 + b8 + b9 + b10 + b11 + b12 + b15 + b16 + b17 + b21 + b23 + b29 + b30 + b31 + b33 + b34 + b38 + b39 + b40 + b41 + b45 + b46 + b47 + b77 + r0 + r4 + r7 + r9 + r11 + r12 + r15 + r20 + r21 + r22 + r24 + r26 + r27 + r28;

crc80_30= b0 + b1 + b3 + b9 + b10 + b12 + b13 + b14 + b19 + b20 + b23 + b30 + b31 + b34 + b35 + b36 + b38 + b40 + b41 + b46 + b47 + b78 + r0 + r5 + r7 + r10 + r14 + r15 + r16 + r17 + r19 + r20 + r21 + r23 + r26 + r28 + r29 + r30;

crc80_31= b0 + b2 + b3 + b10 + b13 + b15 + b16 + b17 + b18 + b19 + b21 + b22 + b23 + b31 + b35 + b37 + b38 + b41 + b47 + b79 + r0 + r6 + r7 + r11 + r12 + r13 + r14 + r16 + r18 + r19 + r21 + r24 + r25 + r26 + r29 + r31;

Fig. 22a crc88_0= b1 + b2 + b3 + b6 + b8 + b9 + b11 + b12 + b19 + b22 + b24 + b25 + b26 + b27 + b28 + b30 + b31 + b32 + b40 + b44 + b46 + b47 + b50 + b56 + r1 + r3 + r4 + r5 + r6 + r7 + r9 + r15 + r16 + r20 + r21 + r22 + r23 + r25 + r27 + r28 + r30;

crc88_1= b2 + b3 + b4 + b7 + b9 + b10 + b12 + b13 + b20 + b23 + b25 + b26 + b27 + b28 + b29 + b31 + b32 + b33 + b41 + b45 + b47 + b48 + b51 + b57 + r2 + r4 + r5 + r6 + r7 + r8 + r10 + r16 + r17 + r21 + r22 + r23 + r24 + r26 + r28 + r29 + r31;

crc88_2= b0 + b3 + b4 + b5 + b8 + b10 + b11 + b13 + b14 + b21 + b24 + b26 + b27 + b28 + b29 + b30 + b32 + b33 + b34 + b42 + b46 + b48 + b49 + b52 + b58 + r3 + r5 + r6 + r7 + r8 + r9 + r11 + r17 + r18 + r22 + r23 + r24 + r25 + r27 + r29 + r30;

crc88_3= b1 + b4 + b5 + b6 + b9 + b11 + b12 + b14 + b15 + b22 + b25 + b27 + b28 + b29 + b30 + b31 + b33 + b34 + b35 + b43 + b47 + b49 + b50 + b53 + b59 + r4 + r6 + r7 + r8 + r9 + r10 + r12 + r18 + r19 + r23 + r24 + r25 + r26 + r28 + r30 + r31;

crc88_4= b0 + b2 + b5 + b6 + b7 + b10 + b12 + b13 + b15 + b16 + b23 + b26 + b28 + b29 + b30 + b31 + b32 + b34 + b35 + b36 + b44 + b48 + b50 + b51 + b54 + b60 + r5 + r7 + r8 + r9 + r10 + r11 + r13 + r19 + r20 + r24 + r25 + r26 + r27 + r29 + r31;

crc88_5= b0 + b1 + b3 + b6 + b7 + b8 + b11 + b13 + b14 + b16 + b17 + b24 + b27 + b29 + b30 + b31 + b32 + b33 + b35 + b36 + b37 + b45 + b49 + b51 + b52 + b55 + b61 + r6 + r8 + r9 + r10 + r11 + r12 + r14 + r20 + r21 + r25 + r26 + r27 + r28 + r30;

crc88_6= b3 + b4 + b6 + b7 + b11 + b14 + b15 + b17 + b18 + b19 + b22 + b24 + b26 + b27 + b33 + b34 + b36 + b37 + b38 + b40 + b44 + b47 + b52 + b53 + b62 + r0 + r1 + r3 + r4 + r5 + r6 + r10 + r11 + r12 + r13 + r16 + r20 + r23 + r25 + r26 + r29 + r30 + r31;

crc88_7= b0 + b4 + b5 + b7 + b8 + b12 + b15 + b16 + b18 + b19 + b20 + b23 + b25 + b27 + b28 + b34 + b35 + b37 + b38 + b39 + b41 + b45 + b48 + b53 + b54 + b63 + r0 + r1 + r2 + r4 + r5 + r6 + r7 + r11 + r12 + r13 + r14 + r17 + r21 + r24 + r26 + r27 + r30 + r31;

Fig. 22b crc88_8= b0 + b1 + b5 + b6 + b8 + b9 + b13 + b16 + b17 + b19 + b20 + b21 + b24 + b26 + b28 + b29 + b35 + b36 + b38 + b39 + b40 + b42 + b46 + b49 + b54 + b55 + b64 + r0 + r1 + r2 + r3 + r5 + r6 + r7 + r8 + r12 + r13 + r14 + r15 + r18 + r22 + r25 + r27 + r28 + r31;

crc88_9= b0 + b3 + b7 + b8 + b10 + b11 + b12 + b14 + b17 + b18 + b19 + b20 + b21 + b24 + b26 + b28 + b29 + b31 + b32 + b36 + b37 + b39 + b41 + b43 + b44 + b46 + b55 + b65 + r0 + r2 + r5 + r8 + r13 + r14 + r19 + r20 + r21 + r22 + r25 + r26 + r27 + r29 + r30;

crc88_10= b2 + b3 + b4 + b6 + b13 + b15 + b18 + b20 + b21 + b24 + b26 + b28 + b29 + b31 + b33 + b37 + b38 + b42 + b45 + b46 + b50 + b66 + r0 + r4 + r5 + r7 + r14 + r16 + r25 + r26 + r31;

crc88_11= b0 + b3 + b4 + b5 + b7 + b14 + b16 + b19 + b21 + b22 + b25 + b27 + b29 + b30 + b32 + b34 + b38 + b39 + b43 + b46 + b47 + b51 + b67 + r0 + r1 + r5 + r6 + r8 + r15 + r17 + r26 + r27;

crc88_12= b1 + b4 + b5 + b6 + b8 + b15 + b17 + b20 + b22 + b23 + b26 + b28 + b30 + b31 + b33 + b35 + b39 + b40 + b44 + b47 + b48 + b52 + b68 + r0 + r1 + r2 + r6 + r7 + r9 + r16 + r18 + r27 + r28;

crc88_13= b2 + b5 + b6 + b7 + b9 + b16 + b18 + b21 + b23 + b24 + b27 + b29 + b31 + b32 + b34 + b36 + b40 + b41 + b45 + b48 + b49 + b53 + b69 + r1 + r2 + r3 + r7 + r8 + r10 + r17 + r19 + r28 + r29;

crc88_14= b3 + b6 + b7 + b8 + b10 + b17 + b19 + b22 + b24 + b25 + b28 + b30 + b32 + b33 + b35 + b37 + b41 + b42 + b46 + b49 + b50 + b54 + b70 + r0 + r2 + r3 + r4 + r8 + r9 + r11 + r18 + r20 + r29 + r30;

crc88_15= b4 + b7 + b8 + b9 + b11 + b18 + b20 + b23 + b25 + b26 + b29 + b31 + b33 + b34 + b36 + b38 + b42 + b43 + b47 + b50 + b51 + b55 + b71 + r0 + r1 + r3 + r4 + r5 + r9 + r10 + r12 + r19 + r21 + r30 + r31;

crc88_16= b0 + b1 + b2 + b3 + b5 + b6 + b10 + b11 + b21 + b22 + b25 + b28 + b31 + b34 + b35 + b37 + b39 + b40 + b43 + b46 + b47 + b48 + b50 + b51 + b52 + b72 + r2 + r3 + r7 + r9 + r10 + r11 + r13 + r15 + r16 + r21 + r23 + r25 + r27 + r28 + r30 + r31;

Fig. 22c crc88_17= b0 + b1 + b2 + b3 + b4 + b6 + b7 + b11 + b12 + b22 + b23 + b26 + b29 + b32 + b35 + b36 + b38 + b40 + b41 + b44 + b47 + b48 + b49 + b51 + b52 + b53 + b73 + r0 + r3 + r4 + r8 + r10 + r11 + r12 + r14 + r16 + r17 + r22 + r24 + r26 + r28 + r29 + r31;

crc88_18= b0 + b1 + b2 + b3 + b4 + b5 + b7 + b8 + b12 + b13 + b23 + b24 + b27 + b30 + b33 + b36 + b37 + b39 + b41 + b42 + b45 + b48 + b49 + b50 + b52 + b53 + b54 + b74 + r0 + r1 + r4 + r5 + r9 + r11 + r12 + r13 + r15 + r17 + r18 + r23 + r25 + r27 + r29 + r30;

crc88_19= b1 + b2 + b3 + b4 + b5 + b6 + b8 + b9 + b13 + b14 + b24 + b25 + b28 + b31 + b34 + b37 + b38 + b40 + b42 + b43 + b46 + b49 + b50 + b51 + b53 + b54 + b55 + b75 + r0 + r1 + r2 + r5 + r6 + r10 + r12 + r13 + r14 + r16 + r18 + r19 + r24 + r26 + r28 + r30 + r31;

crc88_20= b0 + b1 + b4 + b5 + b7 + b8 + b10 + b11 + b12 + b14 + b15 + b19 + b22 + b24 + b27 + b28 + b29 + b30 + b31 + b35 + b38 + b39 + b40 + b41 + b43 + b46 + b51 + b52 + b54 + b55 + b76 + r2 + r4 + r5 + r9 + r11 + r13 + r14 + r16 + r17 + r19 + r21 + r22 + r23 + r28 + r29 + r30 + r31;

crc88_21= b0 + b3 + b5 + b13 + b15 + b16 + b19 + b20 + b22 + b23 + b24 + b26 + b27 + b29 + b36 + b39 + b41 + b42 + b46 + b50 + b52 + b53 + b55 + b77 + r1 + r4 + r7 + r9 + r10 + r12 + r14 + r16 + r17 + r18 + r21 + r24 + r25 + r27 + r28 + r29 + r31;

crc88_22= b0 + b2 + b3 + b4 + b8 + b9 + b11 + b12 + b14 + b16 + b17 + b19 + b20 + b21 + b22 + b23 + b26 + b31 + b32 + b37 + b42 + b43 + b44 + b46 + b50 + b51 + b53 + b54 + b78 + r1 + r2 + r3 + r4 + r6 + r7 + r8 + r9 + r10 + r11 + r13 + r16 + r17 + r18 + r19 + r20 + r21 + r23 + r26 + r27 + r29;

crc88_23= b1 + b3 + b4 + b5 + b9 + b10 + b12 + b13 + b15 + b17 + b18 + b20 + b21 + b22 + b23 + b24 + b27 + b32 + b33 + b38 + b43 + b44 + b45 + b47 + b51 + b52 + b54 + b55 + b79 + r0 + r2 + r3 + r4 + r5 + r7 + r8 + r9 + r10 + r11 + r12 + r14 + r17 + r18 + r19 + r20 + r21 + r22 + r24 + r27 + r28 + r30;

Fig. 22d crc88_24= b1 + b3 + b4 + b5 + b8 + b9 + b10 + b12 + b13 + b14 + b16 + b18 + b21 + b23 + b26 + b27 + b30 + b31 + b32 + b33 + b34 + b39 + b40 + b45 + b47 + b48 + b50 + b52 + b53 + b55 + b80 + r0 + r7 + r8 + r10 + r11 + r12 + r13 + r16 + r18 + r19 + r27 + r29 + r30 + r31;

crc88_25= b0 + b1 + b3 + b4 + b5 + b8 + b10 + b12 + b13 + b14 + b15 + b17 + b25 + b26 + b30 + b33 + b34 + b35 + b41 + b44 + b47 + b48 + b49 + b50 + b51 + b53 + b54 + b81 + r3 + r4 + r5 + r6 + r7 + r8 + r11 + r12 + r13 + r14 + r15 + r16 + r17 + r19 + r21 + r22 + r23 + r25 + r27 + r31;

crc88_26= b0 + b1 + b2 + b4 + b5 + b6 + b9 + b11 + b13 + b14 + b15 + b16 + b18 + b26 + b27 + b31 + b34 + b35 + b36 + b42 + b45 + b48 + b49 + b50 + b51 + b52 + b54 + b55 + b82 + r4 + r5 + r6 + r7 + r8 + r9 + r12 + r13 + r14 + r15 + r16 + r17 + r18 + r20 + r22 + r23 + r24 + r26 + r28;

crc88_27= b5 + b7 + b8 + b9 + b10 + b11 + b14 + b15 + b16 + b17 + b22 + b24 + b25 + b26 + b30 + b31 + b35 + b36 + b37 + b40 + b43 + b44 + b47 + b49 + b51 + b52 + b53 + b55 + b83 + r1 + r3 + r4 + r8 + r10 + r13 + r14 + r17 + r18 + r19 + r20 + r22 + r24 + r28 + r29 + r30;

crc88_28= b1 + b2 + b3 + b10 + b15 + b16 + b17 + b18 + b19 + b22 + b23 + b24 + b28 + b30 + b36 + b37 + b38 + b40 + b41 + b45 + b46 + b47 + b48 + b52 + b53 + b54 + b84 + r1 + r2 + r3 + r6 + r7 + r11 + r14 + r16 + r18 + r19 + r22 + r27 + r28 + r29 + r31;

crc88_29= b0 + b2 + b3 + b4 + b11 + b16 + b17 + b18 + b19 + b20 + b23 + b24 + b25 + b29 + b31 + b37 + b38 + b39 + b41 + b42 + b46 + b47 + b48 + b49 + b53 + b54 + b55 + b85 + r2 + r3 + r4 + r7 + r8 + r12 + r15 + r17 + r19 + r20 + r23 + r28 + r29 + r30;

crc88_30= b2 + b4 + b5 + b6 + b8 + b9 + b11 + b17 + b18 + b20 + b21 + b22 + b27 + b28 + b31 + b38 + b39 + b42 + b43 + b44 + b46 + b48 + b49 + b54 + b55 + b86 + r0 + r1 + r6 + r7 + r8 + r13 + r15 + r18 + r22 + r23 + r24 + r25 + r27 + r28 + r29 + r31;

Fig. 22e crc88_31= b0 + b1 + b2 + b5 + b7 + b8 + b10 + b11 + b18 + b21 + b23 +
b24 + b25 + b26 + b27 + b29 + b30 + b31 + b39 + b43 + b45 + b46 +
b49 + b55 + b87 + r0 + r2 + r3 + r4 + r5 + r6 + r8 + r14 + r15 + r19 +
r20 + r21 + r22 + r24 + r26 + r27 + r29;

Fig. 23a crc96_0= b1 + b3 + b4 + b6 + b9 + b10 + b11 + b14 + b16 + b17 + b19 + b20 + b27 + b30 + b32 + b33 + b34 + b35 + b36 + b38 + b39 + b40 + b48 + b52 + b54 + b55 + b58 + b64 + r0 + r1 + r2 + r9 + r11 + r12 + r13 + r14 + r15 + r17 + r23 + r24 + r28 + r29 + r30 + r31;

crc96_1= b0 + b2 + b4 + b5 + b7 + b10 + b11 + b12 + b15 + b17 + b18 + b20 + b21 + b28 + b31 + b33 + b34 + b35 + b36 + b37 + b39 + b40 + b41 + b49 + b53 + b55 + b56 + b59 + b65 + r0 + r1 + r2 + r3 + r10 + r12 + r13 + r14 + r15 + r16 + r18 + r24 + r25 + r29 + r30 + r31;

crc96_2= b0 + b1 + b3 + b5 + b6 + b8 + b11 + b12 + b13 + b16 + b18 + b19 + b21 + b22 + b29 + b32 + b34 + b35 + b36 + b37 + b38 + b40 + b41 + b42 + b50 + b54 + b56 + b57 + b60 + b66 + r0 + r1 + r2 + r3 + r4 + r11 + r13 + r14 + r15 + r16 + r17 + r19 + r25 + r26 + r30 + r31;

crc96_3= b0 + b1 + b2 + b4 + b6 + b7 + b9 + b12 + b13 + b14 + b17 + b19 + b20 + b22 + b23 + b30 + b33 + b35 + b36 + b37 + b38 + b39 + b41 + b42 + b43 + b51 + b55 + b57 + b58 + b61 + b67 + r0 + r1 + r2 + r3 + r4 + r5 + r12 + r14 + r15 + r16 + r17 + r18 + r20 + r26 + r27 + r31;

crc96_4= b0 + b1 + b2 + b3 + b5 + b7 + b8 + b10 + b13 + b14 + b15 + b18 + b20 + b21 + b23 + b24 + b31 + b34 + b36 + b37 + b38 + b39 + b40 + b42 + b43 + b44 + b52 + b56 + b58 + b59 + b62 + b68 + r1 + r2 + r3 + r4 + r5 + r6 + r13 + r15 + r16 + r17 + r18 + r19 + r21 + r27 + r28;

crc96_5= b1 + b2 + b3 + b4 + b6 + b8 + b9 + b11 + b14 + b15 + b16 + b19 + b21 + b22 + b24 + b25 + b32 + b35 + b37 + b38 + b39 + b40 + b41 + b43 + b44 + b45 + b53 + b57 + b59 + b60 + b63 + b69 + r0 + r2 + r3 + r4 + r5 + r6 + r7 + r14 + r16 + r17 + r18 + r19 + r20 + r22 + r28 + r29;

crc96_6= b1 + b2 + b5 + b6 + b7 + b11 + b12 + b14 + b15 + b19 + b22 + b23 + b25 + b26 + b27 + b30 + b32 + b34 + b35 + b41 + b42 + b44 + b45 + b46 + b48 + b52 + b55 + b60 + b61 + b70 + r0 + r2 + r3 + r4 + r5 + r6 + r7 + r8 + r9 + r11 + r12 + r13 + r14 + r18 + r19 + r20 + r21 + r24 + r28 + r31;

Fig. 23b crc96_7= b0 + b2 + b3 + b6 + b7 + b8 + b12 + b13 + b15 + b16 + b20 + b23 + b24 + b26 + b27 + b28 + b31 + b33 + b35 + b36 + b42 + b43 + b45 + b46 + b47 + b49 + b53 + b56 + b61 + b62 + b71 + r1 + r3 + r4 + r5 + r6 + r7 + r8 + r9 + r10 + r12 + r13 + r14 + r15 + r19 + r20 + r21 + r22 + r25 + r29;

crc96_8= b1 + b3 + b4 + b7 + b8 + b9 + b13 + b14 + b16 + b17 + b21 + b24 + b25 + b27 + b28 + b29 + b32 + b34 + b36 + b37 + b43 + b44 + b46 + b47 + b48 + b50 + b54 + b57 + b62 + b63 + b72 + r2 + r4 + r5 + r6 + r7 + r8 + r9 + r10 + r11 + r13 + r14 + r15 + r16 + r20 + r21 + r22 + r23 + r26 + r30;

crc96_9= b1 + b2 + b3 + b5 + b6 + b8 + b11 + b15 + b16 + b18 + b19 + b20 + b22 + b25 + b26 + b27 + b28 + b29 + b32 + b34 + b36 + b37 + b39 + b40 + b44 + b45 + b47 + b49 + b51 + b52 + b54 + b63 + b73 + r1 + r2 + r3 + r5 + r6 + r7 + r8 + r10 + r13 + r16 + r21 + r22 + r27 + r28 + r29 + r30;

crc96_10= b1 + b2 + b7 + b10 + b11 + b12 + b14 + b21 + b23 + b26 + b28 + b29 + b32 + b34 + b36 + b37 + b39 + b41 + b45 + b46 + b50 + b53 + b54 + b58 + b74 + r0 + r1 + r3 + r4 + r6 + r7 + r8 + r12 + r13 + r15 + r22 + r24;

crc96_11= b2 + b3 + b8 + b11 + b12 + b13 + b15 + b22 + b24 + b27 + b29 + b30 + b33 + b35 + b37 + b38 + b40 + b42 + b46 + b47 + b51 + b54 + b55 + b59 + b75 + r0 + r1 + r2 + r4 + r5 + r7 + r8 + r9 + r13 + r14 + r16 + r23 + r25;

crc96_12= b3 + b4 + b9 + b12 + b13 + b14 + b16 + b23 + b25 + b28 + b30 + b31 + b34 + b36 + b38 + b39 + b41 + b43 + b47 + b48 + b52 + b55 + b56 + b60 + b76 + r1 + r2 + r3 + r5 + r6 + r8 + r9 + r10 + r14 + r15 + r17 + r24 + r26;

crc96_13= b4 + b5 + b10 + b13 + b14 + b15 + b17 + b24 + b26 + b29 + b31 + b32 + b35 + b37 + b39 + b40 + b42 + b44 + b48 + b49 + b53 + b56 + b57 + b61 + b77 + r2 + r3 + r4 + r6 + r7 + r9 + r10 + r11 + r15 + r16 + r18 + r25 + r27;

Fig. 23c crc96_14= b5 + b6 + b11 + b14 + b15 + b16 + b18 + b25 + b27 + b30 + b32 + b33 + b36 + b38 + b40 + b41 + b43 + b45 + b49 + b50 + b54 + b57 + b58 + b62 + b78 + r0 + r3 + r4 + r5 + r7 + r8 + r10 + r11 + r12 + r16 + r17 + r19 + r26 + r28;

crc96_15= b6 + b7 + b12 + b15 + b16 + b17 + b19 + b26 + b28 + b31 + b33 + b34 + b37 + b39 + b41 + b42 + b44 + b46 + b50 + b51 + b55 + b58 + b59 + b63 + b79 + r1 + r4 + r5 + r6 + r8 + r9 + r11 + r12 + r13 + r17 + r18 + r20 + r27 + r29;

crc96_16= b1 + b3 + b4 + b6 + b7 + b8 + b9 + b10 + b11 + b13 + b14 + b18 + b19 + b29 + b30 + b33 + b36 + b39 + b42 + b43 + b45 + b47 + b48 + b51 + b54 + b55 + b56 + b58 + b59 + b60 + b80 + r0 + r1 + r5 + r6 + r7 + r10 + r11 + r15 + r17 + r18 + r19 + r21 + r23 + r24 + r29 + r31;

crc96_17= b0 + b2 + b4 + b5 + b7 + b8 + b9 + b10 + b11 + b12 + b14 + b15 + b19 + b20 + b30 + b31 + b34 + b37 + b40 + b43 + b44 + b46 + b48 + b49 + b52 + b55 + b56 + b57 + b59 + b60 + b61 + b81 + r1 + r2 + r6 + r7 + r8 + r11 + r12 + r16 + r18 + r19 + r20 + r22 + r24 + r25 + r30;

crc96_18= b1 + b3 + b5 + b6 + b8 + b9 + b10 + b11 + b12 + b13 + b15 + b16 + b20 + b21 + b31 + b32 + b35 + b38 + b41 + b44 + b45 + b47 + b49 + b50 + b53 + b56 + b57 + b58 + b60 + b61 + b62 + b82 + r0 + r2 + r3 + r7 + r8 + r9 + r12 + r13 + r17 + r19 + r20 + r21 + r23 + r25 + r26 + r31;

crc96_19= b0 + b2 + b4 + b6 + b7 + b9 + b10 + b11 + b12 + b13 + b14 + b16 + b17 + b21 + b22 + b32 + b33 + b36 + b39 + b42 + b45 + b46 + b48 + b50 + b51 + b54 + b57 + b58 + b59 + b61 + b62 + b63 + b83 + r1 + r3 + r4 + r8 + r9 + r10 + r13 + r14 + r18 + r20 + r21 + r22 + r24 + r26 + r27;

crc96_20= b4 + b5 + b6 + b7 + b8 + b9 + b12 + b13 + b15 + b16 + b18 + b19 + b20 + b22 + b23 + b27 + b30 + b32 + b35 + b36 + b37 + b38 + b39 + b43 + b46 + b47 + b48 + b49 + b51 + b54 + b59 + b60 + b62 + b63 + b84 + r1 + r4 + r5 + r10 + r12 + r13 + r17 + r19 + r21 + r22 + r24 + r25 + r27 + r29 + r30 + r31;

Fig. 23d crc96_21= b0 + b1 + b3 + b4 + b5 + b7 + b8 + b11 + b13 + b21 + b23 + b24 + b27 + b28 + b30 + b31 + b32 + b34 + b35 + b37 + b44 + b47 + b49 + b50 + b54 + b58 + b60 + b61 + b63 + b85 + r0 + r1 + r5 + r6 + r9 + r12 + r15 + r17 + r18 + r20 + r22 + r24 + r25 + r26 + r29;

crc96_22= b2 + b3 + b5 + b8 + b10 + b11 + b12 + b16 + b17 + b19 + b20 + b22 + b24 + b25 + b27 + b28 + b29 + b30 + b31 + b34 + b39 + b40 + b45 + b50 + b51 + b52 + b54 + b58 + b59 + b61 + b62 + b86 + r6 + r7 + r9 + r10 + r11 + r12 + r14 + r15 + r16 + r17 + r18 + r19 + r21 + r24 + r25 + r26 + r27 + r28 + r29 + r31;

crc96_23= b0 + b3 + b4 + b6 + b9 + b11 + b12 + b13 + b17 + b18 + b20 + b21 + b23 + b25 + b26 + b28 + b29 + b30 + b31 + b32 + b35 + b40 + b41 + b46 + b51 + b52 + b53 + b55 + b59 + b60 + b62 + b63 + b87 + r0 + r7 + r8 + r10 + r11 + r12 + r13 + r15 + r16 + r17 + r18 + r19 + r20 + r22 + r25 + r26 + r27 + r28 + r29 + r30;

crc96_24= b3 + b5 + b6 + b7 + b9 + b11 + b12 + b13 + b16 + b17 + b18 + b20 + b21 + b22 + b24 + b26 + b29 + b31 + b34 + b35 + b38 + b39 + b40 + b41 + b42 + b47 + b48 + b53 + b55 + b56 + b58 + b60 + b61 + b63 + b88 + r0 + r2 + r8 + r15 + r16 + r18 + r19 + r20 + r21 + r24 + r26 + r27;

crc96_25= b1 + b3 + b7 + b8 + b9 + b11 + b12 + b13 + b16 + b18 + b20 + b21 + b22 + b23 + b25 + b33 + b34 + b38 + b41 + b42 + b43 + b49 + b52 + b55 + b56 + b57 + b58 + b59 + b61 + b62 + b89 + r0 + r2 + r3 + r11 + r12 + r13 + r14 + r15 + r16 + r19 + r20 + r21 + r22 + r23 + r24 + r25 + r27 + r29 + r30 + r31;

crc96_26= b0 + b2 + b4 + b8 + b9 + b10 + b12 + b13 + b14 + b17 + b19 + b21 + b22 + b23 + b24 + b26 + b34 + b35 + b39 + b42 + b43 + b44 + b50 + b53 + b56 + b57 + b58 + b59 + b60 + b62 + b63 + b90 + r1 + r3 + r4 + r12 + r13 + r14 + r15 + r16 + r17 + r20 + r21 + r22 + r23 + r24 + r25 + r26 + r28 + r30 + r31;

crc96_27= b0 + b4 + b5 + b6 + b13 + b15 + b16 + b17 + b18 + b19 + b22 + b23 + b24 + b25 + b30 + b32 + b33 + b34 + b38 + b39 + b43 + b44 + b45 + b48 + b51 + b52 + b55 + b57 + b59 + b60 + b61 + b63 + b91 + r0 + r1 + r4 + r5 + r9 + r11 + r12 + r16 + r18 + r21 + r22 + r25 + r26 + r27 + r28 + r30;

Fig. 23e crc96_28= b3 + b4 + b5 + b7 + b9 + b10 + b11 + b18 + b23 + b24 + b25 + b26 + b27 + b30 + b31 + b32 + b36 + b38 + b44 + b45 + b46 + b48 + b49 + b53 + b54 + b55 + b56 + b60 + b61 + b62 + b92 + r0 + r5 + r6 + r9 + r10 + r11 + r14 + r15 + r19 + r22 + r24 + r26 + r27 + r30;

crc96_29= b4 + b5 + b6 + b8 + b10 + b11 + b12 + b19 + b24 + b25 + b26 + b27 + b28 + b31 + b32 + b33 + b37 + b39 + b45 + b46 + b47 + b49 + b50 + b54 + b55 + b56 + b57 + b61 + b62 + b63 + b93 + r1 + r6 + r7 + r10 + r11 + r12 + r15 + r16 + r20 + r23 + r25 + r27 + r28 + r31;

crc96_30= b0 + b1 + b3 + b4 + b5 + b7 + b10 + b12 + b13 + b14 + b16 + b17 + b19 + b25 + b26 + b28 + b29 + b30 + b35 + b36 + b39 + b46 + b47 + b50 + b51 + b52 + b54 + b56 + b57 + b62 + b63 + b94 + r1 + r7 + r8 + r9 + r14 + r15 + r16 + r21 + r23 + r26 + r30 + r31;

crc96_31= b0 + b2 + b3 + b5 + b8 + b9 + b10 + b13 + b15 + b16 + b18 + b19 + b26 + b29 + b31 + b32 + b33 + b34 + b35 + b37 + b38 + b39 + b47 + b51 + b53 + b54 + b57 + b63 + b95 + r0 + r1 + r8 + r10 + r11 + r12 + r13 + r14 + r16 + r22 + r23 + r27 + r28 + r29 + r30;

Fig. 24a crc104_0= b0 + b4 + b5 + b6 + b7 + b9 + b11 + b12 + b14 + b17 + b18 + b19 + b22 + b24 + b25 + b27 + b28 + b35 + b38 + b40 + b41 + b42 + b43 + b44 + b46 + b47 + b48 + b56 + b60 + b62 + b63 + b66 + b72 + r0 + r1 + r3 + r5 + r6 + r7 + r8 + r9 + r10 + r17 + r19 + r20 + r21 + r22 + r23 + r25 + r31;

crc104_1= b0 + b1 + b5 + b6 + b7 + b8 + b10 + b12 + b13 + b15 + b18 + b19 + b20 + b23 + b25 + b26 + b28 + b29 + b36 + b39 + b41 + b42 + b43 + b44 + b45 + b47 + b48 + b49 + b57 + b61 + b63 + b64 + b67 + b73 + r1 + r2 + r4 + r6 + r7 + r8 + r9 + r10 + r11 + r18 + r20 + r21 + r22 + r23 + r24 + r26;

crc104_2= b1 + b2 + b6 + b7 + b8 + b9 + b11 + b13 + b14 + b16 + b19 + b20 + b21 + b24 + b26 + b27 + b29 + b30 + b37 + b40 + b42 + b43 + b44 + b45 + b46 + b48 + b49 + b50 + b58 + b62 + b64 + b65 + b68 + b74 + r0 + r2 + r3 + r5 + r7 + r8 + r9 + r10 + r11 + r12 + r19 + r21 + r22 + r23 + r24 + r25 + r27;

crc104_3= b2 + b3 + b7 + b8 + b9 + b10 + b12 + b14 + b15 + b17 + b20 + b21 + b22 + b25 + b27 + b28 + b30 + b31 + b38 + b41 + b43 + b44 + b45 + b46 + b47 + b49 + b50 + b51 + b59 + b63 + b65 + b66 + b69 + b75 + r1 + r3 + r4 + r6 + r8 + r9 + r10 + r11 + r12 + r13 + r20 + r22 + r23 + r24 + r25 + r26 + r28;

crc104_4= b3 + b4 + b8 + b9 + b10 + b11 + b13 + b15 + b16 + b18 + b21 + b22 + b23 + b26 + b28 + b29 + b31 + b32 + b39 + b42 + b44 + b45 + b46 + b47 + b48 + b50 + b51 + b52 + b60 + b64 + b66 + b67 + b70 + b76 + r2 + r4 + r5 + r7 + r9 + r10 + r11 + r12 + r13 + r14 + r21 + r23 + r24 + r25 + r26 + r27 + r29;

crc104_5= b4 + b5 + b9 + b10 + b11 + b12 + b14 + b16 + b17 + b19 + b22 + b23 + b24 + b27 + b29 + b30 + b32 + b33 + b40 + b43 + b45 + b46 + b47 + b48 + b49 + b51 + b52 + b53 + b61 + b65 + b67 + b68 + b71 + b77 + r3 + r5 + r6 + r8 + r10 + r11 + r12 + r13 + r14 + r15 + r22 + r24 + r25 + r26 + r27 + r28 + r30;

crc104_6= b0 + b4 + b7 + b9 + b10 + b13 + b14 + b15 + b19 + b20 + b22 + b23 + b27 + b30 + b31 + b33 + b34 + b35 + b38 + b40 + b42 + b43 + b49 + b50 + b52 + b53 + b54 + b56 + b60 + b63 + b68 + b69 + b78 + r1 + r3 + r4 + r5 + r8 + r10 + r11 + r12 + r13 + r14 + r15 + r16 + r17 + r19 + r20 + r21 + r22 + r26 + r27 + r28 + r29;

Fig. 24b crc104_7= b1 + b5 + b8 + b10 + b11 + b14 + b15 + b16 + b20 + b21 + b23 + b24 + b28 + b31 + b32 + b34 + b35 + b36 + b39 + b41 + b43 + b44 + b50 + b51 + b53 + b54 + b55 + b57 + b61 + b64 + b69 + b70 + b79 + r0 + r2 + r4 + r5 + r6 + r9 + r11 + r12 + r13 + r14 + r15 + r16 + r17 + r18 + r20 + r21 + r22 + r23 + r27 + r28 + r29 + r30;

crc104_8= b2 + b6 + b9 + b11 + b12 + b15 + b16 + b17 + b21 + b22 + b24 + b25 + b29 + b32 + b33 + b35 + b36 + b37 + b40 + b42 + b44 + b45 + b51 + b52 + b54 + b55 + b56 + b58 + b62 + b65 + b70 + b71 + b80 + r0 + r1 + r3 + r5 + r6 + r7 + r10 + r12 + r13 + r14 + r15 + r16 + r17 + r18 + r19 + r21 + r22 + r23 + r24 + r28 + r29 + r30 + r31;

crc104_9= b3 + b4 + b5 + b6 + b9 + b10 + b11 + b13 + b14 + b16 + b19 + b23 + b24 + b26 + b27 + b28 + b30 + b33 + b34 + b35 + b36 + b37 + b40 + b42 + b44 + b45 + b47 + b48 + b52 + b53 + b55 + b57 + b59 + b60 + b62 + b71 + b81 + r2 + r3 + r4 + r5 + r9 + r10 + r11 + r13 + r14 + r15 + r16 + r18 + r21 + r24 + r29 + r30;

crc104_10= b0 + b9 + b10 + b15 + b18 + b19 + b20 + b22 + b29 + b31 + b34 + b36 + b37 + b40 + b42 + b44 + b45 + b47 + b49 + b53 + b54 + b58 + b61 + b62 + b66 + b82 + r1 + r4 + r7 + r8 + r9 + r11 + r12 + r14 + r15 + r16 + r20 + r21 + r23 + r30;

crc104_11= b1 + b10 + b11 + b16 + b19 + b20 + b21 + b23 + b30 + b32 + b35 + b37 + b38 + b41 + b43 + b45 + b46 + b48 + b50 + b54 + b55 + b59 + b62 + b63 + b67 + b83 + r0 + r2 + r5 + r8 + r9 + r10 + r12 + r13 + r15 + r16 + r17 + r21 + r22 + r24 + r31;

crc104_12= b0 + b2 + b11 + b12 + b17 + b20 + b21 + b22 + b24 + b31 + b33 + b36 + b38 + b39 + b42 + b44 + b46 + b47 + b49 + b51 + b55 + b56 + b60 + b63 + b64 + b68 + b84 + r0 + r1 + r3 + r6 + r9 + r10 + r11 + r13 + r14 + r16 + r17 + r18 + r22 + r23 + r25;

crc104_13= b1 + b3 + b12 + b13 + b18 + b21 + b22 + b23 + b25 + b32 + b34 + b37 + b39 + b40 + b43 + b45 + b47 + b48 + b50 + b52 + b56 + b57 + b61 + b64 + b65 + b69 + b85 + r1 + r2 + r4 + r7 + r10 + r11 + r12 + r14 + r15 + r17 + r18 + r19 + r23 + r24 + r26;

Fig. 24c crc104_14= b2 + b4 + b13 + b14 + b19 + b22 + b23 + b24 + b26 + b33 + b35 + b38 + b40 + b41 + b44 + b46 + b48 + b49 + b51 + b53 + b57 + b58 + b62 + b65 + b66 + b70 + b86 + r0 + r2 + r3 + r5 + r8 + r11 + r12 + r13 + r15 + r16 + r18 + r19 + r20 + r24 + r25 + r27;

crc104_15= b3 + b5 + b14 + b15 + b20 + b23 + b24 + b25 + b27 + b34 + b36 + b39 + b41 + b42 + b45 + b47 + b49 + b50 + b52 + b54 + b58 + b59 + b63 + b66 + b67 + b71 + b87 + r0 + r1 + r3 + r4 + r6 + r9 + r12 + r13 + r14 + r16 + r17 + r19 + r20 + r21 + r25 + r26 + r28;

crc104_16= b0 + b5 + b7 + b9 + b11 + b12 + b14 + b15 + b16 + b17 + b18 + b19 + b21 + b22 + b26 + b27 + b37 + b38 + b41 + b44 + b47 + b50 + b51 + b53 + b55 + b56 + b59 + b62 + b63 + b64 + b66 + b67 + b68 + b88 + r2 + r3 + r4 + r6 + r8 + r9 + r13 + r14 + r15 + r18 + r19 + r23 + r25 + r26 + r27 + r29 + r31;

crc104_17= b0 + b1 + b6 + b8 + b10 + b12 + b13 + b15 + b16 + b17 + b18 + b19 + b20 + b22 + b23 + b27 + b28 + b38 + b39 + b42 + b45 + b48 + b51 + b52 + b54 + b56 + b57 + b60 + b63 + b64 + b65 + b67 + b68 + b69 + b89 + r0 + r3 + r4 + r5 + r7 + r9 + r10 + r14 + r15 + r16 + r19 + r20 + r24 + r26 + r27 + r28 + r30;

crc104_18= b1 + b2 + b7 + b9 + b11 + b13 + b14 + b16 + b17 + b18 + b19 + b20 + b21 + b23 + b24 + b28 + b29 + b39 + b40 + b43 + b46 + b49 + b52 + b53 + b55 + b57 + b58 + b61 + b64 + b65 + b66 + b68 + b69 + b70 + b90 + r0 + r1 + r4 + r5 + r6 + r8 + r10 + r11 + r15 + r16 + r17 + r20 + r21 + r25 + r27 + r28 + r29 + r31;

crc104_19= b0 + b2 + b3 + b8 + b10 + b12 + b14 + b15 + b17 + b18 + b19 + b20 + b21 + b22 + b24 + b25 + b29 + b30 + b40 + b41 + b44 + b47 + b50 + b53 + b54 + b56 + b58 + b59 + b62 + b65 + b66 + b67 + b69 + b70 + b71 + b91 + r1 + r2 + r5 + r6 + r7 + r9 + r11 + r12 + r16 + r17 + r18 + r21 + r22 + r26 + r28 + r29 + r30;

crc104_20= b0 + b1 + b3 + b5 + b6 + b7 + b12 + b13 + b14 + b15 + b16 + b17 + b20 + b21 + b23 + b24 + b26 + b27 + b28 + b30 + b31 + b35 + b38 + b40 + b43 + b44 + b45 + b46 + b47 + b51 + b54 + b55 + b56 + b57 + b59 + b62 + b67 + b68 + b70 + b71 + b92 + r0 + r1 + r2 + r5 + r9 + r12 + r13 + r18 + r20 + r21 + r25 + r27 + r29 + r30;

Fig. 24d crc104_21= b0 + b1 + b2 + b5 + b8 + b9 + b11 + b12 + b13 + b15 + b16 + b19 + b21 + b29 + b31 + b32 + b35 + b36 + b38 + b39 + b40 + b42 + b43 + b45 + b52 + b55 + b57 + b58 + b62 + b66 + b68 + b69 + b71 + b93 + r2 + r5 + r7 + r8 + r9 + r13 + r14 + r17 + r20 + r23 + r25 + r26 + r28 + r30;

crc104_22= b0 + b1 + b2 + b3 + b4 + b5 + b7 + b10 + b11 + b13 + b16 + b18 + b19 + b20 + b24 + b25 + b27 + b28 + b30 + b32 + b33 + b35 + b36 + b37 + b38 + b39 + b42 + b47 + b48 + b53 + b58 + b59 + b60 + b62 + b66 + b67 + b69 + b70 + b94 + r1 + r5 + r7 + r14 + r15 + r17 + r18 + r19 + r20 + r22 + r23 + r24 + r25 + r26 + r27 + r29;

crc104_23= b1 + b2 + b3 + b4 + b5 + b6 + b8 + b11 + b12 + b14 + b17 + b19 + b20 + b21 + b25 + b26 + b28 + b29 + b31 + b33 + b34 + b36 + b37 + b38 + b39 + b40 + b43 + b48 + b49 + b54 + b59 + b60 + b61 + b63 + b67 + b68 + b70 + b71 + b95 + r0 + r2 + r6 + r8 + r15 + r16 + r18 + r19 + r20 + r21 + r23 + r24 + r25 + r26 + r27 + r28 + r30;

crc104_24= b0 + b2 + b3 + b11 + b13 + b14 + b15 + b17 + b19 + b20 + b21 + b24 + b25 + b26 + b28 + b29 + b30 + b32 + b34 + b37 + b39 + b42 + b43 + b46 + b47 + b48 + b49 + b50 + b55 + b56 + b61 + b63 + b64 + b66 + b68 + b69 + b71 + b96 + r0 + r5 + r6 + r8 + r10 + r16 + r23 + r24 + r26 + r27 + r28 + r29;

crc104_25= b0 + b1 + b3 + b5 + b6 + b7 + b9 + b11 + b15 + b16 + b17 + b19 + b20 + b21 + b24 + b26 + b28 + b29 + b30 + b31 + b33 + b41 + b42 + b46 + b49 + b50 + b51 + b57 + b60 + b63 + b64 + b65 + b66 + b67 + b69 + b70 + b97 + r3 + r5 + r8 + r10 + r11 + r19 + r20 + r21 + r22 + r23 + r24 + r27 + r28 + r29 + r30 + r31;

crc104_26= b0 + b1 + b2 + b4 + b6 + b7 + b8 + b10 + b12 + b16 + b17 + b18 + b20 + b21 + b22 + b25 + b27 + b29 + b30 + b31 + b32 + b34 + b42 + b43 + b47 + b50 + b51 + b52 + b58 + b61 + b64 + b65 + b66 + b67 + b68 + b70 + b71 + b98 + r0 + r4 + r6 + r9 + r11 + r12 + r20 + r21 + r22 + r23 + r24 + r25 + r28 + r29 + r30 + r31;

Fig. 24e crc104_27= b1 + b2 + b3 + b4 + b6 + b8 + b12 + b13 + b14 + b21 + b23 + b24 + b25 + b26 + b27 + b30 + b31 + b32 + b33 + b38 + b40 + b41 + b42 + b46 + b47 + b51 + b52 + b53 + b56 + b59 + b60 + b63 + b65 + b67 + b68 + b69 + b71 + b99 + r0 + r3 + r6 + r8 + r9 + r12 + r13 + r17 + r19 + r20 + r24 + r26 + r29 + r30;

crc104_28= b0 + b2 + b3 + b6 + b11 + b12 + b13 + b15 + b17 + b18 + b19 + b26 + b31 + b32 + b33 + b34 + b35 + b38 + b39 + b40 + b44 + b46 + b52 + b53 + b54 + b56 + b57 + b61 + b62 + b63 + b64 + b68 + b69 + b70 + b100 + r0 + r3 + r4 + r5 + r6 + r8 + r13 + r14 + r17 + r18 + r19 + r22 + r23 + r27 + r30;

crc104_29= b1 + b3 + b4 + b7 + b12 + b13 + b14 + b16 + b18 + b19 + b20 + b27 + b32 + b33 + b34 + b35 + b36 + b39 + b40 + b41 + b45 + b47 + b53 + b54 + b55 + b57 + b58 + b62 + b63 + b64 + b65 + b69 + b70 + b71 + b101 + r1 + r4 + r5 + r6 + r7 + r9 + r14 + r15 + r18 + r19 + r20 + r23 + r24 + r28 + r31;

crc104_30= b2 + b6 + b7 + b8 + b9 + b11 + b12 + b13 + b15 + b18 + b20 + b21 + b22 + b24 + b25 + b27 + b33 + b34 + b36 + b37 + b38 + b43 + b44 + b47 + b54 + b55 + b58 + b59 + b60 + b62 + b64 + b65 + b70 + b71 + b102 + r0 + r1 + r2 + r3 + r9 + r15 + r16 + r17 + r22 + r23 + r24 + r29 + r31;

crc104_31= b3 + b4 + b5 + b6 + b8 + b10 + b11 + b13 + b16 + b17 + b18 + b21 + b23 + b24 + b26 + b27 + b34 + b37 + b39 + b40 + b41 + b42 + b43 + b45 + b46 + b47 + b55 + b59 + b61 + b62 + b65 + b71 + b103 + r0 + r2 + r4 + r5 + r6 + r7 + r8 + r9 + r16 + r18 + r19 + r20 + r21 + r22 + r24 + r30 + r31;

Fig. 25a crc112_0= b1 + b7 + b8 + b12 + b13 + b14 + b15 + b17 + b19 + b20 + b22 + b25 + b26 + b27 + b30 + b32 + b33 + b35 + b36 + b43 + b46 + b48 + b49 + b50 + b51 + b52 + b54 + b55 + b56 + b64 + b68 + b70 + b71 + b74 + b80 + r1 + r2 + r6 + r8 + r9 + r11 + r13 + r14 + r15 + r16 + r17 + r18 + r25 + r27 + r28 + r29 + r30 + r31;

crc112_1= b0 + b2 + b8 + b9 + b13 + b14 + b15 + b16 + b18 + b20 + b21 + b23 + b26 + b27 + b28 + b31 + b33 + b34 + b36 + b37 + b44 + b47 + b49 + b50 + b51 + b52 + b53 + b55 + b56 + b57 + b65 + b69 + b71 + b72 + b75 + b81 + r0 + r2 + r3 + r7 + r9 + r10 + r12 + r14 + r15 + r16 + r17 + r18 + r19 + r26 + r28 + r29 + r30 + r31;

crc112_2= b0 + b1 + b3 + b9 + b10 + b14 + b15 + b16 + b17 + b19 + b21 + b22 + b24 + b27 + b28 + b29 + b32 + b34 + b35 + b37 + b38 + b45 + b48 + b50 + b51 + b52 + b53 + b54 + b56 + b57 + b58 + b66 + b70 + b72 + b73 + b76 + b82 + r0 + r1 + r3 + r4 + r8 + r10 + r11 + r13 + r15 + r16 + r17 + r18 + r19 + r20 + r27 + r29 + r30 + r31;

crc112_3= b0 + b1 + b2 + b4 + b10 + b11 + b15 + b16 + b17 + b18 + b20 + b22 + b23 + b25 + b28 + b29 + b30 + b33 + b35 + b36 + b38 + b39 + b46 + b49 + b51 + b52 + b53 + b54 + b55 + b57 + b58 + b59 + b67 + b71 + b73 + b74 + b77 + b83 + r1 + r2 + r4 + r5 + r9 + r11 + r12 + r14 + r16 + r17 + r18 + r19 + r20 + r21 + r28 + r30 + r31;

crc112_4= b0 + b1 + b2 + b3 + b5 + b11 + b12 + b16 + b17 + b18 + b19 + b21 + b23 + b24 + b26 + b29 + b30 + b31 + b34 + b36 + b37 + b39 + b40 + b47 + b50 + b52 + b53 + b54 + b55 + b56 + b58 + b59 + b60 + b68 + b72 + b74 + b75 + b78 + b84 + r0 + r2 + r3 + r5 + r6 + r10 + r12 + r13 + r15 + r17 + r18 + r19 + r20 + r21 + r22 + r29 + r31;

crc112_5= b0 + b1 + b2 + b3 + b4 + b6 + b12 + b13 + b17 + b18 + b19 + b20 + b22 + b24 + b25 + b27 + b30 + b31 + b32 + b35 + b37 + b38 + b40 + b41 + b48 + b51 + b53 + b54 + b55 + b56 + b57 + b59 + b60 + b61 + b69 + b73 + b75 + b76 + b79 + b85 + r0 + r1 + r3 + r4 + r6 + r7 + r11 + r13 + r14 + r16 + r18 + r19 + r20 + r21 + r22 + r23 + r30;

Fig. 25b crc112_6= b2 + b3 + b4 + b5 + b8 + b12 + b15 + b17 + b18 + b21 + b22 + b23 + b27 + b28 + b30 + b31 + b35 + b38 + b39 + b41 + b42 + b43 + b46 + b48 + b50 + b51 + b57 + b58 + b60 + b61 + b62 + b64 + b68 + b71 + b76 + b77 + b86 + r0 + r4 + r5 + r6 + r7 + r9 + r11 + r12 + r13 + r16 + r18 + r19 + r20 + r21 + r22 + r23 + r24 + r25 + r27 + r28 + r29 + r30;

crc112_7= b3 + b4 + b5 + b6 + b9 + b13 + b16 + b18 + b19 + b22 + b23 + b24 + b28 + b29 + b31 + b32 + b36 + b39 + b40 + b42 + b43 + b44 + b47 + b49 + b51 + b52 + b58 + b59 + b61 + b62 + b63 + b65 + b69 + b72 + b77 + b78 + b87 + r1 + r5 + r6 + r7 + r8 + r10 + r12 + r13 + r14 + r17 + r19 + r20 + r21 + r22 + r23 + r24 + r25 + r26 + r28 + r29 + r30 + r31;

crc112_8= b0 + b4 + b5 + b6 + b7 + b10 + b14 + b17 + b19 + b20 + b23 + b24 + b25 + b29 + b30 + b32 + b33 + b37 + b40 + b41 + b43 + b44 + b45 + b48 + b50 + b52 + b53 + b59 + b60 + b62 + b63 + b64 + b66 + b70 + b73 + b78 + b79 + b88 + r0 + r2 + r6 + r7 + r8 + r9 + r11 + r13 + r14 + r15 + r18 + r20 + r21 + r22 + r23 + r24 + r25 + r26 + r27 + r29 + r30 + r31;

crc112_9= b0 + b5 + b6 + b11 + b12 + b13 + b14 + b17 + b18 + b19 + b21 + b22 + b24 + b27 + b31 + b32 + b34 + b35 + b36 + b38 + b41 + b42 + b43 + b44 + b45 + b48 + b50 + b52 + b53 + b55 + b56 + b60 + b61 + b63 + b65 + b67 + b68 + b70 + b79 + b89 + r2 + r3 + r6 + r7 + r10 + r11 + r12 + r13 + r17 + r18 + r19 + r21 + r22 + r23 + r24 + r26 + r29;

crc112_10= b6 + b8 + b17 + b18 + b23 + b26 + b27 + b28 + b30 + b37 + b39 + b42 + b44 + b45 + b48 + b50 + b52 + b53 + b55 + b57 + b61 + b62 + b66 + b69 + b70 + b74 + b90 + r1 + r2 + r3 + r4 + r6 + r7 + r9 + r12 + r15 + r16 + r17 + r19 + r20 + r22 + r23 + r24 + r28 + r29 + r31;

crc112_11= b0 + b7 + b9 + b18 + b19 + b24 + b27 + b28 + b29 + b31 + b38 + b40 + b43 + b45 + b46 + b49 + b51 + b53 + b54 + b56 + b58 + b62 + b63 + b67 + b70 + b71 + b75 + b91 + r2 + r3 + r4 + r5 + r7 + r8 + r10 + r13 + r16 + r17 + r18 + r20 + r21 + r23 + r24 + r25 + r29 + r30;

Fig. 25c crc112_12= b1 + b8 + b10 + b19 + b20 + b25 + b28 + b29 + b30 + b32 + b39 + b41 + b44 + b46 + b47 + b50 + b52 + b54 + b55 + b57 + b59 + b63 + b64 + b68 + b71 + b72 + b76 + b92 + r3 + r4 + r5 + r6 + r8 + r9 + r11 + r14 + r17 + r18 + r19 + r21 + r22 + r24 + r25 + r26 + r30 + r31;

crc112_13= b0 + b2 + b9 + b11 + b20 + b21 + b26 + b29 + b30 + b31 + b33 + b40 + b42 + b45 + b47 + b48 + b51 + b53 + b55 + b56 + b58 + b60 + b64 + b65 + b69 + b72 + b73 + b77 + b93 + r0 + r4 + r5 + r6 + r7 + r9 + r10 + r12 + r15 + r18 + r19 + r20 + r22 + r23 + r25 + r26 + r27 + r31;

crc112_14= b0 + b1 + b3 + b10 + b12 + b21 + b22 + b27 + b30 + b31 + b32 + b34 + b41 + b43 + b46 + b48 + b49 + b52 + b54 + b56 + b57 + b59 + b61 + b65 + b66 + b70 + b73 + b74 + b78 + b94 + r0 + r1 + r5 + r6 + r7 + r8 + r10 + r11 + r13 + r16 + r19 + r20 + r21 + r23 + r24 + r26 + r27 + r28;

crc112_15= b1 + b2 + b4 + b11 + b13 + b22 + b23 + b28 + b31 + b32 + b33 + b35 + b42 + b44 + b47 + b49 + b50 + b53 + b55 + b57 + b58 + b60 + b62 + b66 + b67 + b71 + b74 + b75 + b79 + b95 + r0 + r1 + r2 + r6 + r7 + r8 + r9 + r11 + r12 + r14 + r17 + r20 + r21 + r22 + r24 + r25 + r27 + r28 + r29;

crc112_16= b1 + b2 + b3 + b5 + b7 + b8 + b13 + b15 + b17 + b19 + b20 + b22 + b23 + b24 + b25 + b26 + b27 + b29 + b30 + b34 + b35 + b45 + b46 + b49 + b52 + b55 + b58 + b59 + b61 + b63 + b64 + b67 + b70 + b71 + b72 + b74 + b75 + b76 + b96 + r0 + r3 + r6 + r7 + r10 + r11 + r12 + r14 + r16 + r17 + r21 + r22 + r23 + r26 + r27 + r31;

crc112_17= b0 + b2 + b3 + b4 + b6 + b8 + b9 + b14 + b16 + b18 + b20 + b21 + b23 + b24 + b25 + b26 + b27 + b28 + b30 + b31 + b35 + b36 + b46 + b47 + b50 + b53 + b56 + b59 + b60 + b62 + b64 + b65 + b68 + b71 + b72 + b73 + b75 + b76 + b77 + b97 + r0 + r1 + r4 + r7 + r8 + r11 + r12 + r13 + r15 + r17 + r18 + r22 + r23 + r24 + r27 + r28;

crc112_18= b1 + b3 + b4 + b5 + b7 + b9 + b10 + b15 + b17 + b19 + b21 + b22 + b24 + b25 + b26 + b27 + b28 + b29 + b31 + b32 + b36 + b37 + b47 + b48 + b51 + b54 + b57 + b60 + b61 + b63 + b65 + b66 + b69 + b72 + b73 + b74 + b76 + b77 + b78 + b98 + r0 + r1 + r2 + r5 + r8 + r9 + r12 + r13 + r14 + r16 + r18 + r19 + r23 + r24 + r25 + r28 + r29;

Fig. 25d crc112_19= b2 + b4 + b5 + b6 + b8 + b10 + b11 + b16 + b18 + b20 + b22 + b23 + b25 + b26 + b27 + b28 + b29 + b30 + b32 + b33 + b37 + b38 + b48 + b49 + b52 + b55 + b58 + b61 + b62 + b64 + b66 + b67 + b70 + b73 + b74 + b75 + b77 + b78 + b79 + b99 + r0 + r1 + r2 + r3 + r6 + r9 + r10 + r13 + r14 + r15 + r17 + r19 + r20 + r24 + r25 + r26 + r29 + r30;

crc112_20= b1 + b3 + b5 + b6 + b8 + b9 + b11 + b13 + b14 + b15 + b20 + b21 + b22 + b23 + b24 + b25 + b28 + b29 + b31 + b32 + b34 + b35 + b36 + b38 + b39 + b43 + b46 + b48 + b51 + b52 + b53 + b54 + b55 + b59 + b62 + b63 + b64 + b65 + b67 + b70 + b75 + b76 + b78 + b79 + b100 + r3 + r4 + r6 + r7 + r8 + r9 + r10 + r13 + r17 + r20 + r21 + r26 + r28 + r29;

crc112_21= b1 + b2 + b4 + b6 + b8 + b9 + b10 + b13 + b16 + b17 + b19 + b20 + b21 + b23 + b24 + b27 + b29 + b37 + b39 + b40 + b43 + b44 + b46 + b47 + b48 + b50 + b51 + b53 + b60 + b63 + b65 + b66 + b70 + b74 + b76 + b77 + b79 + b101 + r1 + r2 + r4 + r5 + r6 + r7 + r10 + r13 + r15 + r16 + r17 + r21 + r22 + r25 + r28 + r31;

crc112_22= b0 + b1 + b2 + b3 + b5 + b8 + b9 + b10 + b11 + b12 + b13 + b15 + b18 + b19 + b21 + b24 + b26 + b27 + b28 + b32 + b33 + b35 + b36 + b38 + b40 + b41 + b43 + b44 + b45 + b46 + b47 + b50 + b55 + b56 + b61 + b66 + b67 + b68 + b70 + b74 + b75 + b77 + b78 + b102 + r1 + r3 + r5 + r7 + r9 + r13 + r15 + r22 + r23 + r25 + r26 + r27 + r28 + r30 + r31;

crc112_23= b0 + b1 + b2 + b3 + b4 + b6 + b9 + b10 + b11 + b12 + b13 + b14 + b16 + b19 + b20 + b22 + b25 + b27 + b28 + b29 + b33 + b34 + b36 + b37 + b39 + b41 + b42 + b44 + b45 + b46 + b47 + b48 + b51 + b56 + b57 + b62 + b67 + b68 + b69 + b71 + b75 + b76 + b78 + b79 + b103 + r2 + r4 + r6 + r8 + r10 + r14 + r16 + r23 + r24 + r26 + r27 + r28 + r29 + r31;

crc112_24= b0 + b2 + b3 + b4 + b5 + b8 + b10 + b11 + b19 + b21 + b22 + b23 + b25 + b27 + b28 + b29 + b32 + b33 + b34 + b36 + b37 + b38 + b40 + b42 + b45 + b47 + b50 + b51 + b54 + b55 + b56 + b57 + b58 + b63 + b64 + b69 + b71 + b72 + b74 + b76 + b77 + b79 + b104 + r0 + r1 + r2 + r3 + r5 + r6 + r7 + r8 + r13 + r14 + r16 + r18 + r24 + r31;

Fig. 25e crc112_25= b0 + b3 + b4 + b5 + b6 + b7 + b8 + b9 + b11 + b13 + b14 + b15 + b17 + b19 + b23 + b24 + b25 + b27 + b28 + b29 + b32 + b34 + b36 + b37 + b38 + b39 + b41 + b49 + b50 + b54 + b57 + b58 + b59 + b65 + b68 + b71 + b72 + b73 + b74 + b75 + b77 + b78 + b105 + r3 + r4 + r7 + r11 + r13 + r16 + r18 + r19 + r27 + r28 + r29 + r30 + r31;

crc112_26= b0 + b1 + b4 + b5 + b6 + b7 + b8 + b9 + b10 + b12 + b14 + b15 + b16 + b18 + b20 + b24 + b25 + b26 + b28 + b29 + b30 + b33 + b35 + b37 + b38 + b39 + b40 + b42 + b50 + b51 + b55 + b58 + b59 + b60 + b66 + b69 + b72 + b73 + b74 + b75 + b76 + b78 + b79 + b106 + r0 + r4 + r5 + r8 + r12 + r14 + r17 + r19 + r20 + r28 + r29 + r30 + r31;

crc112_27= b0 + b2 + b5 + b6 + b9 + b10 + b11 + b12 + b14 + b16 + b20 + b21 + b22 + b29 + b31 + b32 + b33 + b34 + b35 + b38 + b39 + b40 + b41 + b46 + b48 + b49 + b50 + b54 + b55 + b59 + b60 + b61 + b64 + b67 + b68 + b71 + b73 + b75 + b76 + b77 + b79 + b107 + r0 + r2 + r5 + r8 + r11 + r14 + r16 + r17 + r20 + r21 + r25 + r27 + r28;

crc112_28= b3 + b6 + b8 + b10 + b11 + b14 + b19 + b20 + b21 + b23 + b25 + b26 + b27 + b34 + b39 + b40 + b41 + b42 + b43 + b46 + b47 + b48 + b52 + b54 + b60 + b61 + b62 + b64 + b65 + b69 + b70 + b71 + b72 + b76 + b77 + b78 + b108 + r0 + r2 + r3 + r8 + r11 + r12 + r13 + r14 + r16 + r21 + r22 + r25 + r26 + r27 + r30 + r31;

crc112_29= b0 + b4 + b7 + b9 + b11 + b12 + b15 + b20 + b21 + b22 + b24 + b26 + b27 + b28 + b35 + b40 + b41 + b42 + b43 + b44 + b47 + b48 + b49 + b53 + b55 + b61 + b62 + b63 + b65 + b66 + b70 + b71 + b72 + b73 + b77 + b78 + b79 + b109 + r1 + r3 + r4 + r9 + r12 + r13 + r14 + r15 + r17 + r22 + r23 + r26 + r27 + r28 + r31;

crc112_30= b0 + b5 + b7 + b10 + b14 + b15 + b16 + b17 + b19 + b20 + b21 + b23 + b26 + b28 + b29 + b30 + b32 + b33 + b35 + b41 + b42 + b44 + b45 + b46 + b51 + b52 + b55 + b62 + b63 + b66 + b67 + b68 + b70 + b72 + b73 + b78 + b79 + b110 + r1 + r4 + r5 + r6 + r8 + r9 + r10 + r11 + r17 + r23 + r24 + r25 + r30 + r31;

crc112_31= b0 + b6 + b7 + b11 + b12 + b13 + b14 + b16 + b18 + b19 + b21 + b24 + b25 + b26 + b29 + b31 + b32 + b34 + b35 + b42 + b45 + b47 + b48 + b49 + b50 + b51 + b53 + b54 + b55 + b63 + b67 + b69 + b70 + b73 + b79 + b111 + r0 + r1 + r5 + r7 + r8 + r10 + r12 + r13 + r14 + r15 + r16 + r17 + r24 + r26 + r27 + r28 + r29 + r30;

Fig. 26a crc120_0= b1 + b3 + b4 + b5 + b6 + b7 + b9 + b15 + b16 + b20 + b21 + b22 + b23 + b25 + b27 + b28 + b30 + b33 + b34 + b35 + b38 + b40 + b41 + b43 + b44 + b51 + b54 + b56 + b57 + b58 + b59 + b60 + b62 + b63 + b64 + b72 + b76 + b78 + b79 + b82 + b88 + r1 + r2 + r3 + r4 + r6 + r7 + r9 + r10 + r14 + r16 + r17 + r19 + r21 + r22 + r23 + r24 + r25 + r26;

crc120_1= b2 + b4 + b5 + b6 + b7 + b8 + b10 + b16 + b17 + b21 + b22 + b23 + b24 + b26 + b28 + b29 + b31 + b34 + b35 + b36 + b39 + b41 + b42 + b44 + b45 + b52 + b55 + b57 + b58 + b59 + b60 + b61 + b63 + b64 + b65 + b73 + b77 + b79 + b80 + b83 + b89 + r2 + r3 + r4 + r5 + r7 + r8 + r10 + r11 + r15 + r17 + r18 + r20 + r22 + r23 + r24 + r25 + r26 + r27;

crc120_2= b3 + b5 + b6 + b7 + b8 + b9 + b11 + b17 + b18 + b22 + b23 + b24 + b25 + b27 + b29 + b30 + b32 + b35 + b36 + b37 + b40 + b42 + b43 + b45 + b46 + b53 + b56 + b58 + b59 + b60 + b61 + b62 + b64 + b65 + b66 + b74 + b78 + b80 + b81 + b84 + b90 + r3 + r4 + r5 + r6 + r8 + r9 + r11 + r12 + r16 + r18 + r19 + r21 + r23 + r24 + r25 + r26 + r27 + r28;

crc120_3= b4 + b6 + b7 + b8 + b9 + b10 + b12 + b18 + b19 + b23 + b24 + b25 + b26 + b28 + b30 + b31 + b33 + b36 + b37 + b38 + b41 + b43 + b44 + b46 + b47 + b54 + b57 + b59 + b60 + b61 + b62 + b63 + b65 + b66 + b67 + b75 + b79 + b81 + b82 + b85 + b91 + r0 + r4 + r5 + r6 + r7 + r9 + r10 + r12 + r13 + r17 + r19 + r20 + r22 + r24 + r25 + r26 + r27 + r28 + r29;

crc120_4= b5 + b7 + b8 + b9 + b10 + b11 + b13 + b19 + b20 + b24 + b25 + b26 + b27 + b29 + b31 + b32 + b34 + b37 + b38 + b39 + b42 + b44 + b45 + b47 + b48 + b55 + b58 + b60 + b61 + b62 + b63 + b64 + b66 + b67 + b68 + b76 + b80 + b82 + b83 + b86 + b92 + r1 + r5 + r6 + r7 + r8 + r10 + r11 + r13 + r14 + r18 + r20 + r21 + r23 + r25 + r26 + r27 + r28 + r29 + r30;

crc120_5= b6 + b8 + b9 + b10 + b11 + b12 + b14 + b20 + b21 + b25 + b26 + b27 + b28 + b30 + b32 + b33 + b35 + b38 + b39 + b40 + b43 + b45 + b46 + b48 + b49 + b56 + b59 + b61 + b62 + b63 + b64 + b65 + b67 + b68 + b69 + b77 + b81 + b83 + b84 + b87 + b93 + r0 + r2 + r6 + r7 + r8 + r9 + r11 + r12 + r14 + r15 + r19 + r21 + r22 + r24 + r26 + r27 + r28 + r29 + r30 + r31;

Fig. 26b crc120_6= b0 + b1 + b3 + b4 + b5 + b6 + b10 + b11 + b12 + b13 + b16 + b20 + b23 + b25 + b26 + b29 + b30 + b31 + b35 + b36 + b38 + b39 + b43 + b46 + b47 + b49 + b50 + b51 + b54 + b56 + b58 + b59 + b65 + b66 + b68 + b69 + b70 + b72 + b76 + b79 + b84 + b85 + b94 + r0 + r2 + r4 + r6 + r8 + r12 + r13 + r14 + r15 + r17 + r19 + r20 + r21 + r24 + r26 + r27 + r28 + r29 + r30 + r31;

crc120_7= b0 + b1 + b2 + b4 + b5 + b6 + b7 + b11 + b12 + b13 + b14 + b17 + b21 + b24 + b26 + b27 + b30 + b31 + b32 + b36 + b37 + b39 + b40 + b44 + b47 + b48 + b50 + b51 + b52 + b55 + b57 + b59 + b60 + b66 + b67 + b69 + b70 + b71 + b73 + b77 + b80 + b85 + b86 + b95 + r0 + r1 + r3 + r5 + r7 + r9 + r13 + r14 + r15 + r16 + r18 + r20 + r21 + r22 + r25 + r27 + r28 + r29 + r30 + r31;

crc120_8= b0 + b1 + b2 + b3 + b5 + b6 + b7 + b8 + b12 + b13 + b14 + b15 + b18 + b22 + b25 + b27 + b28 + b31 + b32 + b33 + b37 + b38 + b40 + b41 + b45 + b48 + b49 + b51 + b52 + b53 + b56 + b58 + b60 + b61 + b67 + b68 + b70 + b71 + b72 + b74 + b78 + b81 + b86 + b87 + b96 + r0 + r1 + r2 + r4 + r6 + r8 + r10 + r14 + r15 + r16 + r17 + r19 + r21 + r22 + r23 + r26 + r28 + r29 + r30 + r31;

crc120_9= b0 + b2 + b5 + b8 + b13 + b14 + b19 + b20 + b21 + b22 + b25 + b26 + b27 + b29 + b30 + b32 + b35 + b39 + b40 + b42 + b43 + b44 + b46 + b49 + b50 + b51 + b52 + b53 + b56 + b58 + b60 + b61 + b63 + b64 + b68 + b69 + b71 + b73 + b75 + b76 + b78 + b87 + b97 + r0 + r4 + r5 + r6 + r10 + r11 + r14 + r15 + r18 + r19 + r20 + r21 + r25 + r26 + r27 + r29 + r30 + r31;

crc120_10= b0 + b4 + b5 + b7 + b14 + b16 + b25 + b26 + b31 + b34 + b35 + b36 + b38 + b45 + b47 + b50 + b52 + b53 + b56 + b58 + b60 + b61 + b63 + b65 + b69 + b70 + b74 + b77 + b78 + b82 + b98 + r2 + r3 + r4 + r5 + r9 + r10 + r11 + r12 + r14 + r15 + r17 + r20 + r23 + r24 + r25 + r27 + r28 + r30 + r31;

crc120_11= b0 + b1 + b5 + b6 + b8 + b15 + b17 + b26 + b27 + b32 + b35 + b36 + b37 + b39 + b46 + b48 + b51 + b53 + b54 + b57 + b59 + b61 + b62 + b64 + b66 + b70 + b71 + b75 + b78 + b79 + b83 + b99 + r0 + r3 + r4 + r5 + r6 + r10 + r11 + r12 + r13 + r15 + r16 + r18 + r21 + r24 + r25 + r26 + r28 + r29 + r31;

Fig. 26c crc120_12= b0 + b1 + b2 + b6 + b7 + b9 + b16 + b18 + b27 + b28 + b33 + b36 + b37 + b38 + b40 + b47 + b49 + b52 + b54 + b55 + b58 + b60 + b62 + b63 + b65 + b67 + b71 + b72 + b76 + b79 + b80 + b84 + b100 + r0 + r1 + r4 + r5 + r6 + r7 + r11 + r12 + r13 + r14 + r16 + r17 + r19 + r22 + r25 + r26 + r27 + r29 + r30;

crc120_13= b1 + b2 + b3 + b7 + b8 + b10 + b17 + b19 + b28 + b29 + b34 + b37 + b38 + b39 + b41 + b48 + b50 + b53 + b55 + b56 + b59 + b61 + b63 + b64 + b66 + b68 + b72 + b73 + b77 + b80 + b81 + b85 + b101 + r1 + r2 + r5 + r6 + r7 + r8 + r12 + r13 + r14 + r15 + r17 + r18 + r20 + r23 + r26 + r27 + r28 + r30 + r31;

crc120_14= b0 + b2 + b3 + b4 + b8 + b9 + b11 + b18 + b20 + b29 + b30 + b35 + b38 + b39 + b40 + b42 + b49 + b51 + b54 + b56 + b57 + b60 + b62 + b64 + b65 + b67 + b69 + b73 + b74 + b78 + b81 + b82 + b86 + b102 + r0 + r2 + r3 + r6 + r7 + r8 + r9 + r13 + r14 + r15 + r16 + r18 + r19 + r21 + r24 + r27 + r28 + r29 + r31;

crc120_15= b0 + b1 + b3 + b4 + b5 + b9 + b10 + b12 + b19 + b21 + b30 + b31 + b36 + b39 + b40 + b41 + b43 + b50 + b52 + b55 + b57 + b58 + b61 + b63 + b65 + b66 + b68 + b70 + b74 + b75 + b79 + b82 + b83 + b87 + b103 + r0 + r1 + r3 + r4 + r7 + r8 + r9 + r10 + r14 + r15 + r16 + r17 + r19 + r20 + r22 + r25 + r28 + r29 + r30;

crc120_16= b2 + b3 + b7 + b9 + b10 + b11 + b13 + b15 + b16 + b21 + b23 + b25 + b27 + b28 + b30 + b31 + b32 + b33 + b34 + b35 + b37 + b38 + b42 + b43 + b53 + b54 + b57 + b60 + b63 + b66 + b67 + b69 + b71 + b72 + b75 + b78 + b79 + b80 + b82 + b83 + b84 + b104 + r0 + r3 + r5 + r6 + r7 + r8 + r11 + r14 + r15 + r18 + r19 + r20 + r22 + r24 + r25 + r29 + r30 + r31;

crc120_17= b0 + b3 + b4 + b8 + b10 + b11 + b12 + b14 + b16 + b17 + b22 + b24 + b26 + b28 + b29 + b31 + b32 + b33 + b34 + b35 + b36 + b38 + b39 + b43 + b44 + b54 + b55 + b58 + b61 + b64 + b67 + b68 + b70 + b72 + b73 + b76 + b79 + b80 + b81 + b83 + b84 + b85 + b105 + r0 + r1 + r4 + r6 + r7 + r8 + r9 + r12 + r15 + r16 + r19 + r20 + r21 + r23 + r25 + r26 + r30 + r31;

Fig. 26d crc120_18= b0 + b1 + b4 + b5 + b9 + b11 + b12 + b13 + b15 + b17 + b18 + b23 + b25 + b27 + b29 + b30 + b32 + b33 + b34 + b35 + b36 + b37 + b39 + b40 + b44 + b45 + b55 + b56 + b59 + b62 + b65 + b68 + b69 + b71 + b73 + b74 + b77 + b80 + b81 + b82 + b84 + b85 + b86 + b106 + r1 + r2 + r5 + r7 + r8 + r9 + r10 + r13 + r16 + r17 + r20 + r21 + r22 + r24 + r26 + r27 + r31;

crc120_19= b0 + b1 + b2 + b5 + b6 + b10 + b12 + b13 + b14 + b16 + b18 + b19 + b24 + b26 + b28 + b30 + b31 + b33 + b34 + b35 + b36 + b37 + b38 + b40 + b41 + b45 + b46 + b56 + b57 + b60 + b63 + b66 + b69 + b70 + b72 + b74 + b75 + b78 + b81 + b82 + b83 + b85 + b86 + b87 + b107 + r0 + r2 + r3 + r6 + r8 + r9 + r10 + r11 + r14 + r17 + r18 + r21 + r22 + r23 + r25 + r27 + r28;

crc120_20= b2 + b4 + b5 + b9 + b11 + b13 + b14 + b16 + b17 + b19 + b21 + b22 + b23 + b28 + b29 + b30 + b31 + b32 + b33 + b36 + b37 + b39 + b40 + b42 + b43 + b44 + b46 + b47 + b51 + b54 + b56 + b59 + b60 + b61 + b62 + b63 + b67 + b70 + b71 + b72 + b73 + b75 + b78 + b83 + b84 + b86 + b87 + b108 + r0 + r2 + r6 + r11 + r12 + r14 + r15 + r16 + r17 + r18 + r21 + r25 + r28 + r29;

crc120_21= b1 + b4 + b7 + b9 + b10 + b12 + b14 + b16 + b17 + b18 + b21 + b24 + b25 + b27 + b28 + b29 + b31 + b32 + b35 + b37 + b45 + b47 + b48 + b51 + b52 + b54 + b55 + b56 + b58 + b59 + b61 + b68 + b71 + b73 + b74 + b78 + b82 + b84 + b85 + b87 + b109 + r0 + r2 + r4 + r6 + r9 + r10 + r12 + r13 + r14 + r15 + r18 + r21 + r23 + r24 + r25 + r29 + r30;

crc120_22= b1 + b2 + b3 + b4 + b6 + b7 + b8 + b9 + b10 + b11 + b13 + b16 + b17 + b18 + b19 + b20 + b21 + b23 + b26 + b27 + b29 + b32 + b34 + b35 + b36 + b40 + b41 + b43 + b44 + b46 + b48 + b49 + b51 + b52 + b53 + b54 + b55 + b58 + b63 + b64 + b69 + b74 + b75 + b76 + b78 + b82 + b83 + b85 + b86 + b110 + r0 + r2 + r4 + r5 + r6 + r9 + r11 + r13 + r15 + r17 + r21 + r23 + r30 + r31;

crc120_23= b0 + b2 + b3 + b4 + b5 + b7 + b8 + b9 + b10 + b11 + b12 + b14 + b17 + b18 + b19 + b20 + b21 + b22 + b24 + b27 + b28 + b30 + b33 + b35 + b36 + b37 + b41 + b42 + b44 + b45 + b47 + b49 + b50 + b52 + b53 + b54 + b55 + b56 + b59 + b64 + b65 + b70 + b75 + b76 + b77 + b79 + b83 + b84 + b86 + b87 + b111 + r0 + r1 + r3 + r5 + r6 + r7 + r10 + r12 + r14 + r16 + r18 + r22 + r24 + r31;

Fig. 26e crc120_24= b0 + b7 + b8 + b10 + b11 + b12 + b13 + b16 + b18 + b19 + b27 + b29 + b30 + b31 + b33 + b35 + b36 + b37 + b40 + b41 + b42 + b44 + b45 + b46 + b48 + b50 + b53 + b55 + b58 + b59 + b62 + b63 + b64 + b65 + b66 + b71 + b72 + b77 + b79 + b80 + b82 + b84 + b85 + b87 + b112 + r0 + r3 + r8 + r9 + r10 + r11 + r13 + r14 + r15 + r16 + r21 + r22 + r24 + r26;

crc120_25= b3 + b4 + b5 + b6 + b7 + b8 + b11 + b12 + b13 + b14 + b15 + b16 + b17 + b19 + b21 + b22 + b23 + b25 + b27 + b31 + b32 + b33 + b35 + b36 + b37 + b40 + b42 + b44 + b45 + b46 + b47 + b49 + b57 + b58 + b62 + b65 + b66 + b67 + b73 + b76 + b79 + b80 + b81 + b82 + b83 + b85 + b86 + b113 + r2 + r3 + r6 + r7 + r11 + r12 + r15 + r19 + r21 + r24 + r26 + r27;

crc120_26= b4 + b5 + b6 + b7 + b8 + b9 + b12 + b13 + b14 + b15 + b16 + b17 + b18 + b20 + b22 + b23 + b24 + b26 + b28 + b32 + b33 + b34 + b36 + b37 + b38 + b41 + b43 + b45 + b46 + b47 + b48 + b50 + b58 + b59 + b63 + b66 + b67 + b68 + b74 + b77 + b80 + b81 + b82 + b83 + b84 + b86 + b87 + b114 + r3 + r4 + r7 + r8 + r12 + r13 + r16 + r20 + r22 + r25 + r27 + r28;

crc120_27= b1 + b3 + b4 + b8 + b10 + b13 + b14 + b17 + b18 + b19 + b20 + b22 + b24 + b28 + b29 + b30 + b37 + b39 + b40 + b41 + b42 + b43 + b46 + b47 + b48 + b49 + b54 + b56 + b57 + b58 + b62 + b63 + b67 + b68 + b69 + b72 + b75 + b76 + b79 + b81 + b83 + b84 + b85 + b87 + b115 + r0 + r1 + r2 + r3 + r5 + r6 + r7 + r8 + r10 + r13 + r16 + r19 + r22 + r24 + r25 + r28 + r29;

crc120_28= b1 + b2 + b3 + b6 + b7 + b11 + b14 + b16 + b18 + b19 + b22 + b27 + b28 + b29 + b31 + b33 + b34 + b35 + b42 + b47 + b48 + b49 + b50 + b51 + b54 + b55 + b56 + b60 + b62 + b68 + b69 + b70 + b72 + b73 + b77 + b78 + b79 + b80 + b84 + b85 + b86 + b116 + r0 + r8 + r10 + r11 + r16 + r19 + r20 + r21 + r22 + r24 + r29 + r30;

crc120_29= b2 + b3 + b4 + b7 + b8 + b12 + b15 + b17 + b19 + b20 + b23 + b28 + b29 + b30 + b32 + b34 + b35 + b36 + b43 + b48 + b49 + b50 + b51 + b52 + b55 + b56 + b57 + b61 + b63 + b69 + b70 + b71 + b73 + b74 + b78 + b79 + b80 + b81 + b85 + b86 + b87 + b117 + r0 + r1 + r9 + r11 + r12 + r17 + r20 + r21 + r22 + r23 + r25 + r30 + r31;

Fig. 26f crc120_30= b0 + b1 + b6 + b7 + b8 + b13 + b15 + b18 + b22 + b23 + b24 + b25 + b27 + b28 + b29 + b31 + b34 + b36 + b37 + b38 + b40 + b41 + b43 + b49 + b50 + b52 + b53 + b54 + b59 + b60 + b63 + b70 + b71 + b74 + b75 + b76 + b78 + b80 + b81 + b86 + b87 + b118 + r3 + r4 + r6 + r7 + r9 + r12 + r13 + r14 + r16 + r17 + r18 + r19 + r25 + r31;

crc120_31= b0 + b2 + b3 + b4 + b5 + b6 + b8 + b14 + b15 + b19 + b20 + b21 + b22 + b24 + b26 + b27 + b29 + b32 + b33 + b34 + b37 + b39 + b40 + b42 + b43 + b50 + b53 + b55 + b56 + b57 + b58 + b59 + b61 + b62 + b63 + b71 + b75 + b77 + b78 + b81 + b87 + b119 + r0 + r1 + r2 + r3 + r5 + r6 + r8 + r9 + r13 + r15 + r16 + r18 + r20 + r21 + r22 + r23 + r24 + r25;

Fig. 27a crc128_0= b0 + b1 + b2 + b9 + b11 + b12 + b13 + b14 + b15 + b17 + b23 + b24 + b28 + b29 + b30 + b31 + b33 + b35 + b36 + b38 + b41 + b42 + b43 + b46 + b48 + b49 + b51 + b52 + b59 + b62 + b64 + b65 + b66 + b67 + b68 + b70 + b71 + b72 + b80 + b84 + b86 + b87 + b90 + b96 + r0 + r1 + r2 + r3 + r5 + r9 + r10 + r11 + r12 + r14 + r15 + r17 + r18 + r22 + r24 + r25 + r27 + r29 + r30 + r31;

crc128_1= b0 + b1 + b2 + b3 + b10 + b12 + b13 + b14 + b15 + b16 + b18 + b24 + b25 + b29 + b30 + b31 + b32 + b34 + b36 + b37 + b39 + b42 + b43 + b44 + b47 + b49 + b50 + b52 + b53 + b60 + b63 + b65 + b66 + b67 + b68 + b69 + b71 + b72 + b73 + b81 + b85 + b87 + b88 + b91 + b97 + r1 + r2 + r3 + r4 + r6 + r10 + r11 + r12 + r13 + r15 + r16 + r18 + r19 + r23 + r25 + r26 + r28 + r30 + r31;

crc128_2= b0 + b1 + b2 + b3 + b4 + b11 + b13 + b14 + b15 + b16 + b17 + b19 + b25 + b26 + b30 + b31 + b32 + b33 + b35 + b37 + b38 + b40 + b43 + b44 + b45 + b48 + b50 + b51 + b53 + b54 + b61 + b64 + b66 + b67 + b68 + b69 + b70 + b72 + b73 + b74 + b82 + b86 + b88 + b89 + b92 + b98 + r2 + r3 + r4 + r5 + r7 + r11 + r12 + r13 + r14 + r16 + r17 + r19 + r20 + r24 + r26 + r27 + r29 + r31;

crc128_3= b0 + b1 + b2 + b3 + b4 + b5 + b12 + b14 + b15 + b16 + b17 + b18 + b20 + b26 + b27 + b31 + b32 + b33 + b34 + b36 + b38 + b39 + b41 + b44 + b45 + b46 + b49 + b51 + b52 + b54 + b55 + b62 + b65 + b67 + b68 + b69 + b70 + b71 + b73 + b74 + b75 + b83 + b87 + b89 + b90 + b93 + b99 + r3 + r4 + r5 + r6 + r8 + r12 + r13 + r14 + r15 + r17 + r18 + r20 + r21 + r25 + r27 + r28 + r30;

crc128_4= b1 + b2 + b3 + b4 + b5 + b6 + b13 + b15 + b16 + b17 + b18 + b19 + b21 + b27 + b28 + b32 + b33 + b34 + b35 + b37 + b39 + b40 + b42 + b45 + b46 + b47 + b50 + b52 + b53 + b55 + b56 + b63 + b66 + b68 + b69 + b70 + b71 + b72 + b74 + b75 + b76 + b84 + b88 + b90 + b91 + b94 + b100 + r0 + r4 + r5 + r6 + r7 + r9 + r13 + r14 + r15 + r16 + r18 + r19 + r21 + r22 + r26 + r28 + r29 + r31;

Fig. 27b crc128_5= b0 + b2 + b3 + b4 + b5 + b6 + b7 + b14 + b16 + b17 + b18 + b19 + b20 + b22 + b28 + b29 + b33 + b34 + b35 + b36 + b38 + b40 + b41 + b43 + b46 + b47 + b48 + b51 + b53 + b54 + b56 + b57 + b64 + b67 + b69 + b70 + b71 + b72 + b73 + b75 + b76 + b77 + b85 + b89 + b91 + b92 + b95 + b101 + r1 + r5 + r6 + r7 + r8 + r10 + r14 + r15 + r16 + r17 + r19 + r20 + r22 + r23 + r27 + r29 + r30;

crc128_6= b0 + b2 + b3 + b4 + b5 + b6 + b7 + b8 + b9 + b11 + b12 + b13 + b14 + b18 + b19 + b20 + b21 + b24 + b28 + b31 + b33 + b34 + b37 + b38 + b39 + b43 + b44 + b46 + b47 + b51 + b54 + b55 + b57 + b58 + b59 + b62 + b64 + b66 + b67 + b73 + b74 + b76 + b77 + b78 + b80 + b84 + b87 + b92 + b93 + b102 + r1 + r3 + r5 + r6 + r7 + r8 + r10 + r12 + r14 + r16 + r20 + r21 + r22 + r23 + r25 + r27 + r28 + r29;

crc128_7= b1 + b3 + b4 + b5 + b6 + b7 + b8 + b9 + b10 + b12 + b13 + b14 + b15 + b19 + b20 + b21 + b22 + b25 + b29 + b32 + b34 + b35 + b38 + b39 + b40 + b44 + b45 + b47 + b48 + b52 + b55 + b56 + b58 + b59 + b60 + b63 + b65 + b67 + b68 + b74 + b75 + b77 + b78 + b79 + b81 + b85 + b88 + b93 + b94 + b103 + r0 + r2 + r4 + r6 + r7 + r8 + r9 + r11 + r13 + r15 + r17 + r21 + r22 + r23 + r24 + r26 + r28 + r29 + r30;

crc128_8= b2 + b4 + b5 + b6 + b7 + b8 + b9 + b10 + b11 + b13 + b14 + b15 + b16 + b20 + b21 + b22 + b23 + b26 + b30 + b33 + b35 + b36 + b39 + b40 + b41 + b45 + b46 + b48 + b49 + b53 + b56 + b57 + b59 + b60 + b61 + b64 + b66 + b68 + b69 + b75 + b76 + b78 + b79 + b80 + b82 + b86 + b89 + b94 + b95 + b104 + r0 + r1 + r3 + r5 + r7 + r8 + r9 + r10 + r12 + r14 + r16 + r18 + r22 + r23 + r24 + r25 + r27 + r29 + r30 + r31;

crc128_9= b1 + b2 + b3 + b5 + b6 + b7 + b8 + b10 + b13 + b16 + b21 + b22 + b27 + b28 + b29 + b30 + b33 + b34 + b35 + b37 + b38 + b40 + b43 + b47 + b48 + b50 + b51 + b52 + b54 + b57 + b58 + b59 + b60 + b61 + b64 + b66 + b68 + b69 + b71 + b72 + b76 + b77 + b79 + b81 + b83 + b84 + b86 + b95 + b105 + r3 + r4 + r5 + r6 + r8 + r12 + r13 + r14 + r18 + r19 + r22 + r23 + r26 + r27 + r28 + r29;

Fig. 27c crc128_10= b0 + b1 + b3 + b4 + b6 + b7 + b8 + b12 + b13 + b15 + b22 + b24 + b33 + b34 + b39 + b42 + b43 + b44 + b46 + b53 + b55 + b58 + b60 + b61 + b64 + b66 + b68 + b69 + b71 + b73 + b77 + b78 + b82 + b85 + b86 + b90 + b106 + r1 + r2 + r3 + r4 + r6 + r7 + r10 + r11 + r12 + r13 + r17 + r18 + r19 + r20 + r22 + r23 + r25 + r28 + r31;

crc128_11= b0 + b1 + b2 + b4 + b5 + b7 + b8 + b9 + b13 + b14 + b16 + b23 + b25 + b34 + b35 + b40 + b43 + b44 + b45 + b47 + b54 + b56 + b59 + b61 + b62 + b65 + b67 + b69 + b70 + b72 + b74 + b78 + b79 + b83 + b86 + b87 + b91 + b107 + r2 + r3 + r4 + r5 + r7 + r8 + r11 + r12 + r13 + r14 + r18 + r19 + r20 + r21 + r23 + r24 + r26 + r29;

crc128_12= b1 + b2 + b3 + b5 + b6 + b8 + b9 + b10 + b14 + b15 + b17 + b24 + b26 + b35 + b36 + b41 + b44 + b45 + b46 + b48 + b55 + b57 + b60 + b62 + b63 + b66 + b68 + b70 + b71 + b73 + b75 + b79 + b80 + b84 + b87 + b88 + b92 + b108 + r0 + r3 + r4 + r5 + r6 + r8 + r9 + r12 + r13 + r14 + r15 + r19 + r20 + r21 + r22 + r24 + r25 + r27 + r30;

crc128_13= b2 + b3 + b4 + b6 + b7 + b9 + b10 + b11 + b15 + b16 + b18 + b25 + b27 + b36 + b37 + b42 + b45 + b46 + b47 + b49 + b56 + b58 + b61 + b63 + b64 + b67 + b69 + b71 + b72 + b74 + b76 + b80 + b81 + b85 + b88 + b89 + b93 + b109 + r1 + r4 + r5 + r6 + r7 + r9 + r10 + r13 + r14 + r15 + r16 + r20 + r21 + r22 + r23 + r25 + r26 + r28 + r31;

crc128_14= b0 + b3 + b4 + b5 + b7 + b8 + b10 + b11 + b12 + b16 + b17 + b19 + b26 + b28 + b37 + b38 + b43 + b46 + b47 + b48 + b50 + b57 + b59 + b62 + b64 + b65 + b68 + b70 + b72 + b73 + b75 + b77 + b81 + b82 + b86 + b89 + b90 + b94 + b110 + r2 + r5 + r6 + r7 + r8 + r10 + r11 + r14 + r15 + r16 + r17 + r21 + r22 + r23 + r24 + r26 + r27 + r29;

crc128_15= b1 + b4 + b5 + b6 + b8 + b9 + b11 + b12 + b13 + b17 + b18 + b20 + b27 + b29 + b38 + b39 + b44 + b47 + b48 + b49 + b51 + b58 + b60 + b63 + b65 + b66 + b69 + b71 + b73 + b74 + b76 + b78 + b82 + b83 + b87 + b90 + b91 + b95 + b111 + r0 + r3 + r6 + r7 + r8 + r9 + r11 + r12 + r15 + r16 + r17 + r18 + r22 + r23 + r24 + r25 + r27 + r28 + r30;

Fig. 27d crc128_16= b0 + b1 + b5 + b6 + b7 + b10 + b11 + b15 + b17 + b18 + b19 + b21 + b23 + b24 + b29 + b31 + b33 + b35 + b36 + b38 + b39 + b40 + b41 + b42 + b43 + b45 + b46 + b50 + b51 + b61 + b62 + b65 + b68 + b71 + b74 + b75 + b77 + b79 + b80 + b83 + b86 + b87 + b88 + b90 + b91 + b92 + b112 + r2 + r3 + r4 + r5 + r7 + r8 + r11 + r13 + r14 + r15 + r16 + r19 + r22 + r23 + r26 + r27 + r28 + r30;

crc128_17= b1 + b2 + b6 + b7 + b8 + b11 + b12 + b16 + b18 + b19 + b20 + b22 + b24 + b25 + b30 + b32 + b34 + b36 + b37 + b39 + b40 + b41 + b42 + b43 + b44 + b46 + b47 + b51 + b52 + b62 + b63 + b66 + b69 + b72 + b75 + b76 + b78 + b80 + b81 + b84 + b87 + b88 + b89 + b91 + b92 + b93 + b113 + r3 + r4 + r5 + r6 + r8 + r9 + r12 + r14 + r15 + r16 + r17 + r20 + r23 + r24 + r27 + r28 + r29 + r31;

crc128_18= b0 + b2 + b3 + b7 + b8 + b9 + b12 + b13 + b17 + b19 + b20 + b21 + b23 + b25 + b26 + b31 + b33 + b35 + b37 + b38 + b40 + b41 + b42 + b43 + b44 + b45 + b47 + b48 + b52 + b53 + b63 + b64 + b67 + b70 + b73 + b76 + b77 + b79 + b81 + b82 + b85 + b88 + b89 + b90 + b92 + b93 + b94 + b114 + r4 + r5 + r6 + r7 + r9 + r10 + r13 + r15 + r16 + r17 + r18 + r21 + r24 + r25 + r28 + r29 + r30;

crc128_19= b1 + b3 + b4 + b8 + b9 + b10 + b13 + b14 + b18 + b20 + b21 + b22 + b24 + b26 + b27 + b32 + b34 + b36 + b38 + b39 + b41 + b42 + b43 + b44 + b45 + b46 + b48 + b49 + b53 + b54 + b64 + b65 + b68 + b71 + b74 + b77 + b78 + b80 + b82 + b83 + b86 + b89 + b90 + b91 + b93 + b94 + b95 + b115 + r0 + r5 + r6 + r7 + r8 + r10 + r11 + r14 + r16 + r17 + r18 + r19 + r22 + r25 + r26 + r29 + r30 + r31;

crc128_20= b1 + b4 + b5 + b10 + b12 + b13 + b17 + b19 + b21 + b22 + b24 + b25 + b27 + b29 + b30 + b31 + b36 + b37 + b38 + b39 + b40 + b41 + b44 + b45 + b47 + b48 + b50 + b51 + b52 + b54 + b55 + b59 + b62 + b64 + b67 + b68 + b69 + b70 + b71 + b75 + b78 + b79 + b80 + b81 + b83 + b86 + b91 + b92 + b94 + b95 + b116 + r2 + r3 + r5 + r6 + r7 + r8 + r10 + r14 + r19 + r20 + r22 + r23 + r24 + r25 + r26 + r29;

Fig. 27e crc128_21= b0 + b1 + b5 + b6 + b9 + b12 + b15 + b17 + b18 + b20 + b22 + b24 + b25 + b26 + b29 + b32 + b33 + b35 + b36 + b37 + b39 + b40 + b43 + b45 + b53 + b55 + b56 + b59 + b60 + b62 + b63 + b64 + b66 + b67 + b69 + b76 + b79 + b81 + b82 + b86 + b90 + b92 + b93 + b95 + b117 + r0 + r1 + r2 + r4 + r5 + r6 + r7 + r8 + r10 + r12 + r14 + r17 + r18 + r20 + r21 + r22 + r23 + r26 + r29 + r31;

crc128_22= b6 + b7 + b9 + b10 + b11 + b12 + b14 + b15 + b16 + b17 + b18 + b19 + b21 + b24 + b25 + b26 + b27 + b28 + b29 + b31 + b34 + b35 + b37 + b40 + b42 + b43 + b44 + b48 + b49 + b51 + b52 + b54 + b56 + b57 + b59 + b60 + b61 + b62 + b63 + b66 + b71 + b72 + b77 + b82 + b83 + b84 + b86 + b90 + b91 + b93 + b94 + b118 + r0 + r6 + r7 + r8 + r10 + r12 + r13 + r14 + r17 + r19 + r21 + r23 + r25 + r29 + r31;

crc128_23= b0 + b7 + b8 + b10 + b11 + b12 + b13 + b15 + b16 + b17 + b18 + b19 + b20 + b22 + b25 + b26 + b27 + b28 + b29 + b30 + b32 + b35 + b36 + b38 + b41 + b43 + b44 + b45 + b49 + b50 + b52 + b53 + b55 + b57 + b58 + b60 + b61 + b62 + b63 + b64 + b67 + b72 + b73 + b78 + b83 + b84 + b85 + b87 + b91 + b92 + b94 + b95 + b119 + r1 + r7 + r8 + r9 + r11 + r13 + r14 + r15 + r18 + r20 + r22 + r24 + r26 + r30;

crc128_24= b0 + b2 + b8 + b15 + b16 + b18 + b19 + b20 + b21 + b24 + b26 + b27 + b35 + b37 + b38 + b39 + b41 + b43 + b44 + b45 + b48 + b49 + b50 + b52 + b53 + b54 + b56 + b58 + b61 + b63 + b66 + b67 + b70 + b71 + b72 + b73 + b74 + b79 + b80 + b85 + b87 + b88 + b90 + b92 + b93 + b95 + b120 + r1 + r3 + r5 + r8 + r11 + r16 + r17 + r18 + r19 + r21 + r22 + r23 + r24 + r29 + r30;

crc128_25= b0 + b2 + b3 + b11 + b12 + b13 + b14 + b15 + b16 + b19 + b20 + b21 + b22 + b23 + b24 + b25 + b27 + b29 + b30 + b31 + b33 + b35 + b39 + b40 + b41 + b43 + b44 + b45 + b48 + b50 + b52 + b53 + b54 + b55 + b57 + b65 + b66 + b70 + b73 + b74 + b75 + b81 + b84 + b87 + b88 + b89 + b90 + b91 + b93 + b94 + b121 + r0 + r1 + r3 + r4 + r5 + r6 + r10 + r11 + r14 + r15 + r19 + r20 + r23 + r27 + r29;

Fig. 27f crc128_26= b1 + b3 + b4 + b12 + b13 + b14 + b15 + b16 + b17 + b20 + b21 + b22 + b23 + b24 + b25 + b26 + b28 + b30 + b31 + b32 + b34 + b36 + b40 + b41 + b42 + b44 + b45 + b46 + b49 + b51 + b53 + b54 + b55 + b56 + b58 + b66 + b67 + b71 + b74 + b75 + b76 + b82 + b85 + b88 + b89 + b90 + b91 + b92 + b94 + b95 + b122 + r0 + r1 + r2 + r4 + r5 + r6 + r7 + r11 + r12 + r15 + r16 + r20 + r21 + r24 + r28 + r30;

crc128_27= b0 + b1 + b4 + b5 + b9 + b11 + b12 + b16 + b18 + b21 + b22 + b25 + b26 + b27 + b28 + b30 + b32 + b36 + b37 + b38 + b45 + b47 + b48 + b49 + b50 + b51 + b54 + b55 + b56 + b57 + b62 + b64 + b65 + b66 + b70 + b71 + b75 + b76 + b77 + b80 + b83 + b84 + b87 + b89 + b91 + b92 + b93 + b95 + b123 + r0 + r6 + r7 + r8 + r9 + r10 + r11 + r13 + r14 + r15 + r16 + r18 + r21 + r24 + r27 + r30;

crc128_28= b0 + b5 + b6 + b9 + b10 + b11 + b14 + b15 + b19 + b22 + b24 + b26 + b27 + b30 + b35 + b36 + b37 + b39 + b41 + b42 + b43 + b50 + b55 + b56 + b57 + b58 + b59 + b62 + b63 + b64 + b68 + b70 + b76 + b77 + b78 + b80 + b81 + b85 + b86 + b87 + b88 + b92 + b93 + b94 + b124 + r2 + r3 + r5 + r7 + r8 + r16 + r18 + r19 + r24 + r27 + r28 + r29 + r30;

crc128_29= b1 + b6 + b7 + b10 + b11 + b12 + b15 + b16 + b20 + b23 + b25 + b27 + b28 + b31 + b36 + b37 + b38 + b40 + b42 + b43 + b44 + b51 + b56 + b57 + b58 + b59 + b60 + b63 + b64 + b65 + b69 + b71 + b77 + b78 + b79 + b81 + b82 + b86 + b87 + b88 + b89 + b93 + b94 + b95 + b125 + r0 + r3 + r4 + r6 + r8 + r9 + r17 + r19 + r20 + r25 + r28 + r29 + r30 + r31;

crc128_30= b1 + b7 + b8 + b9 + b14 + b15 + b16 + b21 + b23 + b26 + b30 + b31 + b32 + b33 + b35 + b36 + b37 + b39 + b42 + b44 + b45 + b46 + b48 + b49 + b51 + b57 + b58 + b60 + b61 + b62 + b67 + b68 + b71 + b78 + b79 + b82 + b83 + b84 + b86 + b88 + b89 + b94 + b95 + b126 + r2 + r3 + r4 + r7 + r11 + r12 + r14 + r15 + r17 + r20 + r21 + r22 + r24 + r25 + r26 + r27;

crc128_31= b0 + b1 + b8 + b10 + b11 + b12 + b13 + b14 + b16 + b22 + b23 + b27 + b28 + b29 + b30 + b32 + b34 + b35 + b37 + b40 + b41 + b42 + b45 + b47 + b48 + b50 + b51 + b58 + b61 + b63 + b64 + b65 + b66 + b67 + b69 + b70 + b71 + b79 + b83 + b85 + b86 + b89 + b95 + b127 + r0 + r1 + r2 + r4 + r8 + r9 + r10 + r11 + r13 + r14 + r16 + r17 + r21 + r23 + r24 + r26 + r28 + r29 + r30 + r31;

Fig. 29a crc40_0= a0 + r3 + r6 + r8 + r9 + r10 + r11 + r12 + r14 + r15 + r16 + r24 + r28 + r30 + r31;

crc40_1= a1 + r4 + r7 + r9 + r10 + r11 + r12 + r13 + r15 + r16 + r17 + r25 + r29 + r31;

crc40_2= a2 + r5 + r8 + r10 + r11 + r12 + r13 + r14 + r16 + r17 + r18 + r26 + r30;

crc40_3= a3 + r6 + r9 + r11 + r12 + r13 + r14 + r15 + r17 + r18 + r19 + r27 + r31;

crc40_4= a4 + r0 + r7 + r10 + r12 + r13 + r14 + r15 + r16 + r18 + r19 + r20 + r28;

crc40_5= a5 + r0 + r1 + r8 + r11 + r13 + r14 + r15 + r16 + r17 + r19 + r20 + r21 + r29;

crc40_6= a6 + r1 + r2 + r3 + r6 + r8 + r10 + r11 + r17 + r18 + r20 + r21 + r22 + r24 + r28 + r31;

crc40_7= a7 + r0 + r2 + r3 + r4 + r7 + r9 + r11 + r12 + r18 + r19 + r21 + r22 + r23 + r25 + r29;

crc40_8= a8 + r0 + r1 + r3 + r4 + r5 + r8 + r10 + r12 + r13 + r19 + r20 + r22 + r23 + r24 + r26 + r30;

crc40_9= a9 + r1 + r2 + r3 + r4 + r5 + r8 + r10 + r12 + r13 + r15 + r16 + r20 + r21 + r23 + r25 + r27 + r28 + r30;

crc40_10= a10 + r2 + r4 + r5 + r8 + r10 + r12 + r13 + r15 + r17 + r21 + r22 + r26 + r29 + r30;

crc40_11= a11 + r0 + r3 + r5 + r6 + r9 + r11 + r13 + r14 + r16 + r18 + r22 + r23 + r27 + r30 + r31;

crc40_12= a12 + r1 + r4 + r6 + r7 + r10 + r12 + r14 + r15 + r17 + r19 + r23 + r24 + r28 + r31;

crc40_13= a13 + r0 + r2 + r5 + r7 + r8 + r11 + r13 + r15 + r16 + r18 + r20 + r24 + r25 + r29;

Fig. 29b crc40_14= a14 + r1 + r3 + r6 + r8 + r9 + r12 + r14 + r16 + r17 + r19 + r21 + r25 + r26 + r30;

crc40_15= a15 + r2 + r4 + r7 + r9 + r10 + r13 + r15 + r17 + r18 + r20 + r22 + r26 + r27 + r31;

crc40_16= a16 + r5 + r6 + r9 + r12 + r15 + r18 + r19 + r21 + r23 + r24 + r27 + r30 + r31;

crc40_17= a17 + r6 + r7 + r10 + r13 + r16 + r19 + r20 + r22 + r24 + r25 + r28 + r31;

crc40_18= a18 + r7 + r8 + r11 + r14 + r17 + r20 + r21 + r23 + r25 + r26 + r29;

crc40_19= a19 + r8 + r9 + r12 + r15 + r18 + r21 + r22 + r24 + r26 + r27 + r30;

crc40_20= a20 + r3 + r6 + r8 + r11 + r12 + r13 + r14 + r15 + r19 + r22 + r23 + r24 + r25 + r27 + r30;

crc40_21= a21 + r0 + r3 + r4 + r6 + r7 + r8 + r10 + r11 + r13 + r20 + r23 + r25 + r26 + r30;

crc40_22= a22 + r0 + r1 + r3 + r4 + r5 + r6 + r7 + r10 + r15 + r16 + r21 + r26 + r27 + r28 + r30;

crc40_23= a23 + r1 + r2 + r4 + r5 + r6 + r7 + r8 + r11 + r16 + r17 + r22 + r27 + r28 + r29 + r31;

crc40_24= a24 + r0 + r2 + r5 + r7 + r10 + r11 + r14 + r15 + r16 + r17 + r18 + r23 + r24 + r29 + r31;

crc40_25= a25 + r1 + r9 + r10 + r14 + r17 + r18 + r19 + r25 + r28 + r31;

crc40_26= a26 + r0 + r2 + r10 + r11 + r15 + r18 + r19 + r20 + r26 + r29;

crc40_27= a27 + r0 + r1 + r6 + r8 + r9 + r10 + r14 + r15 + r19 + r20 + r21 + r24 + r27 + r28 + r31;

Fig. 29c crc40_28= a28 + r0 + r1 + r2 + r3 + r6 + r7 + r8 + r12 + r14 + r20 + r21 + r22 + r24 + r25 + r29 + r30 + r31;

crc40_29= a29 + r0 + r1 + r2 + r3 + r4 + r7 + r8 + r9 + r13 + r15 + r21 + r22 + r23 + r25 + r26 + r30 + r31;

crc40_30= a30 + r1 + r2 + r4 + r5 + r6 + r11 + r12 + r15 + r22 + r23 + r26 + r27 + r28 + r30;

crc40_31= a31 + r2 + r5 + r7 + r8 + r9 + r10 + r11 + r13 + r14 + r15 + r23 + r27 + r29 + r30;

Fig. 31a crc48_0= a0 + r0 + r1 + r3 + r4 + r11 + r14 + r16 + r17 + r18 + r19 + r20 + r22 + r23 + r24;

crc48_1= a1 + r1 + r2 + r4 + r5 + r12 + r15 + r17 + r18 + r19 + r20 + r21 + r23 + r24 + r25;

crc48_2= a2 + r0 + r2 + r3 + r5 + r6 + r13 + r16 + r18 + r19 + r20 + r21 + r22 + r24 + r25 + r26;

crc48_3= a3 + r1 + r3 + r4 + r6 + r7 + r14 + r17 + r19 + r20 + r21 + r22 + r23 + r25 + r26 + r27;

crc48_4= a4 + r2 + r4 + r5 + r7 + r8 + r15 + r18 + r20 + r21 + r22 + r23 + r24 + r26 + r27 + r28;

crc48_5= a5 + r0 + r3 + r5 + r6 + r8 + r9 + r16 + r19 + r21 + r22 + r23 + r24 + r25 + r27 + r28 + r29;

crc48_6= a6 + r3 + r6 + r7 + r9 + r10 + r11 + r14 + r16 + r18 + r19 + r25 + r26 + r28 + r29 + r30;

crc48_7= a7 + r0 + r4 + r7 + r8 + r10 + r11 + r12 + r15 + r17 + r19 + r20 + r26 + r27 + r29 + r30 + r31;

crc48_8= a8 + r0 + r1 + r5 + r8 + r9 + r11 + r12 + r13 + r16 + r18 + r20 + r21 + r27 + r28 + r30 + r31;

crc48_9= a9 + r0 + r2 + r3 + r4 + r6 + r9 + r10 + r11 + r12 + r13 + r16 + r18 + r20 + r21 + r23 + r24 + r28 + r29 + r31;

crc48_10= a10 + r5 + r7 + r10 + r12 + r13 + r16 + r18 + r20 + r21 + r23 + r25 + r29 + r30;

crc48_11= a11 + r6 + r8 + r11 + r13 + r14 + r17 + r19 + r21 + r22 + r24 + r26 + r30 + r31;

crc48_12= a12 + r0 + r7 + r9 + r12 + r14 + r15 + r18 + r20 + r22 + r23 + r25 + r27 + r31;

Fig. 31b crc48_13= a13 + r1 + r8 + r10 + r13 + r15 + r16 + r19 + r21 + r23 + r24 + r26 + r28;

crc48_14= a14 + r0 + r2 + r9 + r11 + r14 + r16 + r17 + r20 + r22 + r24 + r25 + r27 + r29;

crc48_15= a15 + r0 + r1 + r3 + r10 + r12 + r15 + r17 + r18 + r21 + r23 + r25 + r26 + r28 + r30;

crc48_16= a16 + r2 + r3 + r13 + r14 + r17 + r20 + r23 + r26 + r27 + r29 + r31;

crc48_17= a17 + r3 + r4 + r14 + r15 + r18 + r21 + r24 + r27 + r28 + r30;

crc48_18= a18 + r0 + r4 + r5 + r15 + r16 + r19 + r22 + r25 + r28 + r29 + r31;

crc48_19= a19 + r0 + r1 + r5 + r6 + r16 + r17 + r20 + r23 + r26 + r29 + r30;

crc48_20= a20 + r0 + r2 + r3 + r4 + r6 + r7 + r11 + r14 + r16 + r19 + r20 + r21 + r22 + r23 + r27 + r30 + r31;

crc48_21= a21 + r5 + r7 + r8 + r11 + r12 + r14 + r15 + r16 + r18 + r19 + r21 + r28 + r31;

crc48_22= a22 + r0 + r1 + r3 + r4 + r6 + r8 + r9 + r11 + r12 + r13 + r14 + r15 + r18 + r23 + r24 + r29;

crc48_23= a23 + r1 + r2 + r4 + r5 + r7 + r9 + r10 + r12 + r13 + r14 + r15 + r16 + r19 + r24 + r25 + r30;

crc48_24= a24 + r0 + r1 + r2 + r4 + r5 + r6 + r8 + r10 + r13 + r15 + r18 + r19 + r22 + r23 + r24 + r25 + r26 + r31;

crc48_25= a25 + r0 + r2 + r4 + r5 + r6 + r7 + r9 + r17 + r18 + r22 + r25 + r26 + r27;

crc48_26= a26 + r1 + r3 + r5 + r6 + r7 + r8 + r10 + r18 + r19 + r23 + r26 + r27 + r28;

Fig. 31c crc48_27= a27 + r0 + r1 + r2 + r3 + r6 + r7 + r8 + r9 + r14 + r16 + r17 + r18
+ r22 + r23 + r27 + r28 + r29;

crc48_28= a28 + r2 + r7 + r8 + r9 + r10 + r11 + r14 + r15 + r16 + r20 + r22
+ r28 + r29 + r30;

crc48_29= a29 + r3 + r8 + r9 + r10 + r11 + r12 + r15 + r16 + r17 + r21 + r23
+ r29 + r30 + r31;

crc48_30= a30 + r0 + r1 + r3 + r9 + r10 + r12 + r13 + r14 + r19 + r20 + r23
+ r30 + r31;

crc48_31= a31 + r0 + r2 + r3 + r10 + r13 + r15 + r16 + r17 + r18 + r19 + r21
+ r22 + r23 + r31;

Fig. 33a crc56_0= a0 + r1 + r2 + r3 + r6 + r8 + r9 + r11 + r12 + r19 + r22 + r24 + r25 + r26 + r27 + r28 + r30 + r31;

crc56_1= a1 + r2 + r3 + r4 + r7 + r9 + r10 + r12 + r13 + r20 + r23 + r25 + r26 + r27 + r28 + r29 + r31;

crc56_2= a2 + r0 + r3 + r4 + r5 + r8 + r10 + r11 + r13 + r14 + r21 + r24 + r26 + r27 + r28 + r29 + r30;

crc56_3= a3 + r1 + r4 + r5 + r6 + r9 + r11 + r12 + r14 + r15 + r22 + r25 + r27 + r28 + r29 + r30 + r31;

crc56_4= a4 + r0 + r2 + r5 + r6 + r7 + r10 + r12 + r13 + r15 + r16 + r23 + r26 + r28 + r29 + r30 + r31;

crc56_5= a5 + r0 + r1 + r3 + r6 + r7 + r8 + r11 + r13 + r14 + r16 + r17 + r24 + r27 + r29 + r30 + r31;

crc56_6= a6 + r3 + r4 + r6 + r7 + r11 + r14 + r15 + r17 + r18 + r19 + r22 + r24 + r26 + r27;

crc56_7= a7 + r0 + r4 + r5 + r7 + r8 + r12 + r15 + r16 + r18 + r19 + r20 + r23 + r25 + r27 + r28;

crc56_8= a8 + r0 + r1 + r5 + r6 + r8 + r9 + r13 + r16 + r17 + r19 + r20 + r21 + r24 + r26 + r28 + r29;

crc56_9= a9 + r0 + r3 + r7 + r8 + r10 + r11 + r12 + r14 + r17 + r18 + r19 + r20 + r21 + r24 + r26 + r28 + r29 + r31;

crc56_10= a10 + r2 + r3 + r4 + r6 + r13 + r15 + r18 + r20 + r21 + r24 + r26 + r28 + r29 + r31;

crc56_11= a11 + r0 + r3 + r4 + r5 + r7 + r14 + r16 + r19 + r21 + r22 + r25 + r27 + r29 + r30;

crc56_12= a12 + r1 + r4 + r5 + r6 + r8 + r15 + r17 + r20 + r22 + r23 + r26 + r28 + r30 + r31;

Fig. 33b crc56_13= a13 + r2 + r5 + r6 + r7 + r9 + r16 + r18 + r21 + r23 + r24 + r27 + r29 + r31;

crc56_14= a14 + r3 + r6 + r7 + r8 + r10 + r17 + r19 + r22 + r24 + r25 + r28 + r30;

crc56_15= a15 + r4 + r7 + r8 + r9 + r11 + r18 + r20 + r23 + r25 + r26 + r29 + r31;

crc56_16= a16 + r0 + r1 + r2 + r3 + r5 + r6 + r10 + r11 + r21 + r22 + r25 + r28 + r31;

crc56_17= a17 + r0 + r1 + r2 + r3 + r4 + r6 + r7 + r11 + r12 + r22 + r23 + r26 + r29;

crc56_18= a18 + r0 + r1 + r2 + r3 + r4 + r5 + r7 + r8 + r12 + r13 + r23 + r24 + r27 + r30;

crc56_19= a19 + r1 + r2 + r3 + r4 + r5 + r6 + r8 + r9 + r13 + r14 + r24 + r25 + r28 + r31;

crc56_20= a20 + r0 + r1 + r4 + r5 + r7 + r8 + r10 + r11 + r12 + r14 + r15 + r19 + r22 + r24 + r27 + r28 + r29 + r30 + r31;

crc56_21= a21 + r0 + r3 + r5 + r13 + r15 + r16 + r19 + r20 + r22 + r23 + r24 + r26 + r27 + r29;

crc56_22= a22 + r0 + r2 + r3 + r4 + r8 + r9 + r11 + r12 + r14 + r16 + r17 + r19 + r20 + r21 + r22 + r23 + r26 + r31;

crc56_23= a23 + r1 + r3 + r4 + r5 + r9 + r10 + r12 + r13 + r15 + r17 + r18 + r20 + r21 + r22 + r23 + r24 + r27;

crc56_24= a24 + r1 + r3 + r4 + r5 + r8 + r9 + r10 + r12 + r13 + r14 + r16 + r18 + r21 + r23 + r26 + r27 + r30 + r31;

crc56_25= a25 + r0 + r1 + r3 + r4 + r5 + r8 + r10 + r12 + r13 + r14 + r15 + r17 + r25 + r26 + r30;

crc56_26= a26 + r0 + r1 + r2 + r4 + r5 + r6 + r9 + r11 + r13 + r14 + r15 + r16 + r18 + r26 + r27 + r31;

Fig. 33c crc56_27= a27 + r5 + r7 + r8 + r9 + r10 + r11 + r14 + r15 + r16 + r17 + r22 + r24 + r25 + r26 + r30 + r31;

crc56_28= a28 + r1 + r2 + r3 + r10 + r15 + r16 + r17 + r18 + r19 + r22 + r23 + r24 + r28 + r30;

crc56_29= a29 + r0 + r2 + r3 + r4 + r11 + r16 + r17 + r18 + r19 + r20 + r23 + r24 + r25 + r29 + r31;

crc56_30= a30 + r2 + r4 + r5 + r6 + r8 + r9 + r11 + r17 + r18 + r20 + r21 + r22 + r27 + r28 + r31;

crc56_31= a31 + r0 + r1 + r2 + r5 + r7 + r8 + r10 + r11 + r18 + r21 + r23 + r24 + r25 + r26 + r27 + r29 + r30 + r31;

Fig. 35a crc64_0= a0 + r1 + r3 + r4 + r6 + r9 + r10 + r11 + r14 + r16 + r17 + r19 + r20 + r27 + r30;

crc64_1= a1 + r0 + r2 + r4 + r5 + r7 + r10 + r11 + r12 + r15 + r17 + r18 + r20 + r21 + r28 + r31;

crc64_2= a2 + r0 + r1 + r3 + r5 + r6 + r8 + r11 + r12 + r13 + r16 + r18 + r19 + r21 + r22 + r29;

crc64_3= a3 + r0 + r1 + r2 + r4 + r6 + r7 + r9 + r12 + r13 + r14 + r17 + r19 + r20 + r22 + r23 + r30;

crc64_4= a4 + r0 + r1 + r2 + r3 + r5 + r7 + r8 + r10 + r13 + r14 + r15 + r18 + r20 + r21 + r23 + r24 + r31;

crc64_5= a5 + r1 + r2 + r3 + r4 + r6 + r8 + r9 + r11 + r14 + r15 + r16 + r19 + r21 + r22 + r24 + r25;

crc64_6= a6 + r1 + r2 + r5 + r6 + r7 + r11 + r12 + r14 + r15 + r19 + r22 + r23 + r25 + r26 + r27 + r30;

crc64_7= a7 + r0 + r2 + r3 + r6 + r7 + r8 + r12 + r13 + r15 + r16 + r20 + r23 + r24 + r26 + r27 + r28 + r31;

crc64_8= a8 + r1 + r3 + r4 + r7 + r8 + r9 + r13 + r14 + r16 + r17 + r21 + r24 + r25 + r27 + r28 + r29;

crc64_9= a9 + r1 + r2 + r3 + r5 + r6 + r8 + r11 + r15 + r16 + r18 + r19 + r20 + r22 + r25 + r26 + r27 + r28 + r29;

crc64_10= a10 + r1 + r2 + r7 + r10 + r11 + r12 + r14 + r21 + r23 + r26 + r28 + r29;

crc64_11= a11 + r2 + r3 + r8 + r11 + r12 + r13 + r15 + r22 + r24 + r27 + r29 + r30;

crc64_12= a12 + r3 + r4 + r9 + r12 + r13 + r14 + r16 + r23 + r25 + r28 + r30 + r31;

crc64_13= a13 + r4 + r5 + r10 + r13 + r14 + r15 + r17 + r24 + r26 + r29 + r31;

Fig. 35b crc64_14= a14 + r5 + r6 + r11 + r14 + r15 + r16 + r18 + r25 + r27 + r30;

crc64_15= a15 + r6 + r7 + r12 + r15 + r16 + r17 + r19 + r26 + r28 + r31;

crc64_16= a16 + r1 + r3 + r4 + r6 + r7 + r8 + r9 + r10 + r11 + r13 + r14 + r18 + r19 + r29 + r30;

crc64_17= a17 + r0 + r2 + r4 + r5 + r7 + r8 + r9 + r10 + r11 + r12 + r14 + r15 + r19 + r20 + r30 + r31;

crc64_18= a18 + r1 + r3 + r5 + r6 + r8 + r9 + r10 + r11 + r12 + r13 + r15 + r16 + r20 + r21 + r31;

crc64_19= a19 + r0 + r2 + r4 + r6 + r7 + r9 + r10 + r11 + r12 + r13 + r14 + r16 + r17 + r21 + r22;

crc64_20= a20 + r4 + r5 + r6 + r7 + r8 + r9 + r12 + r13 + r15 + r16 + r18 + r19 + r20 + r22 + r23 + r27 + r30;

crc64_21= a21 + r0 + r1 + r3 + r4 + r5 + r7 + r8 + r11 + r13 + r21 + r23 + r24 + r27 + r28 + r30 + r31;

crc64_22= a22 + r2 + r3 + r5 + r8 + r10 + r11 + r12 + r16 + r17 + r19 + r20 + r22 + r24 + r25 + r27 + r28 + r29 + r30 + r31;

crc64_23= a23 + r0 + r3 + r4 + r6 + r9 + r11 + r12 + r13 + r17 + r18 + r20 + r21 + r23 + r25 + r26 + r28 + r29 + r30 + r31;

crc64_24= a24 + r3 + r5 + r6 + r7 + r9 + r11 + r12 + r13 + r16 + r17 + r18 + r20 + r21 + r22 + r24 + r26 + r29 + r31;

crc64_25= a25 + r1 + r3 + r7 + r8 + r9 + r11 + r12 + r13 + r16 + r18 + r20 + r21 + r22 + r23 + r25;

crc64_26= a26 + r0 + r2 + r4 + r8 + r9 + r10 + r12 + r13 + r14 + r17 + r19 + r21 + r22 + r23 + r24 + r26;

crc64_27= a27 + r0 + r4 + r5 + r6 + r13 + r15 + r16 + r17 + r18 + r19 + r22 + r23 + r24 + r25 + r30;

Fig. 35c crc64_28= a28 + r3 + r4 + r5 + r7 + r9 + r10 + r11 + r18 + r23 + r24 + r25 + r26 + r27 + r30 + r31;

crc64_29= a29 + r4 + r5 + r6 + r8 + r10 + r11 + r12 + r19 + r24 + r25 + r26 + r27 + r28 + r31;

crc64_30= a30 + r0 + r1 + r3 + r4 + r5 + r7 + r10 + r12 + r13 + r14 + r16 + r17 + r19 + r25 + r26 + r28 + r29 + r30;

crc64_31= a31 + r0 + r2 + r3 + r5 + r8 + r9 + r10 + r13 + r15 + r16 + r18 + r19 + r26 + r29 + r31;

Fig. 36a

```
(*Generate or check CRC using 64-bit calculation*)
Clear[lookAhead64];
lookAhead64[b_]:=Module[{
a={}, (*Intermediate result*)
curcrc=Reverse[fromHex[{9,2,2,6,f,5,6,2}]]/.{1->True,0->False},
dataword={}, (*current data word*)
crcout={}, (*current CRC*)
pointer=0, (*Pointer into stream*)
len=Mod[Length[b]/8,8], (*Number of bytes in last word*)
j},

(*Load pipeline*)
dataword=Take[b,{pointer+1,pointer+64}]; (*Get first longword*)
a=crc64a[dataword]; (*calculate intermediate*)
curcrc=crc64b[curcrc,a]; (*iterate crc*)
pointer+=64; (*iterate pointer*)

(*Process on double longword boundary*)
While[(pointer+64)<=Length[b],
dataword=Take[b,{pointer+1,pointer+64}]; (*Get next longword*)
a=crc64a[dataword]; (*iterate intermediate*)
curcrc=crc64b[curcrc,a]; (*iterate crc*)
pointer+=64
];

(*Get the next bytes, if any and fill to boundary*)
dataword=Take[b,{pointer+1,Length[b]}];
dataword=Join[dataword,Table[False,{j,1,64-len*8}]];

If[Quotient[len+4,8]==1, (*Add extra long word to packet*)
a=crc64a[dataword]; (*calculate intermediate*)
curcrc=crc64b[curcrc,a]; (*iterate crc*)
];
len=Mod[len+4,8]; (*New Length*)
```

Fig. 36b

```
(*Terminate on byte boundary*)
Switch[len,
            0,crcout=curcrc,
            1,crcout=crc8x[curcrc,Table[False,{j,1,8}]],
            2,crcout=crc16x[curcrc,Table[False,{j,1,16}]],
            3,crcout=crc24x[curcrc,Table[False,{j,1,24}]],
            4,crcout=crc32x[curcrc,Table[False,{j,1,32}]],
            5,a=crc40a[dataword];
             crcout=crc40b[curcrc,a],
            6,a=crc48a[dataword];
             crcout=crc48b[curcrc,a],
            7,a=crc56a[dataword];
             crcout=crc56b[curcrc,a]
   ];

Return[crcout]
];
```

203226

HIGH SPEED GENERATION AND CHECKING OF CYCLIC REDUNDANCY CHECK VALUES

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

Cyclic Redundancy Check (CRC) is a well-known error detection and correction technique used in many transmission and storage systems. A number of redundant bits are added to a message or data block, so that errors occurring during transmission or storage can be detected and, possibly, corrected. The degree of error detection is a function of the size of the message or data block, and the particular CRC.

One common CRC used in Local Area Networks (LANs) is defined for the ANSI/IEEE Std. 802 family of LAN standards. In that standard, a 4-octet (32-bit) CRC value is loaded into the Frame Check Sequence (FCS) field of a data unit or packet when it is transmitted. The value is computed as a function of the contents of the data unit. The k bits of data covered by the FCS can be represented as a polynomial f(x) of degree k−1. For example:

$f(x)=10100100=x^7+x^5+x^2$ $f(x)=000\ldots010100100=x^7+x^5+x^2$ $f(x)=101001=x^5+x^3+1$ The specific encoding of the CRC value for ANSI/IEEE 802 is defined by the following generating polynomial:

$$G(x)=x^{32}+x^{26}+x^{23}+x^{22}+x^{16}+x^{12}+x^{11}+x^{10}+x^8+x^7+x^5+x^4+x^2+x+1$$

In existing ASNI/IEEE systems, the CRC value corresponding to a given data unit is formed by the following procedure:

(1) The first 32 bits of the data unit are complemented.

(2) The k bits of the data unit are then considered to be coefficients of a polynomial f*(x) of degree k=1.

(3) f*(x) is multiplied by $x^{32}$ and divided by G(x) using modula-2 arithmetic, producing a remainder R(x) of degree less than or equal to 31.

(4) The coefficients of R(x) are considered to be a 32-bit sequence.

(5) The bit sequence is complemented and the result is the CRC value placed in the FCS field.

Steps 1 and 5 allow detection of missing or added zero bits at the beginning of a message. The necessary polynomial division in (3) has a well-known recursive form that processes each bit of the message serially and can be implemented simply in hardware using a linear feedback shift register (LFSR) formed by exclusive-OR gates to perform divisions and registers to hold intermediate results. However, such a serial implementation becomes impractical as data rates increase because only one bit of the message is processed at a time. When the data rate becomes sufficiently high, the serial form cannot generate or check the CRC value of a message within the time it takes to transmit the message. Accordingly, CRC related processing becomes an unacceptable bottleneck on message throughput.

To address this problem, some existing systems have introduced a level of parallelism into CRC processing. These systems have extended the serial implementation to process several bits of the message in parallel, based on a modified recursive equation. The standard parallel CRC method is described in U.S. Pat. No. 4,593,393 of Mead et al., filed Feb. 6, 1984, and U.S. Pat. No. 5,103,451 of Fossey, filed Jan. 29, 1990. However, this standard parallel approach cannot process many bits in parallel because the number of terms in the logic equations it implements becomes excessively large. As a result, many exclusive-OR gates are required, causing the system to run too slow, and which further occupy too much area on a chip and consume too much power. In addition, the standard parallel approach suffers from limited performance due to a low degree of pipelining in its processing.

As the number of bits being processed in parallel increases, the number of message bits covered by the CRC may not always be exactly divisible by the number of bits being processed in parallel. Existing systems for CRC value generation have not addressed this problem, since such existing systems have typically processed 8 bits in parallel, and the messages covered by the CRC value are typically guaranteed to contain an integer number of octets or bytes (8 bit units).

Accordingly it would be desirable to have a system for generating and checking a CRC value that processes many bits in parallel without requiring excessive numbers of exclusive-OR gates. The system should be compatible with existing CRC generation and checking standards, and apply to systems for error detection and correction in communications and storage applications.

Further, a system is needed to provide additional pipelining in the processing of CRC values. In addition, a system is required that enables CRC checking to be performed on messages that are not equally divisible by the number of bits being processed in parallel.

BRIEF SUMMARY OF THE INVENTION

A parallel, recursive system for generating a CRC value for a unit of data is disclosed, in which the feedback and forward terms are separated, and the forward terms are reduced. The unit of data may be either a portion of a data unit that is to be transmitted onto a communications network, a portion of a unit of data that has been received from a communications network, or a data block that has been either read or is to be written to a storage device such as a magnetic disk.

A forward logic block, which implements the forward terms, is responsive to a number of bits received from the unit of data, and operates to perform logic operations based on the reduced forward logic terms on the bits received from the unit of data, in order to produce a first output. In an illustrative embodiment in which the number of bits being processed in parallel, also referred to as the size of the portion of the unit of data, is less than or equal to the size of the CRC value, then the forward logic block is a direct connection to a number of exclusive-OR logic gates.

A feedback logic block, responsive to an output of a remainder register, operates to perform logic operations based on the feedback terms on an output of the remainder register to produce a second output. The second output is also coupled to the exclusive-OR logic gates.

The exclusive-OR logic gates perform a bit-wise exclusive-OR logic operation on the first output and the second output to produce a third output. The third output is coupled to an input of the remainder register.

In an exemplary embodiment, a first pipeline register receives the first output, and the exclusive-OR logic performs the bit-wise exclusive-OR logic operation on the second output and an output of the first pipeline register, instead of on the first output and.the second output. A second pipeline register, having the bits from the data unit as an input, further has an output coupled to a first input of a multiplexer. The multiplexer has a second input coupled to the output of the remainder register. The multiplexer is controlled to select the output of the remainder register in the event that all bits of the data unit have been processed by the first logic block and the second logic block. Otherwise, the multiplexer is controlled to select the bits from the unit of data. This has the effect of appending the CRC or FCS to the message.

In another embodiment, an inverter coupled is coupled to the output of the remainder register, to allow for CRC values with CRC bits inverted.

In another embodiment, the forward logic block determines the first output to be the remainder of the division of a polynomial a(x), by a predetermined generating polynomial G(X), where a(x) corresponds to a subsequence of the unit of data, and wherein a(x) is a polynomial of size j−1, where j is equal to a number of bits of the data unit being processed in parallel. The coefficients of a(x) correspond to the bits of the data unit. The feedback logic block determines the second output to be the remainder of the division of a product polynomial by a predetermined generator polynomial G(X), wherein the product polynomial is the result of multiplying the polynomial r(x) by $x^j$, which has the effect of shifting r(x) by j bits in the direction of more significant bits. The coefficients of the polynomial of r(x) correspond to the bits of the remainder register.

In another embodiment, the remainder register is initialized to a predetermined value I(x). I(x) is selected such that the output of said second logic block is all ones (is) in the case where I(x) is an input to said second logic block. I(x) is equal to the hexadecimal value 9226F562 if the generator polynomial is equal to the generator polynomial defined for LANs in IEEE 802. This aspect of the invention is distinct over existing systems in which pre-loading of any result or remainder registers uses an initial value of all is 1s or all 0s.

Thus, a system is disclosed for generating and checking a CRC value that processes many bits in parallel without requiring excessive numbers of exclusive-OR gates. The disclosed system is compatible with existing CRC generation and checking standards, and applies to systems for error detection and correction in communications and storage applications. Further, the disclosed system provides increased pipelining in the processing of CRC values. The disclosed system also enables CRC checking to be performed on messages that are not equally divisible by the number of bits being processed in parallel.

BRIEF DESCRIPTION OF THE SEVERAL VIEWS OF THE DRAWING

The invention will be more fully understood by reference to the following detailed description of the invention in conjunction with the drawings, of which:

FIGS. 12*a* and 12*b* show logic equations of a 32-bit CRC value generator-checker logic module for processing 8 bits in parallel;

FIGS. 13*a* and 13*b* show logic equations of a 32-bit CRC value generator-checker logic module for processing 16 bits in parallel;

FIGS. 14*a* and 14*b* show logic equations of a 32-bit CRC value generator-checker logic module for processing 24 bits in parallel;

FIGS. 15*a*, 15*b*, and 15*c* show logic equations of a 32-bit CRC value generator-checker logic module for processing 32 bits in parallel;

FIGS. 16*a*, 16*b*, and 16*c* show logic equations of a 32-bit CRC value generator-checker logic module for processing 40 bits in parallel;

FIGS. 17*a*, 17*b*, and 17*c* show logic equations of a 32-bit CRC value generator-checker logic module for processing 48 bits in parallel;

FIGS. 18*a*, 18*b*, 18*c*, and 18*d* show logic equations of a 32-bit CRC value generator-checker logic module for processing 56 bits in parallel;

FIGS. 19*a*, 19*b*, 19*c*, and 19*d* show logic equations of a 32-bit CRC value generator-checker logic module for processing 64 bits in parallel;

FIGS. 20*a*, 20*b*, 20*c*, and 20*d* show logic equations of a 32-bit CRC value generator-checker logic module for processing 72 bits in parallel;

FIGS. 21*a*, 21*b*, 21*c*, and 21*d* show logic equations of a 32-bit CRC value generator-checker logic module for processing 80 bits in parallel;

FIGS. 22*a*, 22*b*, 22*c*, 22*d*, and 22*e* show logic equations of a 32-bit CRC value generator-checker logic module for processing 88 bits in parallel;

FIGS. 23*a*, 23*b*, 23*c*, 23*d*, and 23*e* show logic equations of a 32-bit CRC value generator-checker logic module for processing 96 bits in parallel;

FIGS. 24*a*, 24*b*, 24*c*, 24*d*, and 24*e* show logic equations of a 32-bit CRC value generator-checker logic module for processing 104 bits in parallel;

FIGS. 25*a*, 25*b*, 25*c*, 25*d*, and 25*e* show logic equations of a 32-bit CRC value generator-checker logic module for processing 112 bits in parallel;

FIGS. 26*a*, 26*b*, 26*c*, 26*d*, 26*e*, and 26*f* show logic equations of a 32-bit CRC value generator-checker logic module for processing 120 bits in parallel;

FIGS. 27*a*, 27*b*, 27*c*, 27*d*, 27*e*, and 27*f* show logic equations of a 32-bit CRC value generator-checker logic module for processing 128 bits in parallel;

FIGS. 28*a* and 28*b* show logic equations of a first embodiment of a pipelined 32-bit CRC generator-checker logic module for processing 40 bits in parallel;

FIGS. 29*a*, 29*b*, and 29*c* show logic equations for a second embodiment of a pipelined 32-bit CRC value generator-checker logic module for processing 40 bits in parallel;

FIGS. 30*a* and 30*b* show logic equations of a first embodiment of a pipelined 32-bit CRC value generator-checker logic module for processing 48 bits in parallel;

FIGS. 31*a*, 31*b*, and 31*c* show logic equations of a second embodiment of a pipelined 32-bit CRC value generator-checker logic module for processing 48 bits in parallel;

FIGS. 32*a* and 32*b* show logic equations for a first embodiment of a pipelined 32-bit CRC value generator-checker logic module for processing 56 bits in parallel;

FIGS. 33*a*, 33*b*, and 33*c* show logic equations of a second embodiment of a pipelined 32-bit CRC value generator-checker logic module for processing 56 bits in parallel;

FIGS. 34*a*, 34*b*, and 34*c* show logic equations of a first embodiment of a pipelined 32-bit CRC value generator-checker logic module for processing 64 bits in parallel;

FIGS. 35*a*, 35*b*, and 35*c* show logic equations of a second embodiment of a pipelined 32-bit CRC value generator-checker logic module for processing 64 bits in parallel; and FIGS. 36*a* and 36*b* show an executable model of a 64-bit pipelined CRC value generator-checker circuit.

DETAILED DESCRIPTION OF THE INVENTION

Figure 1:
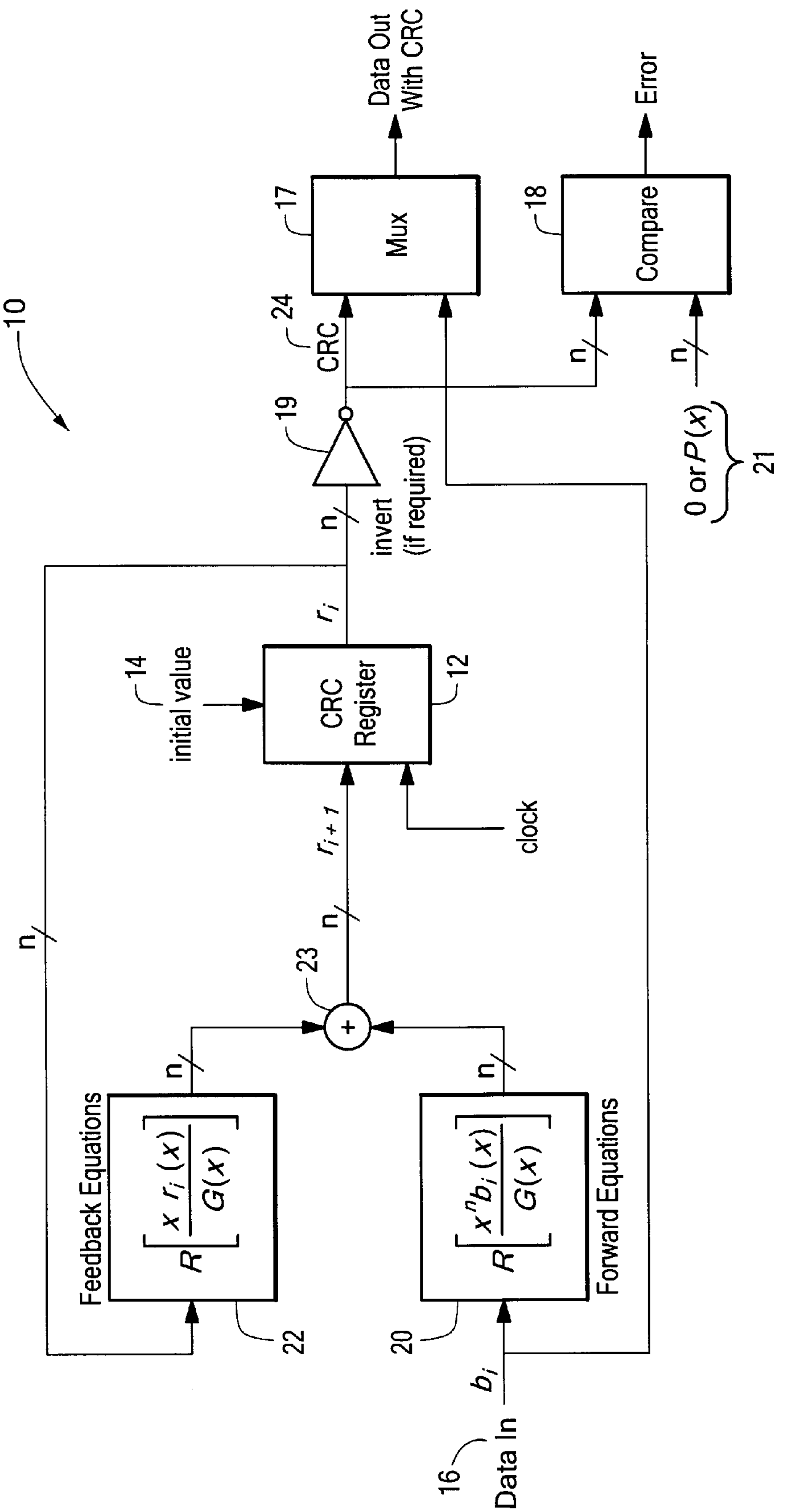
FIG. 1 shows a serial CRC value generator and checker.

1) CRC Fundamentals Using Modula-2 Polynomial Division

A message to be covered by CRC protection forms a list of k bits, $b_0, b_1, b_{k-2}, \ldots, b_{k-1}$. By convention, $b_0$ is the first bit to be transmitted in a serial transmission system. The bits of the message can be represented as a polynomial, f(x), which has degree k−1 and is written as:

$$f(x)=b_0x^{k-1}+b_1x^{k-2}+\ldots+b_{k-2}x+b_{k-1}$$

A generator polynomial, G(x), is chosen, with degree n, such that polynomial division of f(x) by G(x) using modula-2 arithmetic will produce a remainder with degree less than n. When the remainder is converted back into bits, the length of the resulting CRC value is n bits long. Typically, n is chosen to be an integer number of bytes, as in many well known CRC standards such as the ANSI/IEEE 802 LAN CRC (32 bits), the Consultative Committee for International Telegraph and Telephony (CCITT) CRC (16 bits), Asynchronous Transfer Mode (ATM) Header CRC (8 bits), etc. The polynomial division is shown below in equation 1:

$$\frac{x^n f(x)}{G(x)} = q(x) + \frac{r(x)}{G(x)} \tag{1}$$

Where q(x) is the quotient of the division that is discarded and r(x) is the remainder.

Multiplication (shift) by $x^n$ allows the remainder to be appended to the message. The transmitted message, m(x), is then the concatenation of the message with the remainder, or CRC value, as shown in equation 2 as follows:

$$m(x)=x^n f(x)+r(x) \tag{2}$$

The message m(x) is divisible by G(x) so the remainder will be zero in the absence of errors.

This basic procedure is modified in the case of the ANSI/IEEE 802.3 CRC algorithm used in LANs, in order to detect framing errors that result in leading or trailing zeros in serial transmission. The first n bits of the message f(x) are inverted and the remainder is also inverted.

In modula-2 notation, the first n bits of the message f(x) are inverted by the following step (equation 3):

$$f^*(x)=f(x)+x^{n-}L(x) \tag{3}$$

Where the constant L(x) is defined as a polynomial of order n−1 with all coefficients set to one.

$$L(x)=x^{n-1}+x^{n-2}+\ldots+x+1$$

Substituting equation 3 into equation 1, the division becomes $$\frac{x^n f(x) + x^k L(x)}{G(x)} = q(x) + \frac{r(x)}{G(x)}$$

Inversion of the CRC value is done in a similar way and the message polynomial from equation 2 becomes equation 4:

$$m'(x)=x^n f(x)+r(x)+L(x) \tag{4}$$

CRC value checking is based on division of the received message m'(x) by G(x). Without bit inversion, the received message is divided by the generating polynomial, G(x), to yield a zero remainder in the absence of errors.

$$\frac{m'(x)}{G(x)} = q'(x)$$

If the division yields a remainder, then an error occurred during transmission or storage.

The algorithm is slightly modified if the generating CRC algorithm had employed bit inversion. The first n bits of the received message are inverted and the remainder of the division by the generating polynomial will be L(x) (all is) in the absence of errors.

$$\frac{m'(x) + x^{k-n} L(x)}{G(x)} = q'(x) + \frac{L(x)}{G(x)}$$

An optimization is possible that allows the checking hardware to exactly match the generating hardware, which is useful in some applications. The received message, m'(x), is substituted for the original message, f(x) in equation 1. The shift by n bits and division by the generating polynomial still results in no remainder in the absence of errors.

$$\frac{x^n m'(x)}{G(x)} = q''(x)$$

If bit inversion had been deployed during generation, the first n bits of the received message are inverted. In this case, if the received message is error free, the division results in a constant remainder, P(x).

$$\frac{x^n m'(x) + x^k L(x)}{G(x)} = q''(x) + \frac{P(x)}{G(x)}$$

-continued $$\text{Where } P(x)=\frac{x^n L(x)}{G(x)}$$

2) Separation of Feedback and Forward Terms in Serial CRC Generation and Checking The power of CRC protection comes from the fact that it is possible to use simple hardware implementations to calculate the polynomial equations described above in Section 1. The best known of these is the linear feedback shift register (LFSR) implementation, which can be used for both generating and checking CRC values, and which employs exclusive-OR gates to implement incremental polynomial division, together with registers to store intermediate remainders. In a serial algorithm, the remainder is calculated using a recursive form of the polynomial division equations. The level of recursion is set by the number of bits in the message, k.

FIG. 1 shows a serial CRC value generator and checker 10. The system of FIG. 1 is initialized by setting a remainder stored in the CRC Register 12 to an initial value 14, where the initial value 14 is equal to L(x) if the first n bits of the message are to be inverted, or 0 otherwise.

$$r_0(x)=L(x)$$

or $$r_0(x)=0$$

The system of FIG. 1 then proceeds recursively for every bit $b_i$ in the input data 16. An intermediate remainder is calculated each clock cycle and stored in CRC Register 12 for every bit as follows:

$$r_1(x)=R\left[\frac{x^n b_0(x)+xr_0(x)}{G(x)}\right]$$

$$r_2(x)=R\left[\frac{x^n b_1(x)+xr_1(x)}{G(x)}\right]$$

$$\vdots$$

$$r_k(x)=R\left[\frac{x^n b_{k-1}(x)+xr_{k-1}(x)}{G(x)}\right]$$

Where R[*] is the remainder of the polynomial division *.

After all the bits covered by the CRC have passed through the recursive equation, the final remainder, $r_k(x)$, is the remainder of the whole division, r(x). If the system of FIG. 1 is generating a CRC value then this is appended to the original message, with or without the CRC value being inverted, as shown in equation 5:

$$m(x)=x^n f(x)+r_k(x)[+L(x)] \quad 5$$

The remainder is compared against a constant 21 by comparison logic 18 in the case of checking to see if any errors have occurred. The constant 21 is either 0 if no bit inversion was used or P(x) if bit inversion was used.

In accordance with principles of the present invention, the recursive equation above can be separated into forward terms (with the next data bit as input) and feedback terms (with the current remainder as input), as shown below.

$$r_i(x)=R\left[\frac{x^n b_i(x)+xr_i(x)}{G(x)}\right]$$

-continued $$=R\left[\frac{x^n b_i(x)}{G(x)}\right]+R\left[\frac{xr_i(x)}{G(x)}\right]$$

$$=A[b_i(x)]+B[r_i(x)]$$

Where $A[b_i(x)]$ are the forward terms and $B[r_i(x)]$ are the feedback terms. The forward terms are embodied in the system of FIG. 1 by logic block 20, while the feedback terms are shown as logic block 22. The logic blocks 20 and 22 may be implemented using exclusive-OR gate trees to perform the necessary polynomial divisions shown above. A modula-2 addition of the remainder outputs of the logic blocks 20 and 22 is performed by exclusive-OR gates 23, and the result passed to a remainder register, for example CRC Register 12.

In the CRC value generator form of the circuit 10, as in typical existing systems, the initial value 14 of the CRC Register 12 may be either all zeros (without bit inversion) or all ones (with bit inversion), and the message 16 is fed in bit by bit until all the bits have been processed. The multiplexer 17 is used to append the CRC value 24 (remainder) with or without inversion by an optional inverter 19, per equation 5.

In the CRC value checker form of the circuit, the CRC Register 12 similarly has an initial value 14 of either all zeros (without bit inversion) or all ones (with bit inversion), and the received message 16 is fed in bit by bit until all the bits have been processed. The remainder 24 is checked against a constant 21 to detect any errors. The constant 21 is either 0 if no bit inversion or P(x) with bit inversion.

3) Separation of Feedback and Forward Terms in Parallel CRC Generation and Checking The serial algorithm of Section 2 can become difficult to implement at high speeds because it is processing a single bit at a time. The serial recursive equation as described above is not limited to iterating on every bit, but can process many bits simultaneously. The message, f(x), can be grouped into smaller sequences, $a_i(x)$, of equal length j, giving rise to another recursive equation.

$$f(x)=b_0x^{k-1}+b_1x^{k-2}+\ldots+b_{k-2}x+b_{k-1}$$

$$=\sum_{i=0}^{k/j-1} x^{(k-j(i+1))}a_i(x)$$

Where $$a_0(x)=b_0x^{j-1}+b_1x^{j-2}+\ldots+b_{j-2}x+b_{j-1}$$

$$a_i(x)=b_{ji}x^{j-1}b_{ji+1}x^{j-2}+\ldots+b_{j(i+1)-2}x+b_{j(i+1)-1}$$

.

.

.

$$a_{k/j-1}(x)=b_{k-j}x^{j-1}+b_{k-j+1}x^{j-2}+\ldots+b_{k-2}x+b_{k-1}$$

With the restrictions I≦j≦k and k/j is an integer.

Figure 2:
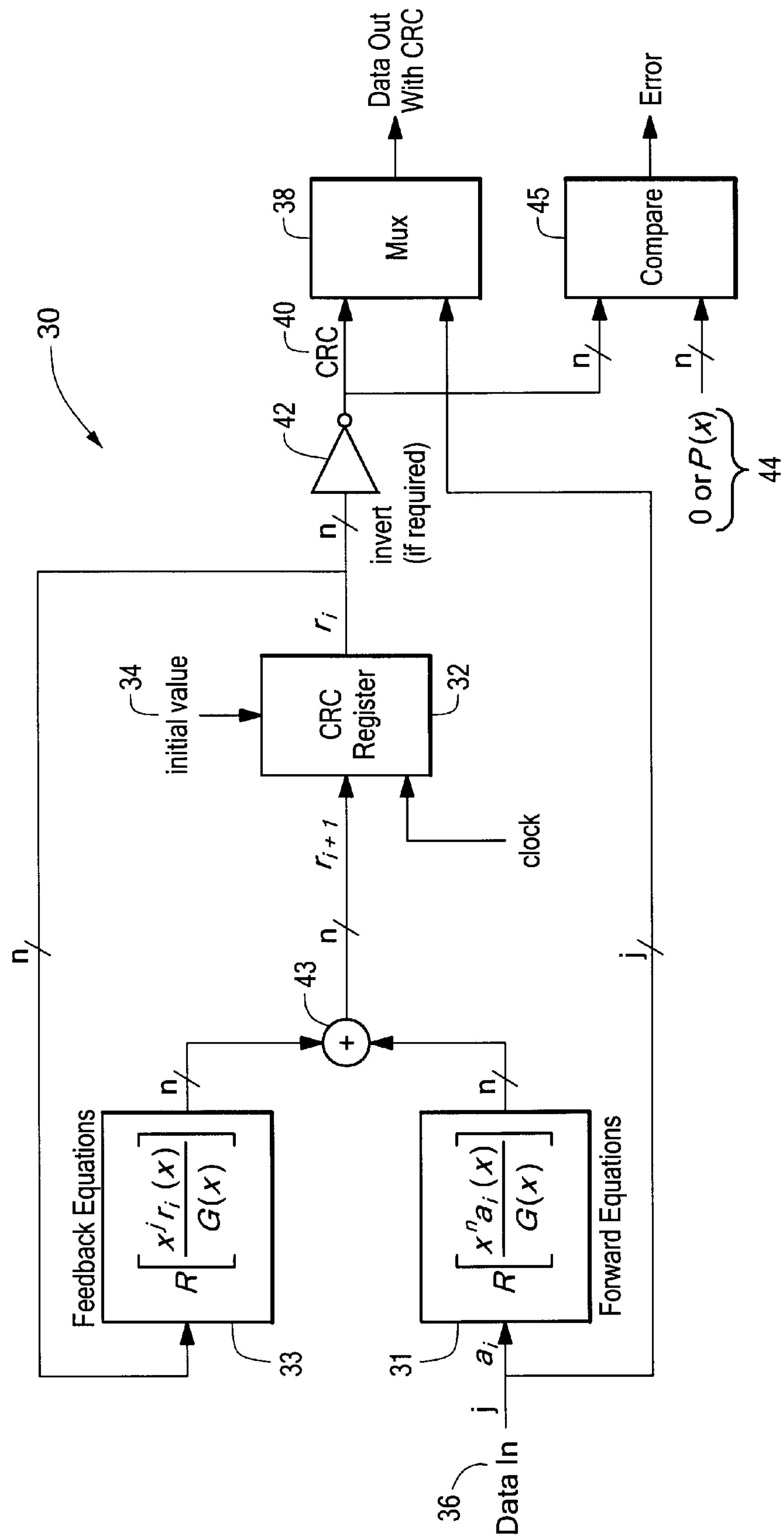
FIG. 2 shows a parallel CRC value generator and checker with feedback and forward equations separated.

FIG. 2 shows a parallel CRC value generator and checker with feedback and forward equations separated. The system of FIG. 2 operates in a similar way to the serial system shown in FIG. 1. Once again, an initial value may be set, as in existing systems, to either L(x) (all 1s) if the first n bits of the message are to be inverted or 0 otherwise.

$$r_0(x)=L(x)$$

or $$r_0(x)=0$$

For every j bits in the message the intermediate CRC is calculated as follows:

$$r_1(x)=R\left[\frac{x^n a_0(x)+x^j r_0(x)}{G(x)}\right]$$

$$r_2(x)=R\left[\frac{x^n a_1(x)+x^j r_1(x)}{G(x)}\right]$$

$$\vdots$$

$$r_{k/j}(x)=R\left[\frac{x^n a_{k/j-1}(x)+x^j r_{k/j-1}(x)}{G(x)}\right]$$

After all the bits have passed through the recursive equation, the final remainder is the remainder of the whole message, r(x), and this is appended to the original message as before, with or without inversion.

$$m(x)=x^n f(x)+r_{k/j}(x)[+L(x)] \quad 6$$

The remainder is compared against a constant in the case of checking, to see if any errors have occurred; either 0, if no inversion was used, or P(x) if inversion was used.

Once again, the recursive equation can be separated into forward terms (with the next data bits as input) and feedback terms (with the current intermediate remainder as input).

$$r_i(x)=R\left[\frac{x^n a_i(x)+x^j r_i(x)}{G(x)}\right] = R\left[\frac{x^n a_i(x)}{G(x)}\right]+R\left[\frac{x^j r_i(x)}{G(x)}\right] = A[a_i(x)]+B[r_i(x)]$$

Where $A[a_i(x)]$ are the forward terms and $B[r_i(x)]$ are the feedback terms. The forward terms are embodied in forward logic block 31, while the feedback terms are embodied in feedback logic block 33 in FIG. 2. The logic blocks 31 and 33 may be implemented using exclusive-OR gate trees to perform the necessary polynomial divisions shown above. A modula-2 addition of the resulting remainder outputs of the logic blocks 31 and 33 is performed by exclusive-OR gates 43, and the result passed to a remainder register, for example CRC Register 32.

In the generator form, the CRC Register 32 is loaded with an initial value 34 equal to either all zeros without bit inversion or all ones with inversion and the input data 36 is fed j bits at a time until all the bits have been processed. A multiplexer 38 is used to append the CRC value 40 (remainder) to the input data 36 with or without inversion by an optional inverter 42, per equation 6.

The input data 36 can be grouped into sub-sequences in the checker similarly as is done in the generator. The CRC Register 32 is initialized to an initial value 34 equal to either all zeros without bit inversion or all ones with inversion and the received message 36 is fed j bits at a time until all the bits have been processed. The CRC value 40 (remainder) is checked against a constant 44 using comparison logic 45 to detect any errors. The constant 44 is either 0 if no bit inversion or P(x) with bit inversion by optional inverter 42.

4) Parallel CRC Value Generation and Checking with Reduced Forward Terms

Figure 3:
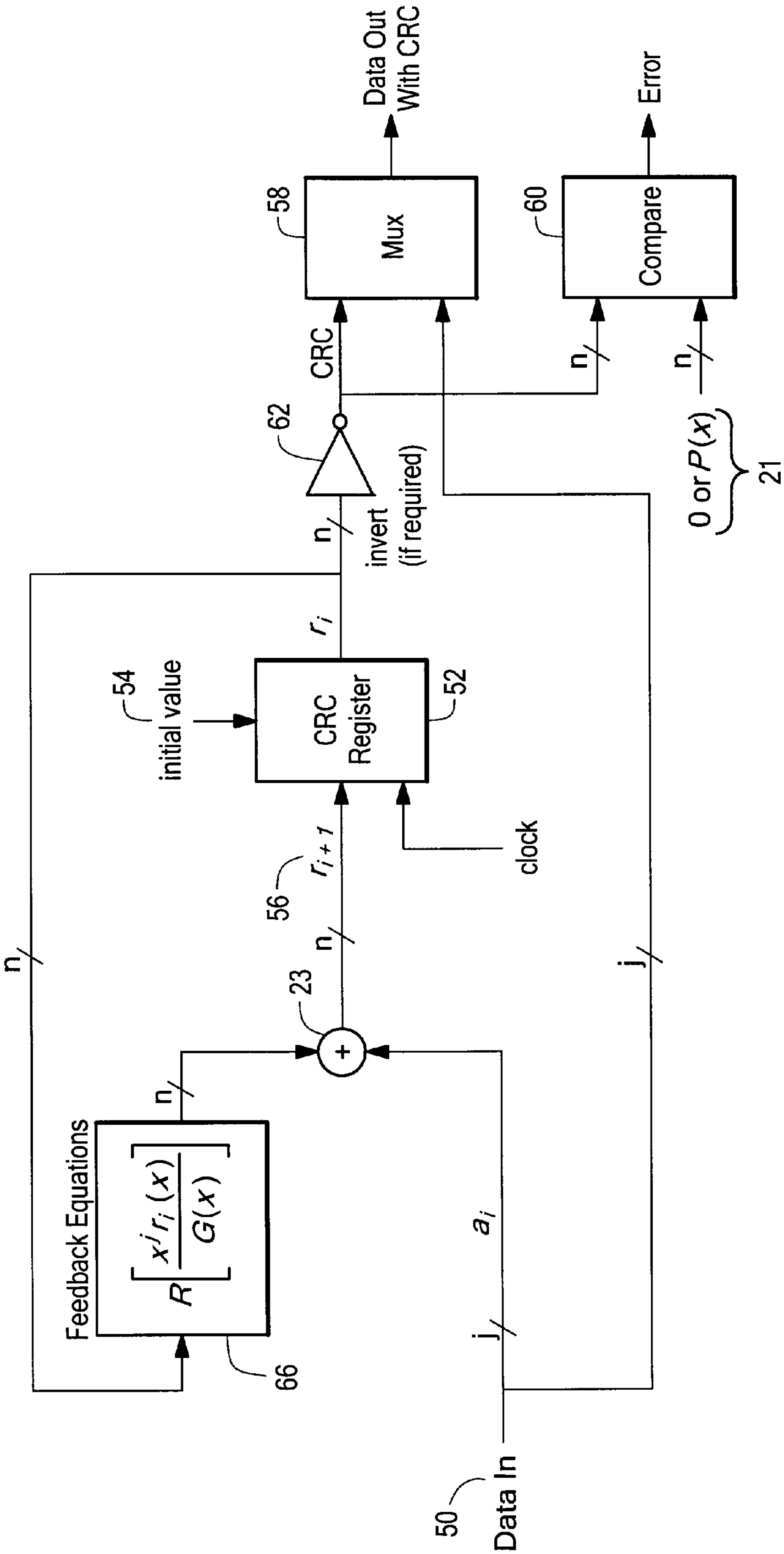
FIG. 3 shows a parallel CRC value generator and checker for processing numbers of bits in parallel less than or equal to the size of the CRC value.
Figure 4:
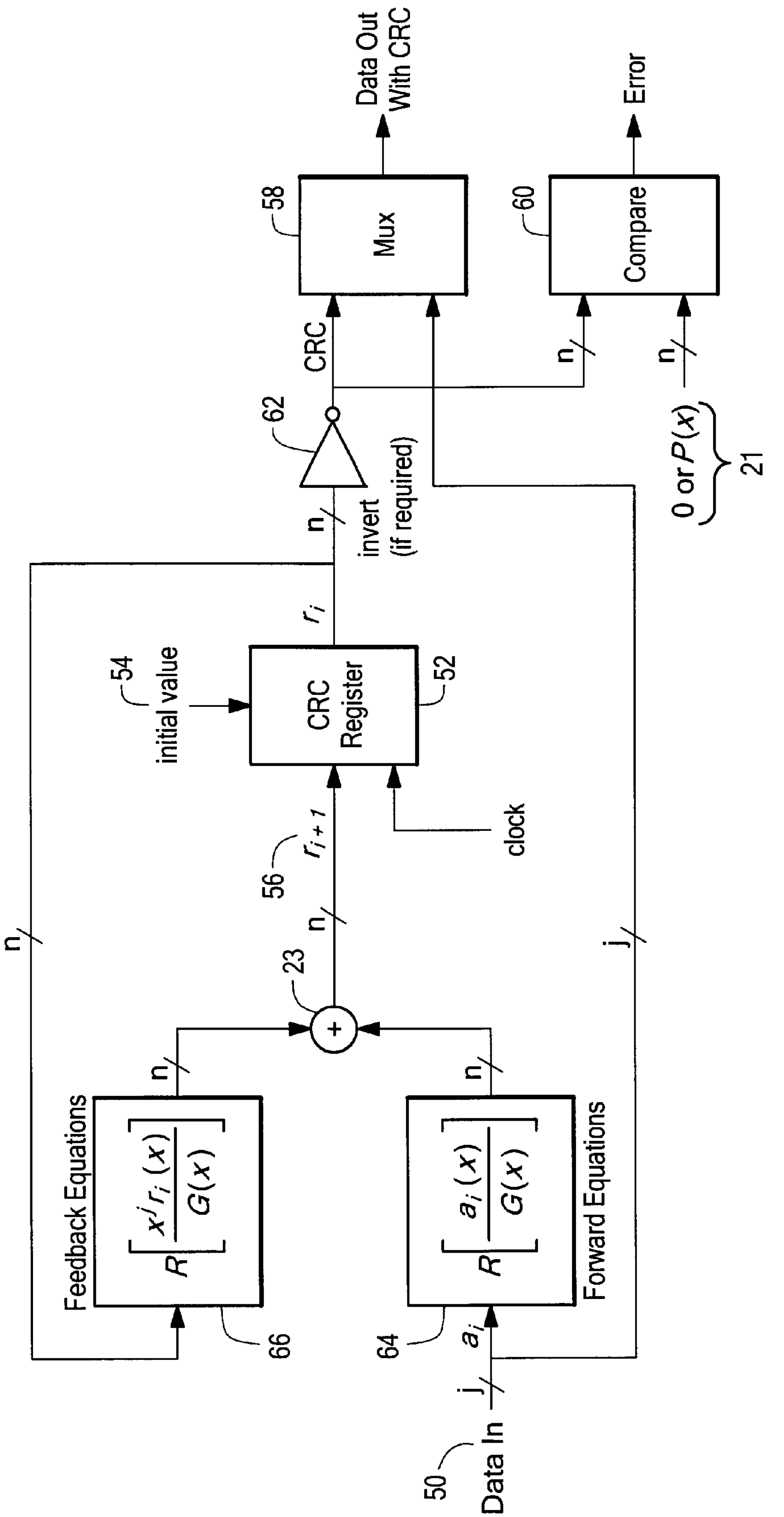
FIG. 4 shows a parallel CRC value generator and checker for processing numbers of bits in parallel greater than the size of the CRC value.

The parallel CRC implementation discussed above in Section 3 runs into difficulty when it is used to process large numbers of bits in parallel. The terms in the equations become unwieldy which results in slower logic, more area and more power. FIG. 3 and FIG. 4 show parallel CRC value generator and checker circuit embodiments which advantageously separate the forward and feedback terms of the recursive equations, and which further reduce the forward terms substantially over those shown in FIG. 2, resulting in an efficient CRC circuit having significantly better performance than existing systems. In embodiments where the number of bits processed is less than or equal to the CRC value bit-width, the forward terms reduce to a simple bit shift that requires no exclusive-OR gates, as shown by the circuit embodiment of FIG. 3. For cases where the number of bits being processed is greater than the CRC value bit-width, the forward terms are minimized as shown by the circuit embodiment of FIG. 4.

The systems of FIGS. 3 and 4 generate a remainder, or CRC value, in two steps. Firstly, all the data are processed to generate an intermediate remainder, $r_a(x)$. Secondly, the final remainder, r(x), is calculated by multiplying (shifting) the intermediate remainder by n bits and dividing by G(x), as shown below.

$$\frac{f(x)}{G(x)}=q_a(x)+\frac{r_a(x)}{G(x)} \quad \text{[Step1]}$$

$$\frac{x^n r_a(x)}{G(x)}=q_b(x)+\frac{r(x)}{G(x)} \quad \text{[Step2]}$$

Step 2 can be omitted in the checker case but is included to make the hardware common between generator and checker.

The recursive solution to Step 1 proceeds as follows. The input data 50, f(x), is grouped into smaller sequences, $a_i(x)$, of equal length j.

$$f(x)=b_0x^{k-1}+b_1x^{k-2}+\ldots+b_{k-2}x+b_{k-1} = \sum_{i=0}^{k/j-1} x^{(k-j(i+1))}a_i(x)$$

Where $$a_0(x)=b_0x^{j-1}+b_1x^{j-2}+\ldots+b_{j-2}x+b_{j-1}$$

$$a_i(x)=b_{ji}x^{j-1}+b_{ji+1}x^{j-2}+\ldots+b_{j(i+1)-2}x+b_{k-1}$$

$$\vdots$$

$$a_{k/j-1}(x)=b_{k-j}x^{j-1}+b_{k-j+1}x^{j-2}+\ldots+b_{k-2}x+b_{k-1}$$

With the restrictions $1 \leqq j \leqq k$ and k/j is an integer.

To implement step 1, the result register shown as CRC Register 52 is set to an initial value 54 equal to either I(x) if the first n bits of the message 50 are to be inverted or 0 otherwise.

$$r_0(x)=I(x)$$

or $$r_0(x)=0$$

For every j bits in the message 50 the intermediate CRC value is calculated below.

$$r_1(x)=R\left[\frac{a_0(x)+x^j r_0(x)}{G(x)}\right]$$

$$r_2(x)=R\left[\frac{a_1(x)+x^j r_1(x)}{G(x)}\right]$$

$$\vdots$$

$$r_{k/j}(x)=R\left[\frac{a_{k/j-1}(x)+x^j r_{k/j-1}(x)}{G(x)}\right]$$

After all the bits have passed through the recursive equation the output is the intermediate remainder, $$r_a(x)=r_{k/j}(x).$$

Step 2 can proceed using the same recursive equation as step 1 if the number of bits being processed in parallel is less than the CRC value length, or j<n.

$$r_{b1}(x)=R\left[\frac{x^j r_a(x)}{G(x)}\right]$$

$$r_{b2}(x)=R\left[\frac{x^j r_{b1}(x)}{G(x)}\right]$$

$$\vdots$$

$$r(x)=r_{n/j}(x)=R\left[\frac{x^j r_{n/j-1}(x)}{G(x)}\right]$$

With the restrictions $1\leqq j\leqq n$ and n/j is an integer.

If the number of bits being processed in parallel is greater than or equal to the CRC value length, or $j\geqq n$, as shown in FIG. 4, then $$r(x)=R\left[\frac{x^n r_{k/j}(x)}{G(x)}\right]$$

After all the bits have passed through the two step process, the final remainder is the remainder of the whole message, r(x) and this is appended to the original message as before, with or without inversion.

$$m(x)=x^n f(x)+r(x)[+L(x)]$$

In the case of checking, the remainder is compared against a constant. The constant is 0 with no bit inversion or P(x) with bit inversion.

Once again, the recursive equation can be separated into forward terms with the next j bits of data bit as input and feedback terms with the current remainder as input, which may be implemented as forward logic 64 and feedback logic 66, respectively, using state machine structures in hardware.

$$r_i(x)=R\left[\frac{a_i(x)+x^j r_i(x)}{G(x)}\right]$$

$$=R\left[\frac{a_i(x)}{G(x)}\right]+R\left[\frac{x^j r_i(x)}{G(x)}\right]$$

$$=A[a_i(x)]+B[r_i(x)]$$

Where $A[a_i(x)]$ are the forward terms and $B[r_i(x)]$ are the reverse terms.

If the number of bits being processed at a time, j, is less than or equal to the number of bits in the CRC value, n, (or $j\leqq n$) then a further simplification is possible. The remainder of a polynomial division is equal to the numerator if the order of the numerator is less than or equal to the denominator.

$$r_i(x)=A[a_i(x)]+B[r_i(x)]$$

$$=a_i(x)+B[r_i(x)]$$

So the forward equations reduce down to through-connections, as shown in FIG. 3, resulting in a reduced gate count in hardware.

Accordingly, the CRC Register 52 is initialized to an initial value 54 equal to either all zeros without bit inversion by the optional inverter 62 or I(x) with inversion and the message 50 is fed j bits at a time until all the bits have been processed. A multiplexer 58 is used to append the CRC value (remainder) to the message, with or without inversion, for generation and the comparator 60 is used for checking.

5) Remainder (CRC) Register Initialization to Invert the Start of a Message

As described above, some CRC checking protocols invert the first n bits of the message to detect any leading zeros that might get added to a message during bad framing in serial transmission. Existing systems provide this inversion by initializing the CRC register to all ones. The disclosed system of FIGS. 3 and 4 obtains the same effect, albeit through use of a very different initial value, referred to herein as I(x).

An intermediate remainder from processing the first n bits after initialization, $r^1(x)$ (shown as $r_{i+1}$ 56), is calculated from the outputs of the forward and feedback logic blocks 64 and 66 discussed above with reference to FIGS. 3 and 4. The first n bits of the input data 50 produce a polynomial, $a_0(x)$, that must be added (Modula two) to the constant, L(x), to get the one's compliment of the data, as shown by the following equations:

$$r_i(x)=R\left[\frac{a_0(x)+x^n I(x)}{G(x)}\right]$$

$$=R\left[\frac{a_0(x)}{G(x)}\right]+R\left[\frac{x^n I(x)}{G(x)}\right]$$

$$=a_0(x)+B[I(x)]$$

$$=a_0(x)+L(x)$$

Where the feedback terms, B[I(x)], are defined as in the following equation 7:

$$B[I(x)]=L(x) \quad 7$$

Thus the value I(x) is equal to a bit sequence, which when input to the feedback logic block 66, causes the feedback logic block 66 to output L(x) (all is). This fixes the initial value, I(x), to a constant which can be derived by matrix manipulation. Changing to the matrix form of equation 7, $$B\cdot I=L$$

Where B is an n by n matrix defining the feedback terms, I is a column matrix of n terms defining the initial value and L is a column matrix of n ones defining the one's complement matrix.

To calculate the initial value, I, requires inverting the B matrix.

$$B\cdot I=L$$

$$B^{-1}\cdot B\cdot I=B^{-1}\cdot L$$

$$I=B^{-1}\cdot L$$

For example, by using this equation, the initial value I(x) for a generator/checker circuit compatible with the ANSI/IEEE 802 CRC algorithm is calculated as follows:

$$I(x)=x^{30}+x^{26}+x^{25}+x^{23}+x^{21}+x^{19}+x^{18}+x^{17}+x^{16}+x^{14}+x^{13}+x^{10}+x^{6}+x^{3}+x+1$$

where the generating polynomial, G(x), is:

$$G(x)=x^{32}+x^{26}+x^{23}+x^{22}+x^{16}+x^{12}+x^{11}+x^{10}+x^{8}+x^{7}+x^{5}+x^{4}+x^{2}+x+1$$

the resulting initial value in hexadecimal is 9226F562.

6) Terminating the CRC Generator/Checker

In many systems, the total number of bits in the message covered by the CRC is guaranteed to be divisible by the number of bits being processed in parallel, such that k/j is an integer. However, in certain applications, such as data communications, where packets are not fixed in length and can come in byte increments, such a guarantee is not always feasible. Even where the number of bits covered by the CRC is known to always be divisible by 8, it is undesirable to limit the number of bits being processed in parallel to 8. Fortunately, as illustrated by the embodiment shown in FIG. 5, a system is disclosed herein which allows wider implementations. As previously described above, the recursive equations for both the standard and present parallel systems process a constant number of bits, j, per iteration. The equations are still valid if j is a variable and the entire message is processed.

The message 50 can be split up into a set of sequences, of length j bits, followed by a single sequence of length m bits where m is less than or equal to j. The set of j-bit sequences can be processed using the same recursive forms as the standard and herein disclosed parallel implementations. The m-bit sequence is processed at the end using a separate equation.

$$f(x) = b_0x^{k-1} + b_1x^{k-2} + \ldots + b_{k-2}x + b_{k-1}$$
$$= \sum_{i=0}^{k/j-2} x^{(k-j(i+1))}a_i(x) + a_m(x)$$

Where $$a_0(x)=b_0x^{j-1}+b_1x^{j-2}+ \ldots +b_{j-2}x+b_{j-1}$$
$$a_i(x)=b_{ji}x^{j-1}+b_{ji+1}x^{j-2}+ \ldots b_{j(i+1)-2}x+b_{j(i+1)-1}$$
$$\vdots$$
$$a_{k/j-2}(x)=b_{k-2j}x^{j-1}+b_{k-2j+1}x^{j-2}+ \ldots +b^{k-j-2}x+b_{k-j-1}$$
$$a_m(x)=b_{k-m}x^{m-1}+b_{k-m+1}x^{m-2}+ \ldots +b_{k-2}x+b_{k-1}$$

Where $I \leqq j \leqq k$ and $1 \leqq m \leqq j$.

Figure 5:
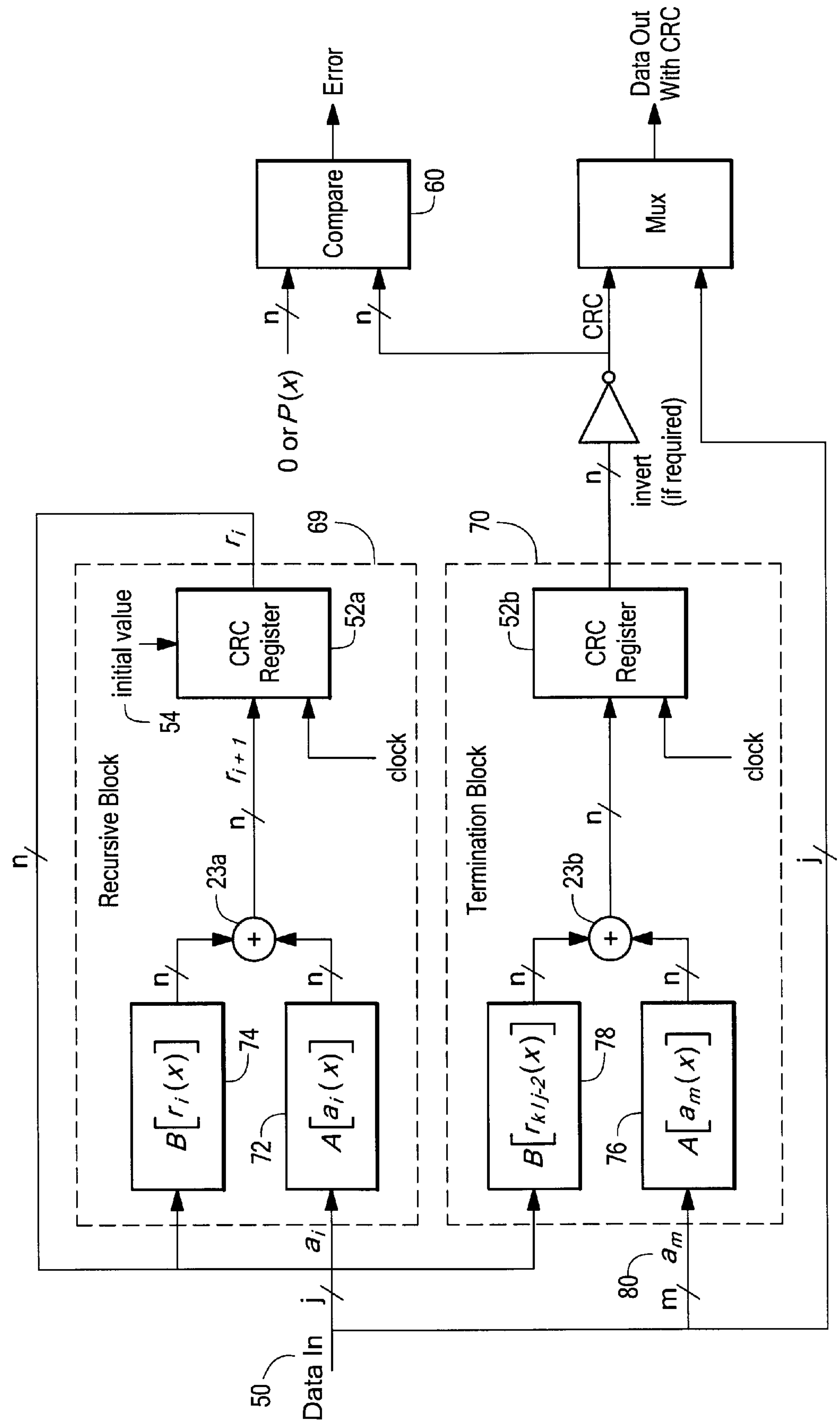
FIG. 5 shows a parallel CRC value generator and checker with termination logic.

These equations translate into modified hardware implementations where the last part of the message is processed in a termination logic block. A parallel implementation processing j bits in parallel and terminating with processing m bits is shown in FIG. 5. The main recursive block 69 has the forward terms, $A[a_i(x)]$, implemented by forward logic 72, and the feedback terms, $B[r_i(x)]$, implemented by feedback logic 74. The termination logic block 70 h as the forward terms, $A[a_m(x)]$ as in terminating forward logic 76, and the feedback terms, $B\lfloor r_i(x)\rfloor$, as in terminating feedback logic 78. In the embodiment described above in section 4, for parallel CRC value generation and checking with reduced forward terms, and in the case where in is less than or equal to the length of the CRC value, the data input, $a_m$ 80 is set to zero which further simplifies the design.

The termination logic block 70 that processes the final m-bit sequence operates similarly to the recursive logic block 69, with forward and feedback logic, except the termination feedback logic 78 operates only on the last output of the register 52*a*, and the forward terms operate only on the last m bits of the message. It is possible to continuously calculate candidate m-bit sequences of different lengths in parallel and select the correct CRC at the end of the message, in order to allow a range of m termination values. In this way the number of bits being processed in parallel can be de-coupled from the length of the message.

7) Pipelined Version of Parallel Implementations

It has been shown above that the CRC generator and checker circuits can be broken down into forward and reverse terms to produce a state machine. The forward terms can further be pre-calculated using a pipeline because they only have input data as input. A pipeline structure allows a faster implementation in hardware and improves test access to the logic blocks. Multiple stages of pipelining are possible in the forward path so the ultimate speed of the implementation will always be defined by the speed of the feedback path.

Figure 6:
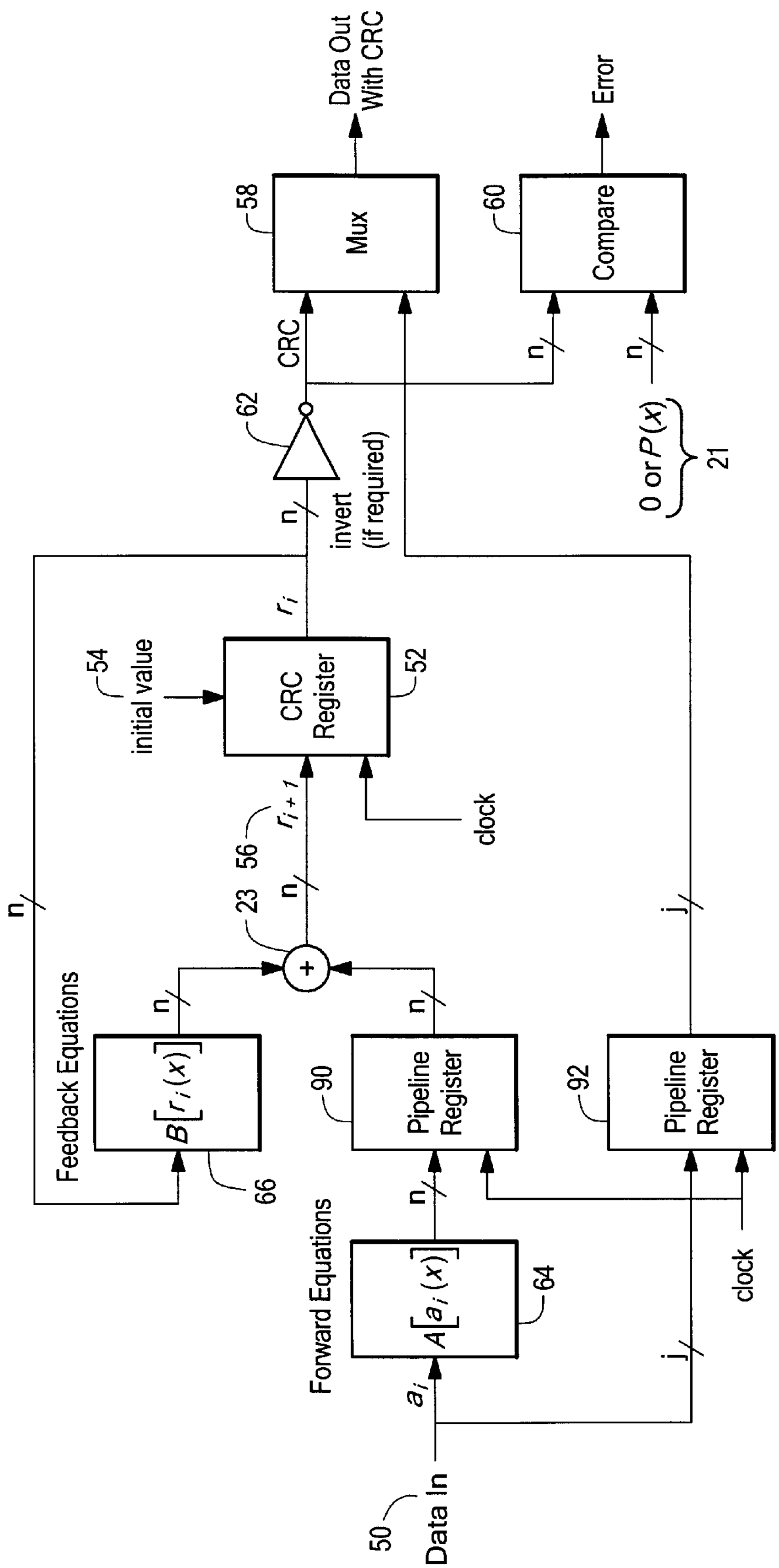
FIG. 6 shows a pipelined implementation of a parallel CRC value generator and checker.

FIG. 6 shows an illustrative embodiment of a pipelined system. The elements of the circuit shown in FIG. 6 are described above with regard to FIG. 4, with the exception of pipeline registers 90 and 91. In FIG. 6, the pipeline registers 90 and 92 are pre-loaded with data from the input data 50 during a clock cycle preceding operation of the remaining circuit elements of the circuit. Subsequently, the circuit processes the input data using the output of the pipeline register 90 as input to exclusive-OR gates 23, and the output of pipeline register 92 as an input to the multiplexer 58. In this way, the pipeline register 92 synchronizes the input data 50 with the output of the CRC Register 52. The pipelining shown in FIG. 6 improves circuit performance by increasing the level of parallelism in the circuit.

8) CRC Circuit and Module Implementations

Figure 7:
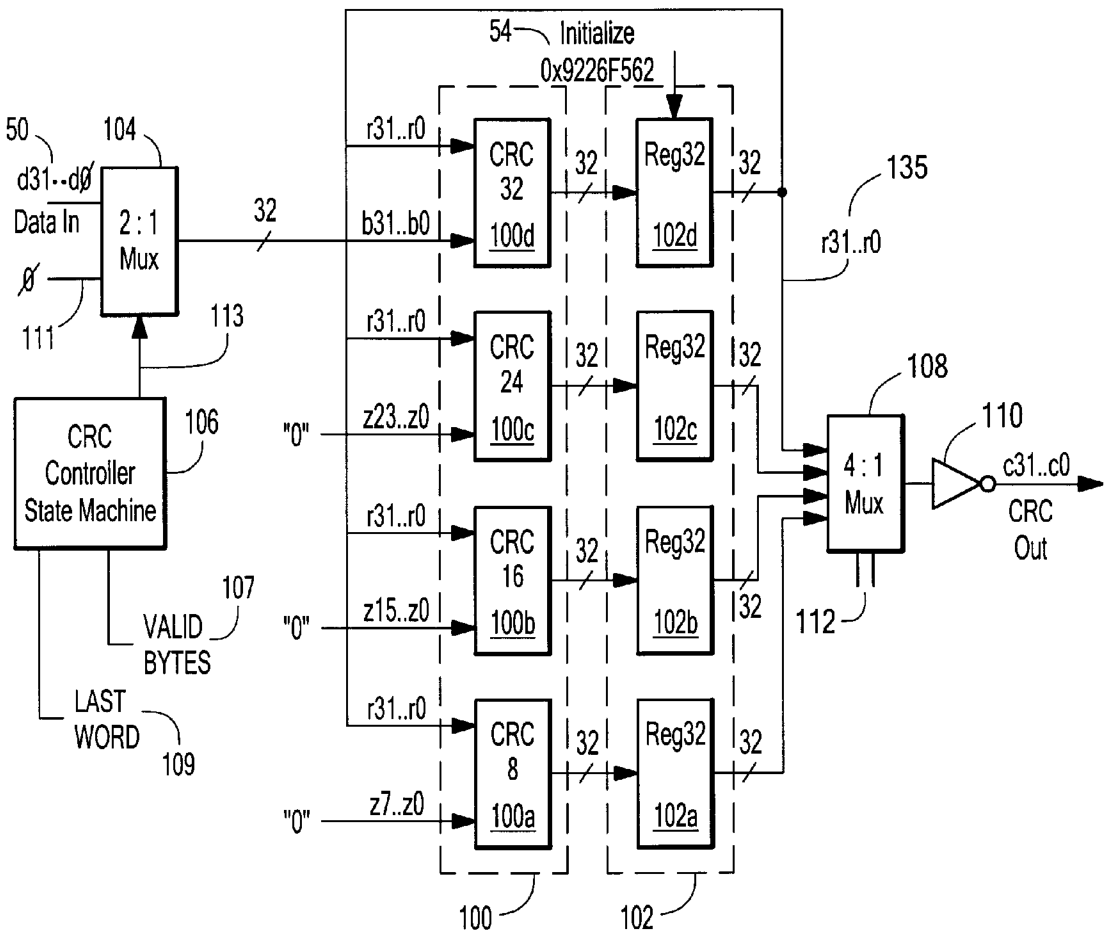
FIG. 7 shows a 32-bit parallel circuit implementation of the CRC value generator and checker of FIG. 3.
Figure 8:
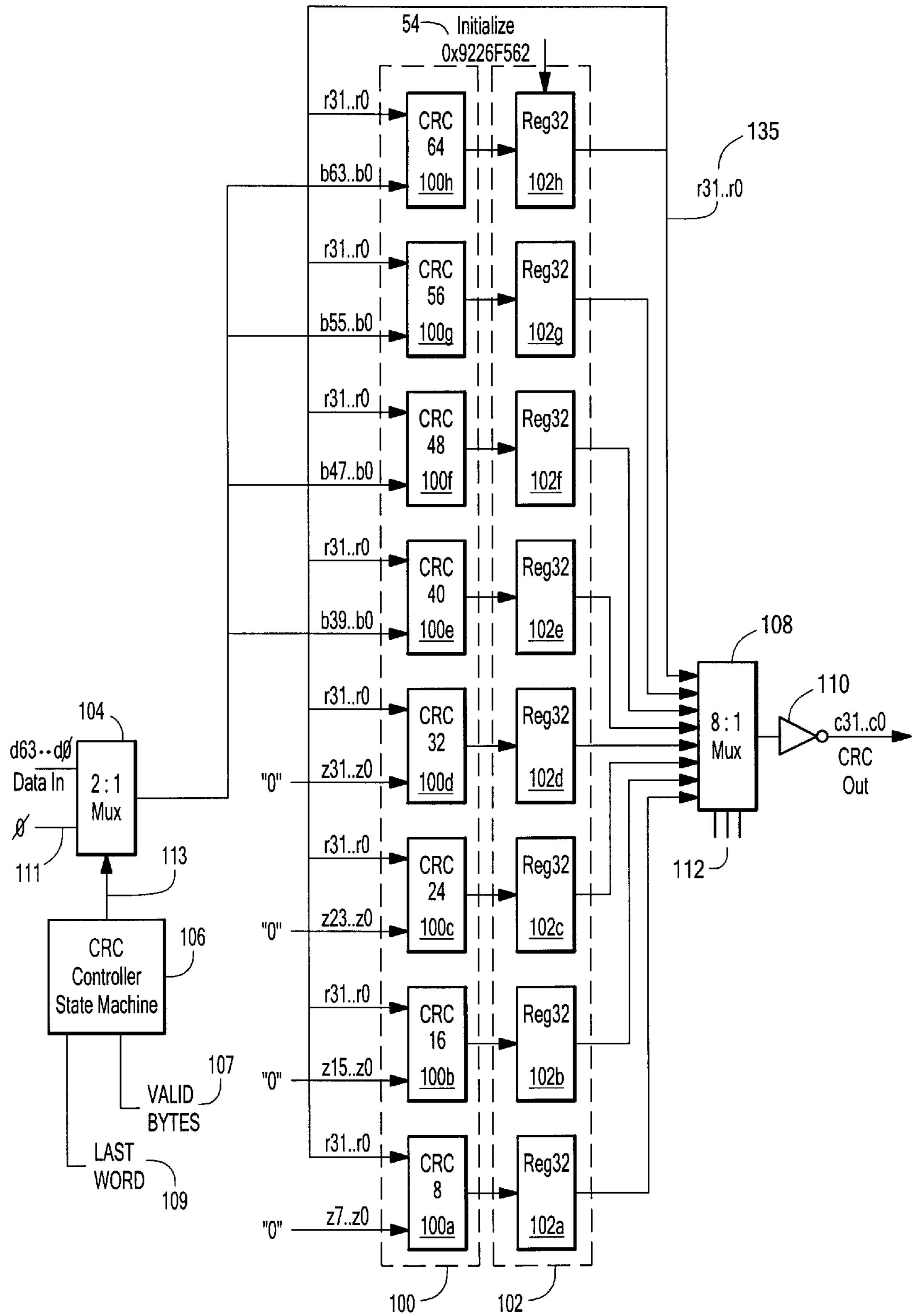
FIG. 8 shows a 64-bit parallel circuit implementation of the CRC value generator and checker of FIG., 4.
Figure 9:
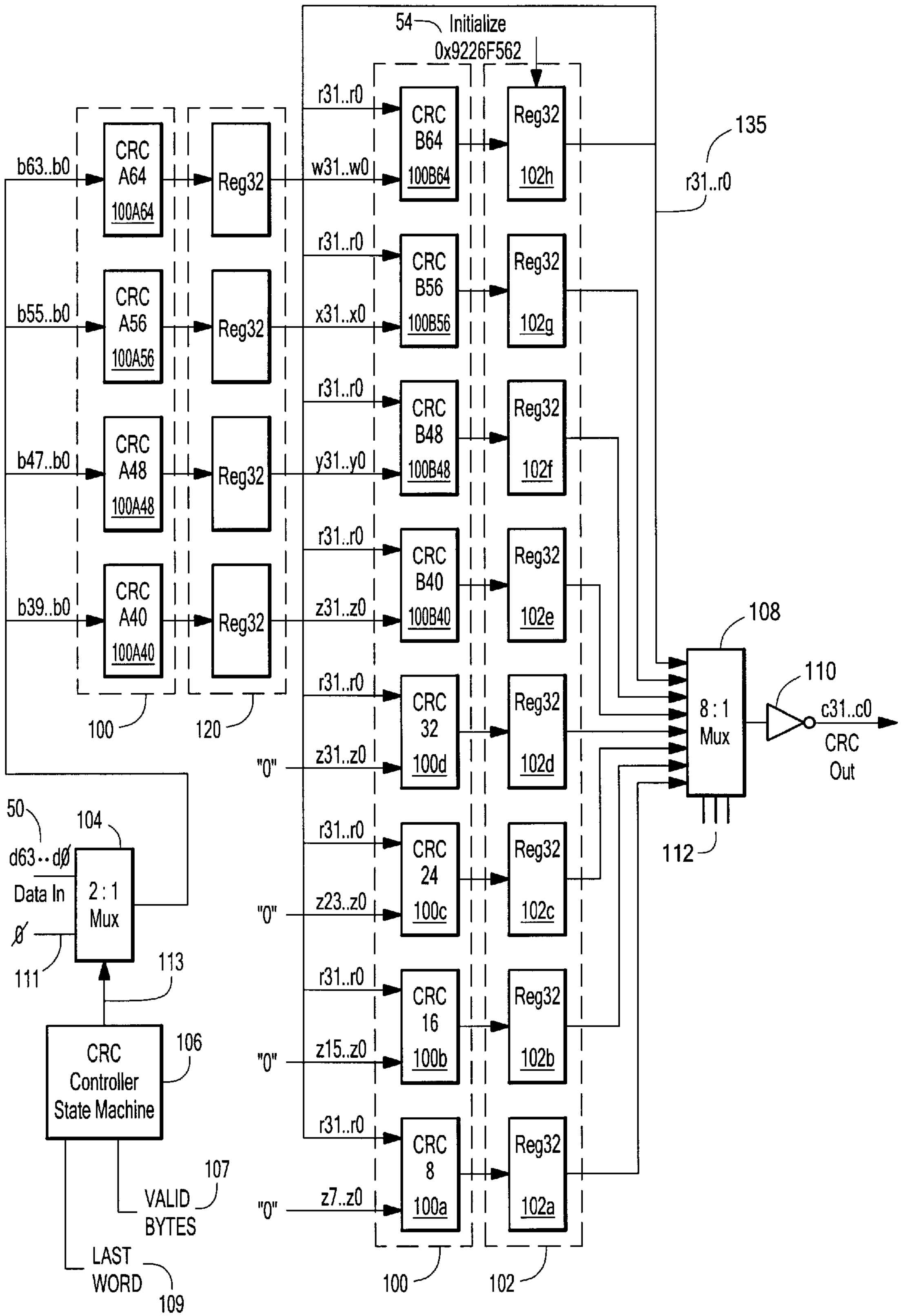
FIG. 9 shows a 32-bit parallel circuit implementation of the CRC value generator and checker with pipelining as in FIG. 6.

The disclosed parallel CRC design can be embodied in many applications. FIGS. 7, 8 and 9 show three illustrative generator-checkers: a 32-bit wide CRC generator-checker (FIG. 7), a 64-bit CRC generator-checker (FIG. 8) and a pipelined 64-bit CRC generator-checker (FIG. 9). The circuits shown in FIGS. 7–9 include CRC logic modules 100, remainder registers 102, input data register 104, CRC Controller State Machine 106, multiplexer 108, and inverter 108. The pipelined implementation of FIG. 9 further includes pipeline registers 120. During operation of the embodiments shown in FIGS. 7–9, input data 50 is received into the input register 104, and subsequently input to the CRC logic modules 100. The input data 50 is passed to the CRC logic modules 100 in 32 bit portions in the embodiment of FIG. 7, and in 64 bit portions in the embodiments of FIGS. 8 and 9. The outputs of the CRC logic modules 100 are then stored in the remainder registers 102, and fed back as r31 . . . r0 135 into the CRC logic modules 100. This process repeats recursively until all the input data 50 has been processed. At the end of the input data 50, the multiplexer 108 outputs the final contents of a selected one of the 32-bit remainder registers 102, based on the assertion of its controls 112. The inverter 110 then inverts the output of the multiplexer 108, resulting in the final CRC value.

As illustrated in FIGS. 7–11, variable length m-bit termination sequences are handled by duplicating the termination block once for every possible m-bit sequence length. Selection of the correct CRC from the array of CRC remainder registers (102*a*–102*d* in FIG. 7) is done with a multiplexer (108 in FIG. 7) in hardware.

The termination equations exactly match the recursive equations when the length of the m-bit sequence is equal to j, where j is the number of bits being processed in parallel by the recursive equations. In that case, the recursive logic block (100*d* in FIG. 7) then processes the m-bit sequence and the correct CRC appears at the output of the recursive CRC remainder register (102*d* in FIG. 7).

Further simplification of the termination logic is possible if the parallel algorithm embodied in FIGS. 7–11 is used. The shift specified in Step 2 of the disclosed algorithm, as described above in section 4, is implemented by appending n zero bits to the end of the message, where n is the number of bits in the CRC value being generated. The n zero bits occupy part, or all, of the final m bits used in the termination logic. This overlap is dependent on the values of n and m, which are constant, so the n zero bits that fall in the m-bit sequence can be hard-wired to zero. This eliminates some XOR gates in the termination logic as well as simplifying routing in hardware implementations.

For example, in FIG. 7, logic blocks 100*a*, 100*b* and 100*c* are termination logic blocks for handling termination sequences having 24, 16 and 8 valid bits respectively. The CRC controller state machine 106 operates to first initialize the circuit using the initial value 54, and then feeds j bits (32 in FIG. 7) at a time into the circuit over data input lines 50. The CRC controller state machine detects a last word of the message by indication provided over last word signal 109, and also the number of valid bytes in the last word from valid bytes signal 107. The CRC controller state machine 106 also appends n zero bits at the end of the message, where n is the size of the CRC value (32 bits in the embodiment of FIG. 7), by selecting the hardwired zero input 111 of the multiplexer 104 when the final byte of the last word of the message has been received.

The CRC controller state machine 106 then selects which remainder register of remainder registers 102 holds the last value to be passed through the multiplexer 108. Specifically, for the example embodiment shown in FIG. 7, if there are 8 valid bits in the final word, the CRC controller state machine operates to select the remainder register 102*a* using the controls 112 of the multiplexer 108 as the final CRC to pass through the multiplexer 108, if there are 16 valid bits the contents of remainder register 102*b* is selected, if there are 24 bits the contents of remainder register 102*c* is selected, and if the last word is aligned to a j-bit boundary, the contents of remainder register 102*d* is selected.

Figure 10:
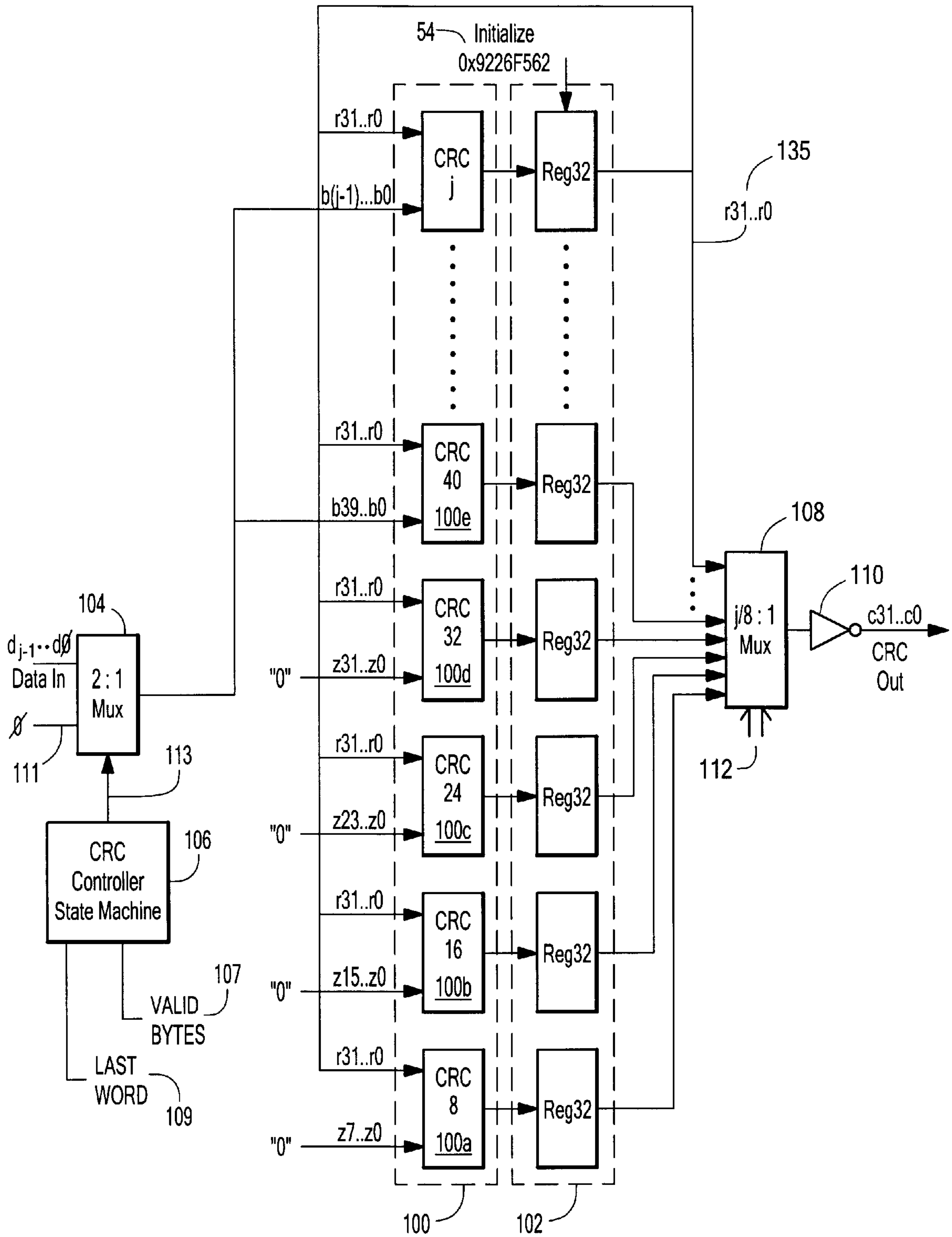
FIG. 10 shows a generalized j-bit CRC value generator and checker circuit.
Figure 11:
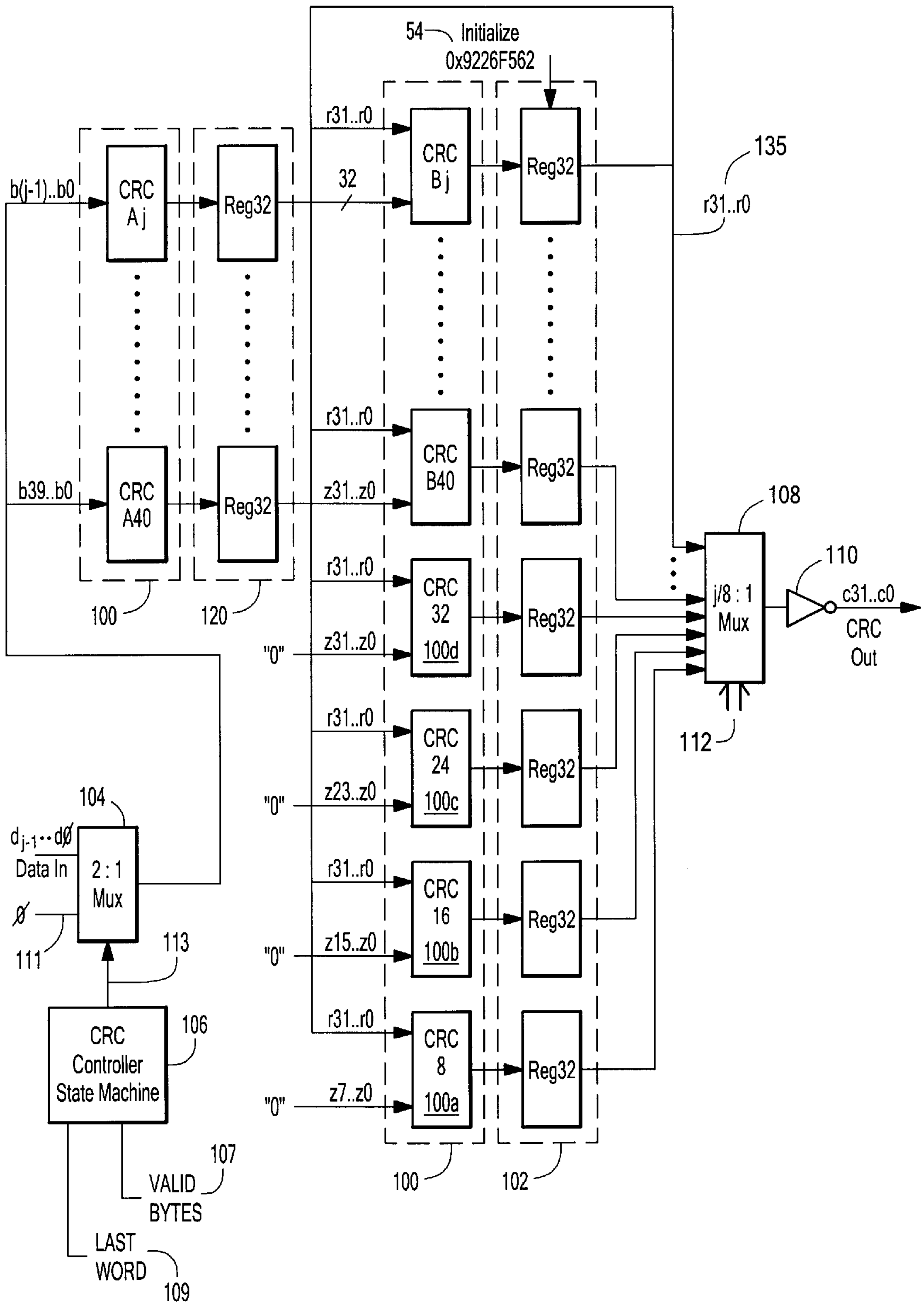
FIG. 11 shows a generalized j-bit CRC value generator and checker circuit with pipelining.

FIGS. 10 and 11 show a generalized form of the ordinary and pipelined versions respectively. Illustrative logic equations for the CRC logic modules 100 of FIGS. 7–11 are given in FIGS. 12–35. Similar designs are possible for other CRC equations but are not included here. There is no inherent limitation of the bus width for any of these designs.

An exemplary embodiment for a communications system having a line rate of 10 gigabits per second is shown by the 64-bit pipelined design of FIG. 9, running at 156.25 MHz, which offers moderate exclusive-OR tree size and good test access. The design requires approximately 4070 exclusive-OR gates (about 40% less than the standard design in existing systems) and uses a maximum of 20 equation terms in 5 levels.

The terms r31-0 in the logic equations of FIGS. 12–35 correspond to feedback signals r31-r0 135 as shown in FIGS. 7–11, while the terms b0, b1, b2, . . . bn correspond to the non-feedback inputs z0, z1, z2, . . . zn or b0 . . . b(j−1) as in FIGS. 7–11. The + operator represents an exclusive-OR logic operation.

As shown in FIGS. 7–11, each one of the CRC logic modules 100 may have a number of zero bit, non-feedback inputs z0 . . . zn that is a multiple of 8. Those logic modules that have only zero bits as inputs, such as 100*a*–100*c* in FIG. 7, and 100*a*–100*d* in FIG. 8, are purely termination modules and are not used to process bits from the input data.

For example, in embodiments where the number of input data bits processed in parallel is greater than the number of bits in the generated CRC value, as in FIG. 8, the logic modules that have only zero bits for non-feedback inputs are those logic modules processing numbers of bits in parallel less than or equal to the number of bits in the CRC value being generated. Accordingly, in FIG. 8, logic module 100*a* only has 8 zero bit inputs z7 . . . z0, logic module 100*b*, has 16 zero bit inputs z15 . . . z0, logic module 100*c* has 24 zero bit inputs z23 . . . z0, and so on, up to the logic module processing a number of bits in parallel equal to the number of bits in the CRC value being generated (100*d* in FIG. 8). The non-feedback inputs to logic modules processing numbers of bits greater than the number of bits in the CRC value being generated are the outputs of multiplexer 104 (b63 through b0).

However, in the embodiment of FIG. 7, the CRC logic module 10*d*, which processes a number of bits in parallel equal to the size of the CRC value being generated, receives the output of multiplexer 104 as a non-feedback input. This is because in the embodiment of FIG. 7, the CRC logic module 100*d* processes the input data selected by the multiplexer 104 during processing of the data block before the last word signal 109 is asserted. When the last word signal 109 is asserted, then the multiplexer 104 appends the zero bits 111, which become inputs to the logic module 10*d*. Accordingly, if the contents of register 102*d* is selected by multiplexer 108 as the CRC value after the complete packet or data block has been processed, that contents will reflect processing of the zero bits 111 appended to the input data by the multiplexer 104.

The generalized circuit shown in FIG. 10 may include CRC logic modules for processing varying numbers of bits in parallel. With regard to the pipelined circuit shown in FIG. 9, the CRC logic modules 100 include a first stage, shown by logic modules 100A40, 100A56, 100A64, and a second stage, shown by logic modules 100B40, 100B56, and 100B64. These two stages are also shown in the generalized pipelined representation shown in FIG. 11. The logic modules 100*a* through 100*d* may similarly have numbers of zero input bits in multiples of 8, up to the number of bits in the CRC value being generated, for example 32 as shown in FIG. 9.

FIGS. 12*a* and 12*b* show logic equations for the output signals of CRC logic module 10*a* as shown in FIGS. 7–11.

The logic module 100*a* requires 114 2-input exclusive-OR gates, has a maximum number of terms for any one equation of 8, and has a maximum number of levels of exclusive-OR gates equal to 3.

FIGS. 13*a* and 13*b* show logic equations for the output signals of CRC logic module 100*b* as shown in FIGS. 7–11. The logic module 100*b* requires 215 2-input exclusive-OR gates, has a maximum number of terms for any one equation of 11, and has a maximum number of levels of exclusive-OR gates equal to 4.

FIGS. 14*a* and 14*b* show logic equations for the output signals of CRC logic module 100*c* as shown in FIGS. 7–11. The logic module 100*c* requires 319 2-input exclusive-OR gates, has a maximum number of terms for any one equation of 14, and has a maximum number of levels of exclusive-OR gates equal to 4.

FIGS. 15*a*, 15*b*, and 15*c* show logic equations for the output signals of CRC logic module 100*d* as shown in FIGS. 7–11. The logic module 100*d* requires 452 2-input exclusive-OR gates, has a maximum number of terms for any one equation of 18, and has a maximum number of levels of exclusive-OR gates equal to 5.

FIGS. 16*a*, 16*b*, and 16*c* show logic equations for the output signals of CRC logic module 100*e* as shown in FIGS. 7–11. The logic module 100*e* requires 557 2-input exclusive-OR gates, has a maximum number of terms for any one equation of 16, and has a maximum number of levels of exclusive-OR gates equal to 5.

FIGS. 17*a*, 17*b*, and 17*c* show logic equations for the output signals of CRC logic module 100*f* as shown in FIGS. 8 and 10. The logic module 100*f* requires 669 2-input exclusive-OR gates, has a maximum number of terms for any one equation of 27, and has a maximum number of levels of exclusive-OR gates equal to 5.

FIGS. 18*a*, 18*b*, 18*c*, and 18*d* show logic equations for the output signals of CRC logic module 10*g* as shown in FIG. 8. The logic module 100*g* requires 807 2-input exclusive-OR gates, has a maximum number of terms for any one equation of 31, and has a maximum number of levels of exclusive-OR gates equal to 5.

FIGS. 19*a*, 19*b*, 19*c*, and 19*d* show logic equations for the output signals of CRC logic module 100*h* as shown in FIG. 8. The logic module 100*h* requires 937 2-input exclusive-OR gates, has a maximum number of terms for any one equation of 35, and has a maximum number of levels of exclusive-OR gates equal to 6.

FIGS. 20*a*, 20*b*, 20*c*, and 20*d* show logic equations for the output signals of a logic module having 72 zero bit inputs, as would be used in an embodiment of the generalized circuit of FIG. 10. The logic module shown in FIGS. 20*a*, 20*b*, 20*c*, and 20*d* requires 1049 2-input exclusive-OR gates, has a maximum number of terms for any one equation of 41, and has a maximum number of levels of exclusive-OR gates equal to 6.

FIGS. 21*a*, 21*b*, 21*c*, and 21*d* show logic equations for the output signals of a CRC logic module having 80 zero bit inputs, as would be used in an embodiment of the generalized circuit of FIG. 10. The logic module of FIGS. 21*a*, 21*b*, 21*c*, and 21*d* requires 1169 2-input exclusive-OR gates, has a maximum number of terms for any one equation of 45, and has a maximum number of levels of exclusive-OR gates equal to 6.

FIGS. 22*a*, 22*b*, 22*c*, 22*d*, and 22*e* show logic equations for the outputs of a CRC logic module having 88 zero bit inputs, as would be used in an embodiment of the generalized circuit of FIG. 10. The logic module of FIGS. 22*a*, 22*b*, 22*c*, 22*d*, and 22*e* requires 1305 2-input exclusive-OR gates, has a maximum number of terms for any one equation of 51, and has a maximum number of levels of exclusive-OR gates equal to 6.

FIGS. 23*a*, 23*b*, 23*c*, 23*d*, and 23*e* show logic equations for the outputs of a CRC logic module having 96 zero bit inputs, as would be used in an embodiment of the generalized circuit of FIG. 10. The logic module of FIGS. 23*a*, 23*b*, 23*c*, 23*d*, and 23*e* requires 1440 2-input exclusive-OR gates, has a maximum number of terms for any one equation of 53, and has a maximum number of levels of exclusive-OR gates equal to 6.

FIGS. 24*a*, 24*b*, 24*c*, 24*d*, and 24*e* show logic equations for the outputs of a CRC logic module having 104 zero bit inputs, as would be used in an embodiment of the generalized circuit of FIG. 10. The logic module of FIGS. 24*a*, 24*b*, 24*c*, 24*d*, and 24*e* requires 1572 2-input exclusive-OR gates, has a maximum number of terms for any one equation of 56, and has a maximum number of levels of exclusive-OR gates equal to 6.

FIGS. 25*a*, 25*b*, 25*c*, 25*d*, and 25*e* show logic equations for the outputs of a CRC logic module having 112 zero bit inputs, as would be used in an embodiment of the generalized circuit of FIG. 10. The logic module of FIGS. 25*a*, 25*b*, 25*c*, 25*d*, and 25*e* requires 1709 2-input exclusive-OR gates, has a maximum number of terms for any one equation of 60, and has a maximum number of levels of exclusive-OR gates equal to 6.

FIGS. 26*a*, 26*b*, 26*c*, 26*d*, 26*e*, and 26*f* show logic equations for the outputs of a CRC logic module having 120 zero bit inputs, as would be used in an embodiment of the generalized circuit of FIG. 10. The logic module of FIGS. 26*a*, 26*b*, 26*c*, 26*d*, 26*e*, and 26*f* requires 1850 2-input exclusive-OR gates, has a maximum number of terms for any one equation of 65, and has a maximum number of levels of exclusive-OR gates equal to 7.

FIGS. 27*a*, 27*b*, 27*c*, 27*d*, 27*e*, and 27*f* show logic equations for the outputs of a CRC logic module having 128 zero bit inputs, as would be used in an embodiment of the generalized circuit of FIG. 10. The logic circuit of FIGS. 27*a*, 27*b*, 27*c*, 27*d*, 27*e*, and 27*f* requires 1995 2-input exclusive-OR gates, has a maximum number of terms for any one equation of 70, and has a maximum number of levels of exclusive-OR gates equal to 7.

Figure 28A:
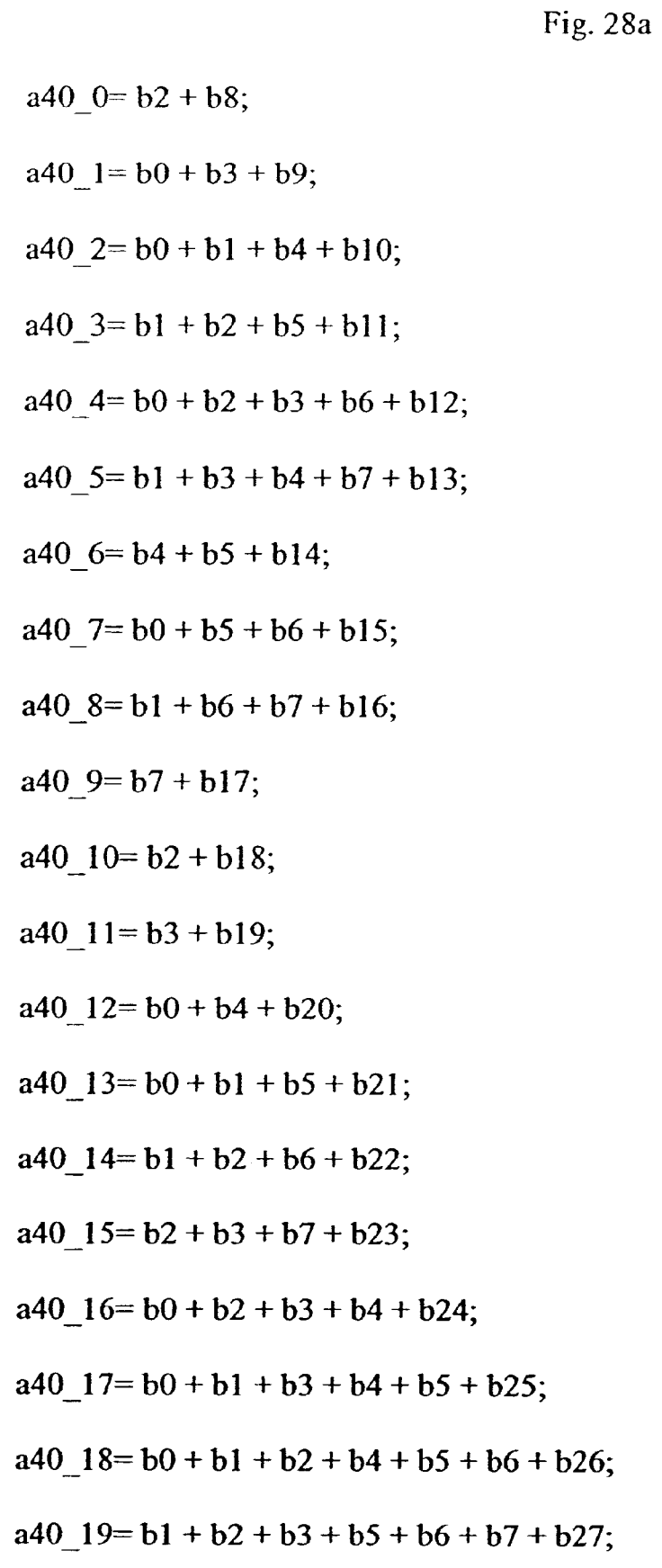
Figure 28B:
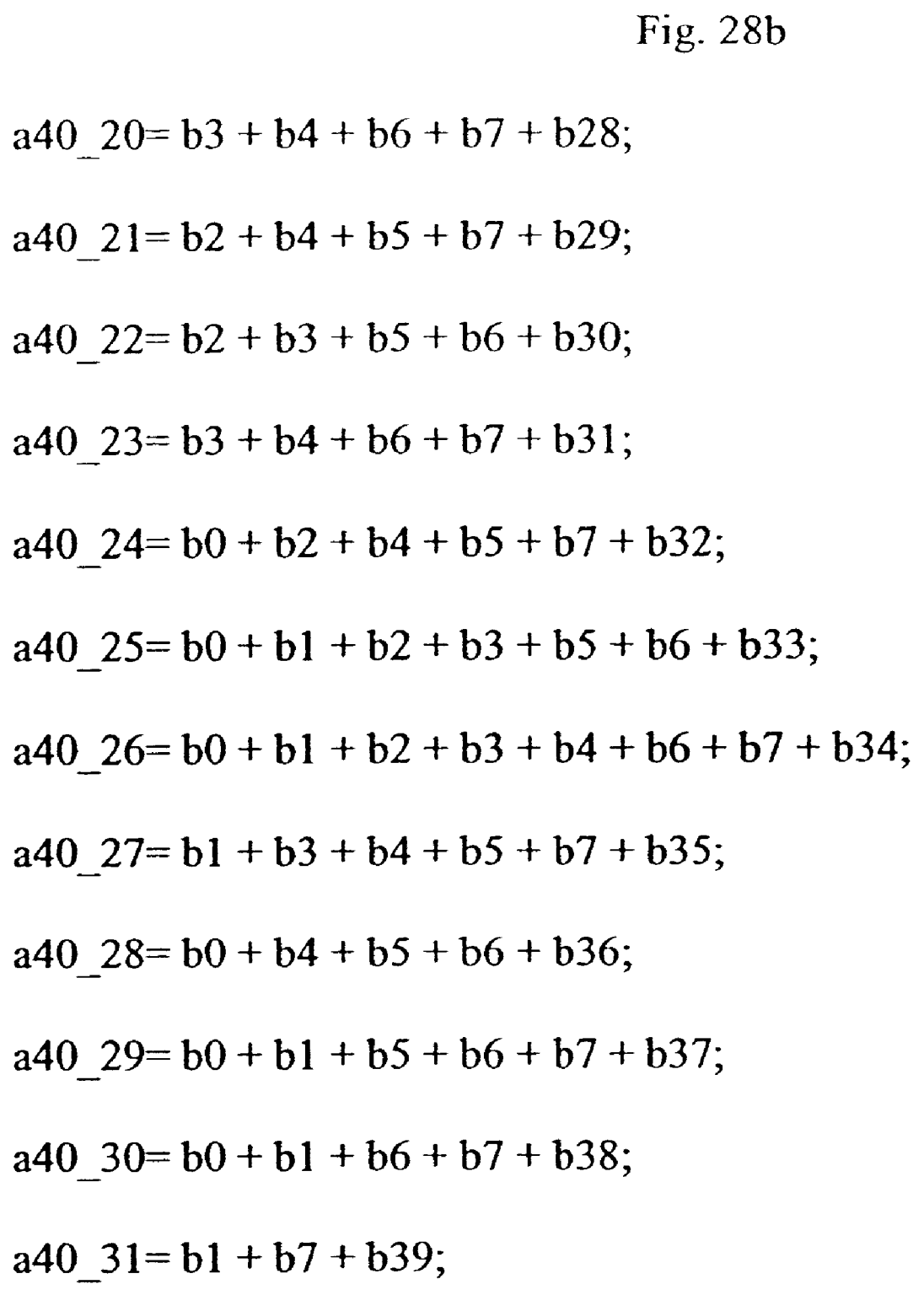

FIGS. 28*a* and 28*b* show logic equations for outputs of CRC logic module 100A40, having 40 zero bit inputs, as shown in FIGS. 9 and 11. The logic module 100A40 requires 114 2-input exclusive-OR gates, has a maximum number of terms for any one equation of 8, and has a maximum number of levels of exclusive-OR gates equal to 3.

FIGS. 29*a*, 29*b*, and 29*c* show logic equations for outputs of CRC logic module 100B40, having 40 zero bit inputs, as shown in FIGS. 9 and 11. The logic module of FIGS. 29*a*, 29*b*, and 29*c* requires 443 2-input exclusive-OR gates, has a maximum number of terms for any one equation of 19, and has a maximum number of levels of exclusive-OR gates equal to 5.

Figure 30A:
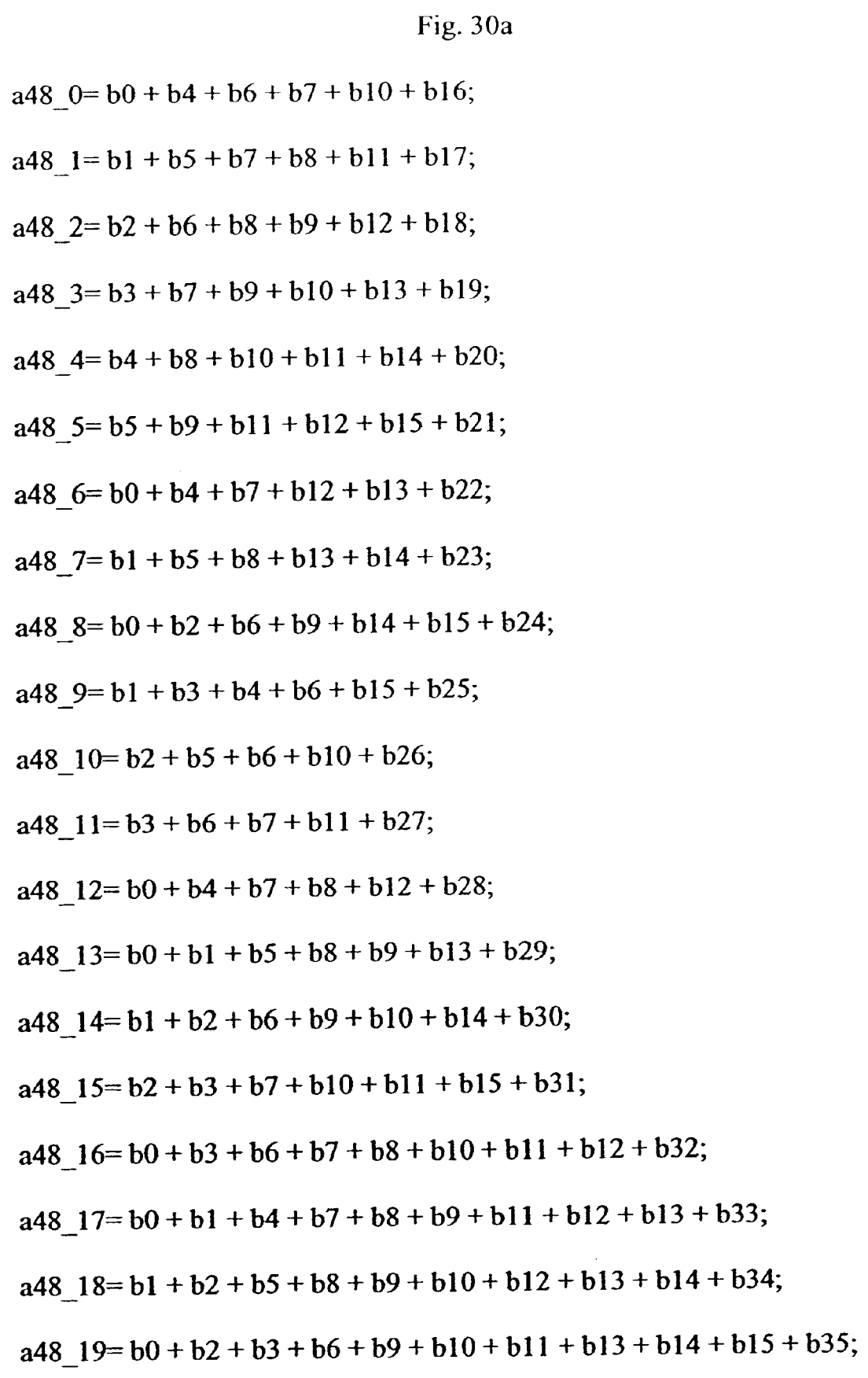
Figure 30B:
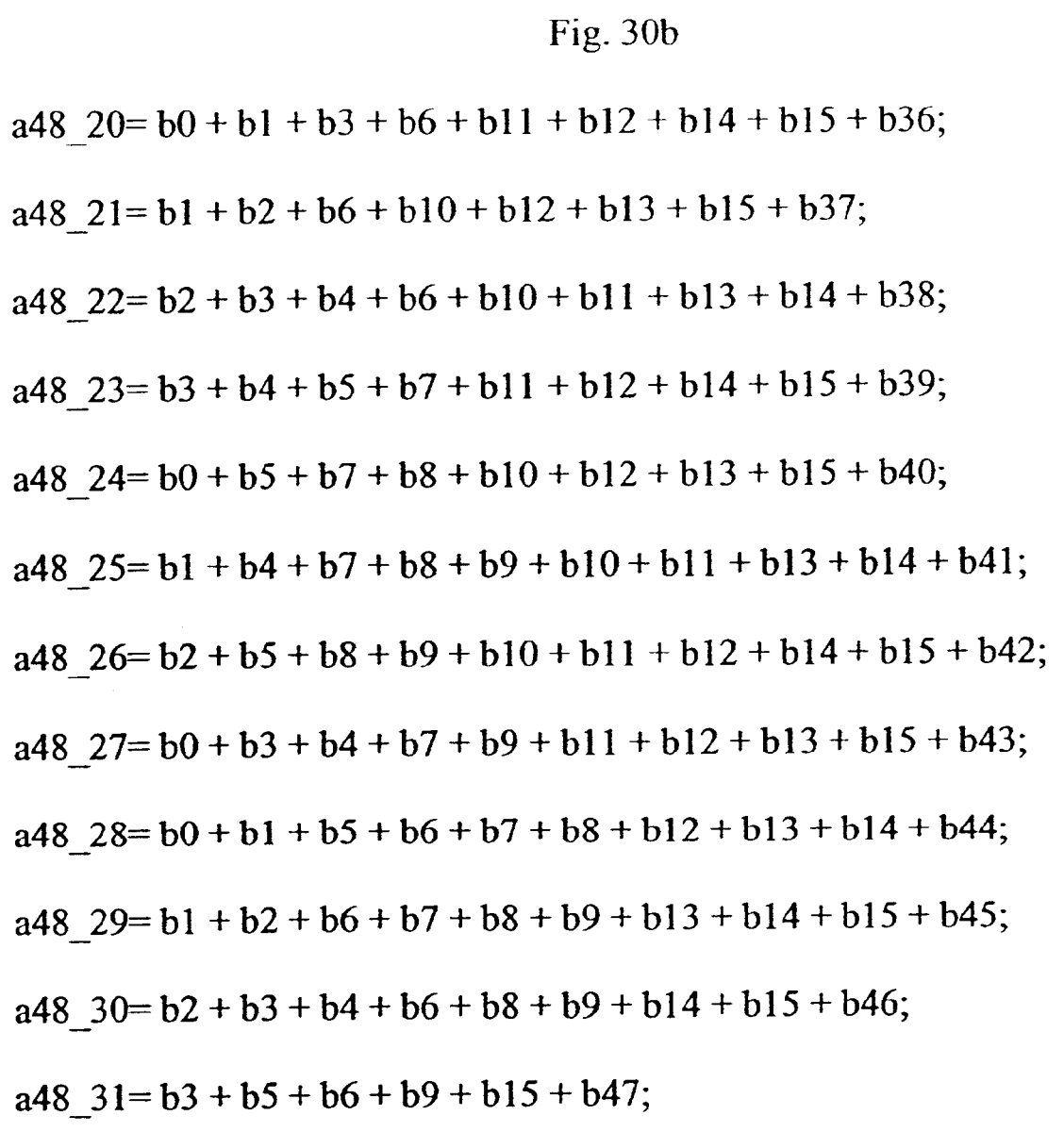

FIGS. 30*a* and 30*b* show logic equations for outputs of CRC logic module 100A48 as shown in FIG. 9, having 48 zero bit inputs. The logic module of FIGS. 30*a* and 30*b* requires 215 2-input exclusive-OR gates, has a maximum number of terms for any one equation of 11, and has a maximum number of levels of exclusive-OR gates equal to 4.

FIGS. 31*a*, 31*b*, and 31*c* show logic equations for outputs of CRC logic module 100B48, as shown in FIG. 9, having 48 zero bit inputs. The logic module of FIGS. 31*a*, 31*b*, and 31*c* requires 454 2-input exclusive-OR gates, has a maximum number of terms for any one equation of 20, and has a maximum number of levels of exclusive-OR gates equal to 5.

FIGS. 32*a* and 32*b* show logic equations for outputs of CRC logic module 100A56, as shown in FIG. 9, having 56 zero bit inputs. The logic module of FIGS. 32*a* and 32*b* requires 319 2-input exclusive-OR gates, has a maximum number of terms for any one equation of 14, and has a maximum number of levels of exclusive-OR gates equal to 4.

FIGS. 33*a*, 33*b*, and 33*c* show logic equations for outputs of CRC logic module 100B56, as shown in FIG. 9, having 56 zero bit inputs. The logic module of FIGS. 33*a*, 33*b*, and 33*c* requires 488 2-input exclusive-OR gates, has a maximum number of terms for any one equation of 20, and has a maximum number of levels of exclusive-OR gates equal to 5.

FIGS. 34*a*, 34*b*, and 34*c* show logic equations for the outputs of CRC logic module 100A64, as shown in FIG. 9, having 64 zero bit inputs. The logic module of FIGS. 34*a*, 34*b*, and 34*c* requires 452 2-input exclusive-OR gates, has a maximum number of terms for any one equation of 18, and has a maximum number of levels of exclusive-OR gates equal to 5.

FIGS. 35*a*, 35*b*, and 35*c* show logic equations for the outputs of CRC logic module 100B64, as shown in FIG. 9, having 64 zero bit inputs. The logic module of FIGS. 35*a*, 35*b*, and 35*c* requires 485 2-input exclusive-OR gates, has a maximum number of terms for any one equation of 20, and has a maximum number of levels of exclusive-OR gates equal to 5.

FIGS. 36 and 36*b* show an executable model of a 64-bit pipelined CRC value generator-checker circuit.

Those skilled in the art should readily appreciate that the functions of the present invention can be implemented in many forms, including using hardware components such as Application Specific Integrated Circuits or other hardware, or some combination of hardware components and software. Where a portion of the functionality is provided using software, that software may be provided to the computer in many ways; including, but not limited to: (a) information permanently stored on non-writable storage media (e.g. read only memory devices within a computer such as ROM or CD-ROM disks readable by a computer I/O attachment); (b) information alterably stored on writable storage media (e.g. floppy disks and hard drives); or (c) information conveyed to a computer through communication media such as computer or telephone networks via a modem.

While the invention is described through the above exemplary embodiments, it will be understood by those of ordinary skill in the art that modification to and variation of the illustrated embodiments may be made without departing from the inventive concepts herein disclosed. Accordingly, the invention should not be viewed as limited except by the scope and spirit of the appended claims.

What is claimed is:

1. A system for calculating a CRC value for a unit of data, comprising:

a first logic block, operative while calculating said CRC value for said unit of data to produce a first output comprising a first modulo 2 remainder of a division of a subset of said unit of data by a generating polynomial;

a second logic block, operative while calculating said CRC value for said unit of data to shift an output of a remainder register by the number of bits in said subset of said unit of data to form a shifted output, and to produce a second output comprising a second modulo 2 remainder of a division of said shifted output by said generating polynomial; and at least one exclusive-OR logic gate, for performing a bit-wise exclusive-OR logic operation on said first output and said second output while calculating said CRC value for said unit of data to produce a third output, said third output coupled to an input of said remainder register.

2. The system of claim 1, further comprising a first pipeline register, operative to receive said first output, wherein said at least one exclusive-OR gate performs said bit-wise exclusive-OR logic operation on said second output and an output of said first pipeline register.

3. The system of claim 1, further comprising a second pipeline register, having said subset of said unit of data as an input, and further having an output coupled to a first input of a multiplexer, wherein said multiplexer has a second input coupled to said output of said remainder register, and wherein said multiplexer is controllable to select said output of said remainder register in the event that all bits of said data unit have been processed by said first logic block and said second logic block, and otherwise to select said subset of said unit of data.

4. The system of claim 1, further comprising an inverter coupled to said output of said remainder register.

5. The system of claim 1, wherein said number of bits in said subset of said data unit is equal to a number of bits of said unit of data being processed in parallel.

6. The system of claim 1, wherein said shifting of said output of said remainder register is in the direction of more significant bits.

7. The system of claim 1, wherein said remainder register is initialized to a predetermined value I(x), where the output of said second logic block is all ones (is) in the case where I(x) is an input to said second logic block.

8. The system of claim 7, wherein I(x) is equal to the hexadecimal value 9226F562 and wherein said generating polynomial for said CRC value is equal to $x^{32}+x^{26}+x^{23}+x^{22}+x^{16}+x^{12}+x^{11}+x^{10}+x^{8}+x^{7}+x^{5}+x^{4}+x^{2}+x+1$.

9. The system of claim 1, further comprising a termination logic block, an output of said termination logic block coupled to a termination remainder register, wherein said termination logic block determines a final CRC value in the event said unit of data is not evenly divisible by a number of bits being processed in parallel by said system for calculating a CRC.

10. The system of claim 1, further comprising controller logic for selecting a contents of said termination remainder register as said CRC value in the event said unit of data is not evenly divisible by said number of bits being processed in parallel, and for appending a number of zero bits to said unit of data, said number of zero bits being equal to a number of bits in said CRC value.

11. The system of claim 1, wherein said unit of data is a portion of a message to be transmitted over a communication network.

12. The system of claim 1, wherein said unit of data is a portion of a message received over a communications network.

13. The system of claim 1, wherein said unit of data is a block of data stored on a disk drive.

14. The system of claim 1, wherein said subset of said unit of data is equal in size to a value less than or equal to a size of said CRC value, and wherein said first logic block further comprises a direct connection of said portion of said unit of data to said at least one exclusive-OR logic gates, such that said first output is equal to said subset of said unit of data.

15. A method of calculating a CRC value for a unit of data, comprising:

producing, while calculating said CRC value for said unit of data, a first output comprising a first modulo 2 remainder of a division of a subset of said unit of data by a generating polynomial;

shifting, while calculating said CRC value for said unit of data, an output of a remainder register by the number of bits in said subset of said unit of data to form a shifted output, and producing a second output comprising a second modulo 2 remainder of a division of said shifted output by said generating polynomial; and performing, while calculating said CRC value for said unit of data, a bit-wise exclusive-OR logic operation on said first output and said second output to produce a third output, said third output coupled to an input of said remainder register.

16. The method of claim 15, further comprising receiving said first output at a first pipeline register, wherein said bit-wise exclusive-OR gate operation is performed on said second output and an output of said first pipeline register.

17. The method of claim 15, further comprising:

receiving said subset of said unit of data as an input to a second pipeline register;

receiving an output of said second pipeline register at a first input of a multiplexer;

receiving said output of said remainder register at a second input of said multiplexer; and controlling said multiplexer to select said output of said remainder register in the event that all bits of said unit of data have been processed by said first logic block and said second logic block, and otherwise to select said subset of said unit of data.

18. The method of claim 15, further comprising inverting said output of said remainder register.

19. The method of claim 15, wherein the number of bits in said subset of said unit of data is equal to a number of bits of said unit of data being processed in parallel.

20. The method of claim 15, wherein said shifting said output of said remainder register is in the direction of more significant bits.

21. The method of claim 15, further comprising initializing said remainder register to a predetermined value I(x), where the output of said second logic block is all ones (1s) in the case where I(x) is an input to said second logic block.

22. The method of claim 21, wherein I(x) is equal to the hexadecimal value 9226F562 and wherein said generating polynomial for said CRC value is equal to $x^{32}+x^{26}+x^{23}+x^{22}+x^{16}+x^{12}+x^{11}+x^{10}+x^{8}+x^{7}+x^{5}+x^{4}+x^{2}+x+1$.

23. The method of claim 15, further comprising providing a termination remainder value in the event said unit of data is not evenly divisible by a number of bits being processed in parallel by said system for calculating a CRC.

24. The method of claim 23, further comprising selecting said termination remainder register as said CRC value in the event said unit of data is not evenly divisible by said number of bits being processed in parallel; and appending a number of zero bits to said unit of data, said number of zero bits being equal to a number of bits in said CRC value.

25. The method of claim 15, wherein said unit of data is a portion of a message to be transmitted over a communication network.

26. The method of claim 15, wherein said unit of data is a portion of a message received over a communications network.

27. The method of claim 15, wherein said unit of data is a block of data stored on a disk drive.

28. A system for calculating a CRC value for a unit of data, comprising:

first means for producing, while calculating said CRC value for said unit of data, a first output comprising a first modulo 2 remainder of a division of a subset of said unit of data by a generating polynomial;

second means for shifting, while calculating said CRC value for said unit of data, an output of a remainder register by the number of bits in said subset of said unit of data to form a shifted output, and producing a second output comprising a second modulo 2 remainder of a division of said shifted output by said generating polynomial; and third means, for performing, while calculating said CRC value for said unit of data, a bit-wise exclusive-OR logic operation on said first output and said second output to produce a third output, said third output coupled to an input of said remainder register.

29. A system for checking a CRC value for a unit of data, comprising:

a first logic block, operative while checking said CRC value for said unit of data to produce a first output comprising a first modulo 2 remainder of a division of a subset of said unit of data by a generating polynomial;

a second logic block, operative while checking said CRC value for said unit of data to shift an output of a remainder register by the number of bits in said subset of said unit of data to form a shifted output, and to produce a second output comprising a second modulo 2 remainder of a division of said shifted output by said generating polynomial;

at least one exclusive-OR logic gate, for performing a bit-wise exclusive-OR logic operation on said first output and said second output while checking said CRC value for said unit of data to produce a third output, said third output coupled to an input of said remainder register; and a comparator for comparing said output of said remainder register to a predetermined value, and for reporting an error if there is not a match.

30. The system of claim 29, wherein said predetermined value is zero.

31. The system of claim 29, wherein said predetermined value is equal to the result of dividing a product result by a predetermined generator polynomial, wherein said product result is the product of the inverted first n bits of said data unit multiplied by n bits having the value 1.

32. A method of checking a CRC value for a unit of data, comprising:

producing, while checking said CRC value for said unit of data, a first output comprising a first modulo 2 remainder of a division of a subset of said unit of data by a generating polynomial;

shifting, while checking said CRC value for said unit of data, an output of a remainder register by the number of bits in said subset of said unit of data to form a shifted output, and producing a second output comprising a second modulo 2 remainder of a division of said shifted output by said generating polynomial;

performing, while checking said CRC value for said unit of data, a bit-wise exclusive-OR logic operation on said first output and said second output to produce a third output, said third output coupled to said remainder register;

comparing, while checking said CRC value for said unit of data, said output of said remainder register to a predetermined value; and reporting an error if there is not a match between said output of said remainder register and said predetermined value.

33. The method of claim 32, wherein said predetermined value is zero.

34. The method of claim 32, further comprising:

inverting a first n bits of said data unit;

multiplying said inverted first n bits of said data unit by a constant equal to n bits all set to the value 1 to obtain a product result; and dividing said product result by a predetermined generator polynomial to obtain said predetermined value.

35. A CRC generator for generating an n-bit cyclic redundancy code from an input, comprising:

a first logic block for computing an intermediate remainder by obtaining a first modulo 2 remainder of the result of dividing a subset of said input by a generating polynomial; and a second logic block for computing a final remainder by shifting an output of a remainder register by the number of bits in said subset of said unit of data to form a shifted output, and obtaining a second modulo 2 remainder of the result of dividing said shifted output by said generating polynomial.

36. The CRC generator of claim 35, further comprising:

a plurality of CRC generators, each of said CRC generators arranged to compute a respective one of a plurality of possible remainders, each of said plurality of possible remainders computed on a different segment of said input; and a third logic block for selecting one of said plurality of possible remainders.

37. The CRC generator of claim 36, wherein said third logic block selects from a plurality of intermediate remainders.

38. The CRC generator of claim 36, wherein said third logic block selects from a plurality of final remainders.

39. The CRC generator of claim 35, wherein said first logic block comprises an array of exclusive-OR gates responsive to various bits of said input.

40. The CRC generator of claim 39 wherein said second logic block comprises an array of exclusive-OR gates operable on various bits of said intermediate remainder.

41. The CRC generator of claim 35, further comprising a fourth logic block for checking a message including said final remainder, wherein said fourth logic block is operable to divide said message by said generator polynomial to generate result, and wherein said fourth logic block is further operable to generate an indication that an error has occurred in the event that said result does not equal a predetermined constant value.

42. The CRC generator of claim 41, wherein said predetermined constant value is zero.

43. A method for generating an n-bit cyclic redundancy code from an input, comprising:

computing an intermediate remainder by obtaining a first modulo 2 remainder of the result of dividing a subset of said input by a generating polynomial; and computing a final remainder by dividing, by shifting an output of a remainder register by the number of bits in said subset of said unit of data to form a shifted output, and obtaining a second modulo 2 remainder of the result of dividing said shifted output by said generating polynomial.

44. The method of claim 43, further comprising:

computing, by a plurality of CRC generators, a plurality of possible remainders, each of said CRC generators arranged to compute a respective one of said plurality of possible remainders, each of said plurality of possible remainders computed on a different segment of said input; and selecting one of said plurality of possible remainders.

45. The method of claim 44, wherein said selecting said one of said plurality of possible remainders comprises selecting from a plurality of intermediate remainders.

46. The method of claim 44, wherein said selecting said one of said plurality of possible remainders comprises selecting from a plurality of final remainders.

47. The method of claim 43, further comprising checking a message including said final remainder, wherein said checking includes dividing said message by said generator polynomial to generate result, and generating an indication that an error has occurred in the event that said result does not equal a predetermined constant value.

48. The method of claim 47, wherein said predetermined constant value is zero.

* * * * *

UNITED STATES PATENT AND TRADEMARK OFFICE

CERTIFICATE OF CORRECTION

PATENT NO. : 6,530,057 B1
DATED : March 4, 2003
INVENTOR(S) : Myles Kimmitt

It is certified that error appears in the above-identified patent and that said Letters Patent is hereby corrected as shown below:

Column 1,
Line 43, "k=l." should read -- k-1 --;

Column 3,
Line 34, "(is)" should read -- (1s) --;

Column 6,
Line 9, "$f^*(x) = f(x) + x^{n-}L(x)$" should read -- $f^*(x) = f(x) + x^{k-n}L(x)$ --;
Line 42, "(all is)" should read -- (all 1s) --;

Column 8,
Line 59, "I" should read -- 1 --;

Column 10,
Line 47, "$a_i(x) = b_{ji}x^{j-i} + b_{ji+1}x^{j-2} + \ldots + b_{j(i+1)-2}x + b_{k-1}$" should read as follows:
-- $a_i(x) = b_{ji}x^{j-i} + b_{ji+1}x^{j-2} + \ldots + b_{j(i+1)-2}x + b_{j(i+1)-1}$ --;

Column 12,
Line 26, "$r^1(x)$" should read -- $r_1(x)$ --;
Line 33, "$r_1(x)=$" should read -- $r_1(x)=$ --;
Line 48, "(all is)" should read -- (all 1s) --;

Column 13,
Line 2, "$x^{10}+x^6+x^3+x+l$" should read -- $x^{10}+x^6+x^3+l$ --;
Line 40, "$a_0(x) = b_)x^{j-1} + b_1x^{j-2} + \ldots + b_{j-2}x + b_{j-1}$" should read
-- $a_0(x) = b_0x^{j-1} + b_1x^{j-2} + \ldots + b_{j-2}x + b_{j-1}$ --;
Line 58, "h as" should read -- has --;

Line 60, "$B\lfloor r_i(x) \rfloor$" should read -- $B\lfloor r_{k/j-2}(x) \rfloor$ --;

Line 63 "in" (2nd occurrence) should read -- m --;

UNITED STATES PATENT AND TRADEMARK OFFICE

CERTIFICATE OF CORRECTION

PATENT NO. : 6,530,057 B1
DATED : March 4, 2003
INVENTOR(S) : Myles Kimmitt

It is certified that error appears in the above-identified patent and that said Letters Patent is hereby corrected as shown below:

Column 16,
Lines 21 and 29, "l0d" should read -- 100d --;
Line 48, "l0a" should read -- 100a --;

Column 17,
Line 17, "10g" should read -- 100g --; and

Column 20,
Line 15, "(is)" should read -- (1s) --.

Signed and Sealed this

Third Day of August, 2004

JON W. DUDAS
*Acting Director of the United States Patent and Trademark Office*